(12) United States Patent
Yamamoto et al.

(10) Patent No.: US 7,704,675 B2
(45) Date of Patent: Apr. 27, 2010

(54) PLANOGRAPHIC PRINTING PLATE PRECURSOR AND STACK THEREOF

(75) Inventors: Hisao Yamamoto, Haibara-gun (JP); Akihiro Endo, Haibara-gun (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/934,537

(22) Filed: Nov. 2, 2007

(65) Prior Publication Data

US 2008/0113296 A1    May 15, 2008

(30) Foreign Application Priority Data

Nov. 9, 2006    (JP) .............. 2006-303932
Mar. 28, 2007   (JP) .............. 2007-085765

(51) Int. Cl.
G03C 1/00   (2006.01)
G03F 7/26   (2006.01)

(52) U.S. Cl. .............. 430/271.1; 430/270.1; 430/273.1; 430/281.1

(58) Field of Classification Search .............. 430/270.1, 430/273.1, 280.1, 271.1
See application file for complete search history.

(56) References Cited

U.S. PATENT DOCUMENTS 6,103,042 A * 8/2000 Hatada et al. .............. 156/235
6,294,298 B1 * 9/2001 Denzinger et al. ............ 430/56
7,217,498 B2 * 5/2007 Kawauchi et al. ......... 430/273.1
2004/0180290 A1 * 9/2004 Mori .......................... 430/300
2005/0221223 A1 * 10/2005 Suzuki ..................... 430/270.1

FOREIGN PATENT DOCUMENTS

| EP | 490515 A1 * | 6/1992 |
| EP | 0 528 395 A1 | 2/1993 |
| EP | 0 469 307 A1 | 5/1993 |
| EP | 1 630 609 A1 | 3/2006 |
| EP | 1 790 492 A1 | 5/2007 |
| JP | 6332155 A | 12/1994 |
| JP | 10228109 A | 8/1998 |
| JP | 200562456 A | 3/2005 |

* cited by examiner

*Primary Examiner*—Cynthia H Kelly
*Assistant Examiner*—Connie P Johnson
(74) *Attorney, Agent, or Firm*—Sughrue Mion, PLLC

(57) ABSTRACT

The invention provides a planographic printing plate precursor that is writable by laser exposure and is composed of a support, a photosensitive recording layer formed on the support, and a backcoat layer containing an epoxy resin, the backcoat layer being formed on the side of the support opposite to the photosensitive recording layer side; and a stack of the planographic printing plate precursors. According to the invention, scratches on the photosensitive recording side of the planographic printing plate precursor can be prevented when brought into contact with another planographic printing plate precursor in the stack without interleaving slip sheets, and productivity in a plate making process can be improved.

7 Claims, No Drawings

PLANOGRAPHIC PRINTING PLATE PRECURSOR AND STACK THEREOF

CROSS-REFERENCE TO RELATED APPLICATION

This application claims priority under 35 USC 119 from Japanese Patent Application Nos. 2006-303932 and 2007-85765, the disclosures of which are incorporated by reference herein.

BACKGROUND OF THE INVENTION

1. Field of the Invention

The invention relates to a planographic printing plate precursor capable of direct printing with laser beams and a stack of plural planographic printing plate precursors.

2. Description of the Related Art

PS plates having an oleophilic photosensitive resin layer formed on a hydrophilic support have been widely used as planographic printing plate precursors. The PS plates have been produced commonly by subjecting the photosensitive layer of the plates to mask exposure (surface exposure) through a lith film, and then dissolving and removing the non-image regions thereof.

In recent years, digital technology, by which image information is processed, stored, and outputted electronically by computer, is becoming more and more popular. Accordingly, various newer image-output methods compatible with the digital technology have been commercialized. As a result, there is an urgent need for the "computer to plate (CTP) technology" that allows direct production of printing plates by scanning a high-directivity light such as laser beams according to digitalized image information without using the lith film, and thus for the planographic printing plate precursors that are compatible with the CTP technology.

As the planographic printing plate precursor compatible with such scanning exposure, a planographic printing plate precursor of a hydrophilic support and an oleophilic photosensitive resin layer formed thereon (hereinafter, referred to also as a photosensitive layer), the photosensitive layer containing a photosensitive compound that can generate an active species such as a radical, Bronsted acid or the like by laser exposure, has been proposed and already commercialized. A negative planographic printing plate precursor can be obtained by subjecting the planographic printing plate precursor to laser scanning according to digital information to generate an active species, utilizing this action to cause physical or chemical change to the recording layer to insolubilize the recording layer, and then subjecting the recording layer to development.

In particular, a planographic printing plate precursor composed of a hydrophilic support; and onto which a photopolymerizable photosensitive layer containing a photopolymerization initiator superior in sensitization speed, an addition-polymerizable ethylenic unsaturated compound, and a binder polymer soluble in an alkaline developing solution; and optionally an oxygen-blocking protective layer (see, for example, Japanese Patent Application Laid-Open (JP-A) No. 10-228109) is a desirable printing plate precursor with favorable printing properties, i.e., having a high degree of productivity, easy to handle in a developing process, and having excellent resolution and inking property.

On the other hand, in terms of productivity in producing photopolymerizable planographic printing plate precursors, which requires only a simple and easy developing process, shortening of time necessary for an exposure step has become important. In the exposing step, the printing plate precursors are generally supplied in the form of a stack with slip sheets interleaved between the precursors. The slip sheets serve to prevent the precursors from sticking to each other, or from getting scratches that occur when the relatively soft surface of a photosensitive layer or a protective layer formed on the photosensitive layer is scraped against the surface of an aluminum support or a backcoat layer formed on the backside of the support. Therefore, the time for removing the slip sheets has been one factor of inefficiency. Efficiency in the exposure step can thus be promoted by eliminating the need of removing slip sheets, i.e., providing a stack of precursors without slip sheets therebetween. Consequently, it has been desired to improve adhesion resistance of a precursor against another precursor and prevent scratches caused when the surface of the protective layer is scraped against the aluminum support.

The scratches mentioned here refers to those occur on the top surface side (the side with a photosensitive layer or protective layer). There are serious problems such as smudging of printing materials caused by curing of the photosensitive layer having scratches on a non-image area thereof, and blanking in images caused by scratches formed on an image area.

As the solutions for such problems as above, there have been proposed a method of providing a backcoat layer having a Tg of 20° C. or more (see, for example, JP-A No. 06-332155), a method of using a polyester resin, phenoxy resin or polyvinylacetal resin in a backcoat layer against a positive-type photosensitive layer (see, for example, JP-A No. 2005-62456), and the like. However, further improvements are still desired.

As mentioned above, there still is a demand for a planographic printing plate precursor having improved resistance to scratches formed upon scraping with each other and slipping of the plate precursors, even when stacked without interleaving slip sheets, thereby serving to promote productivity in a plate making process.

SUMMARY OF THE INVENTION

The invention has been made in view of the above problems and provides a planographic printing plate precursor and a stack thereof.

According to a first aspect of the invention, there is provided a planographic printing plate precursor comprising a support, a photosensitive recording layer formed on the support, and a backcoat layer including an epoxy resin, the backcoat layer being formed on the side of the support opposite to the photosensitive recording layer side.

According to a second aspect of the invention, there is provided a stack of a plurality of the planographic printing plate precursors of the first aspect of the invention, wherein the surface of the photosensitive recording layer side of at least one of the planographic printing plate precursors and the surface of the backcoat layer side of at least one of the planographic printing plate precursors are in direct contact with each other.

DETAILED DESCRIPTION OF THE INVENTION

Planographic Printing Plate Precursor

The planographic printing plate precursor of the invention has a photosensitive recording layer on one side of a support, and a backcoat layer containing an epoxy resin on the other side of the support.

The following are details of the essential components of the planographic printing plate precursor of the invention: the support, photosensitive recording layer, and backcoat layer.

[Backcoat Layer]

The backcoat layer of the invention contains an epoxy resin as an essential component. The backcoat layer may further contain other components such as a resin or an additive to improve various properties of the backcoat layer.

—Epoxy Resin—

Examples of the epoxy resins include glycidyl ether compounds obtained by reaction of a polyalcohol or polyphenol and epichlorohydrin, prepolymers thereof, and polymers or copolymers of acrylic or methacrylic glycidyl.

Preferable examples of the aforementioned compounds include propylene glycol diglycidyl ether, tripropylene glycol diglycidyl ether, polypropylene glycol diglycidyl ether, neopentyl glycol diglydidyl ether, trimethylol propane triglycidyl ether, diglycidyl ether of hydrogenated bisphenol A, hydroquinone diglycidyl ether, resorcinol diglydidyl ether, polyaddition products of bisphenol A with diglycidyl ether or epichlorohydrin, polyaddition products of bisphenol F with diglycidyl ether or epichlorohydrin, polyaddition products of halogenated bisphenol A with diglycidyl ether or epichlorohydrin, polyaddition products of biphenyl-type bisphenol with diglycidyl ether or epichlorohydrin, and glycidyl etherified products of novolac resins; and further, copolymers of metyl methacrylate/glycidyl methacrylate and copolymers of ethyl methacrylate/glycigyl methacrylate.

The following are the examples of the commercial products of the above compounds under the trade names of: jER1001 (molecular weight; approximately 900, epoxy equivalent; 450 to 500), jER1002 (molecular weight; approximately 1600, epoxy equivalent; 600 to 700), jER1004 (molecular weight; approximately 1060, epoxy equivalent; 875 to 975), jER1007 (molecular weight; approximately 2900, epoxy equivalent; 2000), jER1009 (molecular weight; approximately 3750, epoxy equivalent; 3000), jER1010 (molecular weight; approximately 5500, epoxy equivalent; 4000), jER1100L (epoxy equivalent; 4000) and jERYX31575 (epoxy equivalent; 1200) (available from JAPAN EPOXY RESINS CO., LTD.); and SUMIEPOXY ESCN-195XHN, ESCN-195X1 and ESCN-195XF (available from SUMITOMO CHEMICAL CO., LTD.).

The weight average molecular weight of the epoxy resin is preferably 1,000 or more, more preferably in the range of from 1,000 to 500,000, further preferably in the range of from 1,000 to 200,000, and still more preferably in the range of from 1,000 to 100,000.

The content of the epoxy resin in the backcoat layer is preferably in the range of from 50 to 100% by mass, more preferably in the range of from 65 to 99% by mass, and further preferably in the range of from 70 to 97.5% by mass, with respect to the total mass of the backcoat layer, from the viewpoints of preventing scratches and slippage between the precursors, when stacked without interleaving slip sheets.

(Other Resins)

The backcoat layer of the invention preferably contains a resin other than the epoxy resin, such as a resin having a phenolic hydroxyl group or a rosin.

The following are details of the resin having a phenolic hydroxyl group and the rosin suitably used in the backcoat layer of the invention. Both of these resins may be contained in the backcoat layer of the invention at the same time.

—Resin Having Phenolic Hydroxyl Group—

Examples of the resins having a phenolic hydroxyl group include novolac resins such as condensation-polymerization products of phenol and formaldehyde, condensation-polymerization products of m-cresol and formaldehyde, condensation-polymerization products of p-cresol and formaldehyde, condensation-polymerization products of m-/p-mixed cresol and formaldehyde, condensation-polymerization products of phenol, cresol (m-, p-, or m-/p-mixed) and formaldehyde; and pyrogallol resins that are condensation-polymerization products of pyrogallol and acetone.

Further, as the resins having a phenolic hydroxyl group, copolymers obtained by copolymerizing compounds having a phenolic hydroxyl group can also be used.

Examples of such compounds include those such as acrylamide, methacrylamide, acrylic ester, methacrylic ester and hydroxystyrene, having a phenolic hydroxyl group.

The weight average molecular weight of the resin having a phenolic hydroxyl group in the invention is preferably 1,000 or more, more preferably in the range of from 1,000 to 500,000, still more preferably in the range of from 1,000 to 200,000, and further preferably in the range of from 1,000 to 100,000.

The content of the resin having a phenolic hydroxyl group in the backcoat layer in the invention is preferably in the range of from 0.1 to 90% by mass, more preferably in the range of from 0.1 to 50% by mass, and further preferably in the range of from 0.5 to 30% by mass, with respect to the total mass of the backcoat layer, from the viewpoints of filming properties and adhesion resistance against the surface of photosensitive recording layer side of a printing plate precursor.

(Rosin)

Examples of the rosins that can be used in the invention include natural rosins such as a gum rosin, tall oil rosin, wood rosin; polymerized rosins that are derivatives of the aforementioned natural rosins; stabilized rosins obtained by disproportionating or hydrogenating the aforementioned natural or polymerized rosins; and unsaturated acid-modified rosins obtained by adding unsaturated carboxylic acids to the aforementioned natural or polymerized rosins.

Examples of the aforementioned unsaturated acid-modified rosins include maleic acid-modified rosins, maleic anhydride-modified rosins, fumaric acid-modified rosins, itaconic acid-modified rosins, crotonic acid-modified rosins, cinnamic acid-modified rosins, acrylic acid-modified rosins, methacrylic acid-modified rosins, and other acid-modified polymerized rosins corresponding to these rosins.

Among these rosins, a rosin-modified phenol resin and a rosin ester are most preferably used.

The rosin esters may be, for example, commercial products under the trade names of SUPER ESTER E-720, SUPER ESTER E-730-55, SUPER ESTER E-650, SUPER ESTER E-786-60, TAMANOL E-100, EMULSION AM-1002 and EMULSION SE-50 (special type of rosin ester emulsions available from ARAKAWA CHEMICAL INDUSTRIES, LTD.); and SUPER ESTER S, SUPER ESTER A-18, SUPER ESTER A-75, SUPER ESTER A-100, SUPER ESTER A-115, SUPER ESTER A-125 and SUPER ESTER T-125 (special type of rosin esters available from ARAKAWA CHEMICAL INDUSTRIES, LTD.).

The commercial products under the following trade names are also preferably used as the rosin ester: ESTER GUM AAG, ESTER GUM AAL, ESTER GUM A, ESTER GUM AAV, ESTER GUM 105, ESTER GUM HS, ESTER GUM AT, ESTER GUM H, ESTER GUM HP, ESTER GUM HD, PENSEL A, PENSEL AD, PENSEL AZ, PENSEL C, PENSEL D-125, PENSEL D-135, PENSEL D-160 and PENSEL KK (special rosin esters from ARAKAWA CHEMICAL INDUSTRIES, LTD.).

The commercial products under the following trade names are also preferably used as the rosin-modified phenol resins: TAMANOL 135, TAMANOL 145, TAMANOL 340, TAMANOL 350, TAMANOL 351, TAMANOL 352, TAMANOL 353, TAMANOL 354, TAMANOL 359, TAMANOL 361, TAMANOL 362, TAMANOL 366, TAMANOL 374, TAMANOL 379, TAMANOL 380, TAMANOL 381, TAMANOL 384, TAMANOL 386, TAMANOL 387, TAMANOL 388, TAMANOL 392, TAMANOL 394, TAMANOL 395, TAMANOL 396, TAMANOL 405, TAMANOL 406, TAMANOL 409, TAMANOL 410, TAMANOL 414 and TAMANOL 415 (rosin-modified phenol resins available from ARAKAWA CHEMICAL INDUSTRIES, LTD.).

Further, examples of other rosins include the following commercial products under the trade names of RONSIS R, RONSIS K-25, RONSIS K-80 and RONSIS K-18 (rosin derivatives available from ARAKAWA CHEMICAL INDUSTRIES, LTD.); and PINECRYSTAL KR-85, PINECRYSTAL KR-612, PINECRYSTAL KR-614, PINECRYSTAL KE-100, PINECRYSTAL KE-311, PINECRYSTAL KE-359, PINECRYSTAL KE-604, PINECRYSTAL 30PX, PINECRYSTAL D-6011, PINECRYSTAL D-6154, PINECRYSTAL D-6240, PINECRYSTAL KM-1500 and PINECRYSTAL KM-1550 (super hypochromic rosin derivatives available from ARAKAWA CHEMICAL INDUSTRIES, LTD.).

The weight average molecular weight (Mw) of the rosin according to the invention is preferably 1,000 or more, more preferably in the range of from 1,000 to 500,000, still more preferably in the range of from 1,000 to 200,000, and further preferably in the range of from 1,000 to 100,000, in terms of polystyrene.

The content of the rosin in the backcoat layer in the invention is preferably in the range of from 0 to 50% by mass, more preferably in the range of from 1 to 35% by mass, and further preferably 2.5 to 30% by mass, with respect to the total mass of the backcoat layer, from the viewpoints of preventing scratches and slippage between the precursors, when stacked without interleaving slip sheets.

(Other Componets)

The backcoat layer of the invention may also contain an organic or inorganic polymer compound to improve a film forming property, or other additives such as a plasticizer and a surfactant for the purpose of imparting flexibility to the backcoat layer or adjusting a sliding property thereof, as necessary.

Preferable examples of the polymer compounds include polybutene, polybutadiene, polyamide, unsaturated copolymerization products of polyester resin, polyurethane, polyurea, polyimide, polysiloxane, polycarbonate, chlorinated polyethylene, polyvinyl chloride, polyvinylydene chloride, polystyrene, acrylic resins and copolymerization products thereof, hydrocy cellulose, polyvinyl alcohol, cellulose acetate, and carboxymethyl cellulose.

The weight average molecular weight of these polymer compounds is preferably 500 or more, more preferably in the range of from 1,000 to 500,000, further preferably in the range of from 1,000 to 200,000, and particularly preferably in the range of from 1,000 to 100,000, in terms of polystyrene.

Preferable examples of the plasticizers for use in the backcoat layer include phthalate esters such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate, and diallyl phthalate; glycol esters such as dimethyl glycol phthalate, ethyl phthalyl ethyl glycolate, methyl phthalyl ethyl glycolate, butyl phthalyl butyl glycolate, and triethylene glycol dicaprylic ester; phosphoric esters such as tricresylic phosphate and triphenyl phosphate; aliphatic dibasic esters such as diisobutyl adipate, dioctyl adipate, dimethyl sebacate, dibutyl sebacate, dioctyl azelate, and dibutyl maleate; polyglycidyl methacrylate; triethyl citrate; glycerin triacetyl ester; and butyl laurate.

These plasticizers may be added to such a degree that the backcoat layer does not have stickiness.

Preferable examples of the surfactants for use in the backcoat layer include nonionic surfactants such as polyoxyethylene alkyl ethers, polyoxyethylene alkyl phenyl ethers, polyloxyethylene polystyryl phenyl ethers, polyoxyethylene polyoxypropylene alkyl ethers, glycerine fatty acid partial esters, sorbitan fatty acid partial esters, pentaerythritol fatty acid partial esters, propyleneglycol monofatty acid esters, sucrose fatty acid partial esters, polyoxyethylene sorbitan fatty acid partial esters, polyoxyethylene sorbitol fatty acid partial esters, polyethyleneglycol fatty acid partial esters, polyglycerine fatty acid partial esters, polyoxyethylenic castor oils, polyocyethylene glycerin fatty acid partial esters, fatty acid diethanol amides, N,N-bis-2-hydroxyalkylamines, polyoxyethylene alkylamines, triethanolamine fatty acid ester, and trialkylamine oxides;

anionic surfactants such as fatty acid salts, abietic acid salts, hydroxy alkane sulfonates, alkane sulfonates, dialkyl sulfosuccinic acid ester salts, linear alkyl benzene sulfonates, branched alkyl benzene sulfonates, alkyl naphthalene sulfonates, alkyl phenoxy polyoxyethylenepropyl sulfonates, polyoxyethylene alkylsulfophenyl ether salts, N-methyl-N-oleyl taurine sodium salts, N-alkyl sulfosuccinic monoamide disodium salts, petroleum sulfonates, sulfated beef tallow oil, sulfuric ester salts of fatty acid alkyl esters, alkyl sulfuric ester salts, polyoxyethylene alkyl ether sulfuric ester salts, fatty acid monoglyceride sulfuric ester salts, polyoxyethylene alkyl phenyl ether sulfuric ester salts, polyoxyethylene styryl phenyl ether sulfuric ester salts, alkyl phosphoric ester salts, polyoxyethylene alkyl ether phosphoric ester salts, polyoxyethylene alkyl phenyl ether phosphoric ester salts, partial saponification products of styrene/maleic anhydride copolymers, partial saponification products of olefin/maleic anhydride copolymer, and naphthalene sulfonate formaldehyde condensates;

cationic surfactants such as alkylamine salts, quaternary ammonium salts, polyoxyethylene alkylamine salts, and derivatives of polyethylene polyamine; and amphoteric surfactants such as carboxy betaines, aminocarboxylic acids, sulfobetaines, amino sulfonates, and imidazolines.

In the aforementioned surfactants, the terminology "polyoxyethylene" may be substituted with other polyoxyalkylenes such as "polyoxymethylene", "polyoxypropylene" and "polyoxybutylene", and the surfactants thereof are also included in the examples of the surfactants for use in the backcoat layer of the invention.

The surfactants are more preferably fluorinated surfactants containing a perfluoroalkyl group in the molecule. Examples of the fluorinated surfactants include anionic sufactants such as perfluoroalkyl carboxylates, perfluoroalkyl sulfonates, and perfluoroalkyl phosphates; amphoteric surfactants such as perfluoroalkyl betaines; cationic surfactants such as perfluoroalkyl trimethyl ammonium salts; and nonionic surfactants such as perfluoroalkylamine oxides, perfluoroalkylethylene oxide adducts, oligomers containing a perfluoroalkyl group and a hydrophilic group, oligomers containing a perfluoroalkyl group and a lipophilic group, oligomers containing a perfluoroalkyl group, a hydrophilic group and a lipophilic group, and urethanes containing a perfluoroalkyl group and a lipophilic group.

The aforementioned surfactants may be used alone or in combination of two or more, and may be added in the backcoat layer in an amount in the range of preferably from 0.001% to 10% by mass, more preferably in the range of from 0.001% to 5% by mass.

For improving chemical resistance, the backcoat layer according to the invention may also contain additives such as o-naphthoquinone diazide compounds, photosensitive azide compounds, photopolymerizable compositions containing an unsaturated double bond-containing monomer as a main component, photocrosslinkable compounds having a cinnamic acid or dimethylmaleimide group, and diazo resins obtained by allowing a diazonium salt monomer or an aromatic diazonium salt to condensate with an organic condensing agent containing a reactive carbonyl group (aldehydes such as formaldehyde and acetic aldehyde, or acetals, in particular), in an acidic medium. Among these, o-naphthoquinone diazide compounds, known as positive-type photosensitive compounds, are most preferably used.

The backcoat layer according to the invention may be provided by such methods as thermocompression and melt lamination of a film, and application. Among these, the backcoat layer is most preferably provided by applying a solution, from the viewpoint of forming a thin film with high efficiency.

Therefore, the resin used for the backcoat layer is preferably an amorphous type that readily dissolves in various kinds of organic solvents for industrial use.

Examples of the solvents used for formation of the backcoat layer include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, proplyene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N,N-dimetyl formamide, dimetyl sulfoxide, γ-butyrolactone, methyl lactate, and ethyl lactate.

These solvents may be used alone or in combination of two or more. The appropriate range of the solid content of the solution for formation of the backcoat layer is from 0.5% to 50% by mass.

The coating amount for the backcoat layer according to the invention, which may affect mainly the coefficient of static friction or occurrence of scratches of the backcoat layer, may be determined as appropriate to usage. When the coating amount is too little, suffiicient effects as to the coefficient of static friction or occurrence of scratches of the backcoat layer may not be obtained. On the other hand, when the coating amount is too much, adhesion strength of the backcoat layer to the support may not be enough, causing peeling of the backcoat layer when handled.

Therefore, the coating amount for the backcoat layer is preferably in the range of from 0.01 g to 10 g/m$^2$, more preferably in the range of from 0.05 g to 7 g/m$^2$, and further preferably in the range of from 0.1 g to 5 g/m$^2$, in terms of the mass after drying.

The slipping property of the planotraphic printing plate precursor of the invention is preferably regulated, when stacked without interleaving slip sheets therebetween.

The degree of slippage between the planographic printing plate precursors may be expressed by a coefficient of static friction of the backcoat layer thereof. Specifically, the backcoat layer of the planographic printing plate precursor according to the invention preferably has a coefficient of static friction against the outermost surface of the photosensitive recording side in the range of from 0.35 to 1.00, more preferably in the range of from 0.40 to 1.00, When the coefficient of static friction is within the above range, the planographic printing plate precursors can be stably stacked without causing slippage between them. Additionally, occurrence of scratches can be further suppressed because of the reduced degree of friction between the plates.

[Photosensitive Recording Layer]

The planographic printing plate precursor according to the invention has a photosensitive recording layer on the side opposite to the backcoat side of the support.

The photosensitive recording layer of the invention may be either positive type or negative type.

The positive type photosensitive recording layer is not particularly limited as long as the recording layer has an exposed area that is developed to leave an unexposed area as a recorded region (image region), and examples thereof include a recording layer using o-quinonediazide and a recording layer utilizing a chemical amplification mechanism.

The negative type photosensitive recording layer is not particularly limited as long as the recording layer has an exposed area that cures to form a recorded region (image region), and examples thereof include a polymerizable photosensitive layer containing a radical-polymerizable compound, and an acid-crosslinkable photosensitive layer containing an acid crosslinkable substance.

The photosensitive recording layer according to the invention is particularly preferably a polymerizable negative type photosensitive layer, since the effects of the backcoat layer of the invention are most significant in a case of the negative type, where occurrence of scratches on the surface of the planographic printing plate precursor, which cures to cause smudges on printed materials, is a serious problem.

[Polymerizable Negative Photosensitive Layer]

The polymerizable negative photosensitive layer (hereinafter, simply referred to as "photosensitive layer", sometimes) preferably contains a sensitizing dye, polymerization initiator, polymerizable compound and binder polymer, and if needed, further contains a colorant or other optional components.

The polymerizable negative photosensitive layer can be exposed with various lasers usable for CTP, since the layer is sensitive to lasers corresponding to a sensitizing dye. For example, when an infrared absorbent is used as a sensitizing dye, the infrared absorbent contained in the polymerizable negative photosensitive layer comes into an electronically-excited state at high sensitivity, in response to irradiation (exposure) with an infrared laser, and electron transfer, energy transfer, heating (photothermal conversion function) and the like, which are related to the electrically-excited state, act on the polymerization initiator existing together in the photosensitive layer to cause chemical change thereof, and thereby generating radicals.

The types of radial generation mechanisms in the above case include:

1. The heat generated by the photothermal conversion mechanism of the infrared absorbent causes thermal decomposition of a later-described polymerization initiator (e.g. sulfonium salts) to generate radicals;
2. The excited electron generated in the infrared absorbent transferrs to the polymerization initiator (e.g., active halogenated compounds) to generate radicals;
3. The electron transfers from the polymerization initiator (e.g., borate compounds) to the excited infrared absorbent to generate radicals; and the like. The generated radicals then initiate polymerization reaction of the polymerizable compound, and thereby curing the exposed area to form an image region.

A planographic printing plate precursor containing an infrared absorbent as a sensitizing dye in a polymerizable negative photosensitive layer is particularly preferably used in a direct printing method in which images are directly written with infrared laser beams having a wavelength of from 750 nm to 1,400 nm, and a higher degree of image-forming property as compared with conventional planographic printing plate precursors can be achieved.

In the preferable embodiments of the polymerizable negative photosensitive layer of the invention, an infrared absorbent, a polymerization initiator (a compound that generates radicals by the action of light or heat), a monomer having two or more phenyl groups substituted by a vinyl group in the molecule, and a polymer having a phenyl group substituted by a vinyl group in a side chain are contained, from the viewpoint of achieving high sensitivity.

Hereinafter, each component of the polymerizable negative photosensitive layer according to the invention will be explained.

(Sensitizing Dye)

The photosensitive layer according to the invention contains a sensitizing dye that absorbs light at a predetermined wavelength corresponding to the exposure wavelength used in the laser exposure, from the viewpoint of sensitivity.

By exposing with light at a wavelength that can be absorbed by the sensitizing dye, radical generation reaction of the polymerization initiator (described later) and the resulting polymerization reaction of the polymerizable compound can be facilitated. Examples of the above sensitizing dyes include known spectral sensitization dyes, and dyes or pigments that interact with a photopolymerization initiator upon absorbing light. These sensitizing dyes are electrically-excited at high sensitivity by laser exposure at a corresponding wavelength, and then the electron transfer, energy transfer and the like, which are associated with the electrically-excited state, act to the polymerization initiator to cause chemical change thereof to generate radicals.

The photosensitive layer according to the invention may be sensitive to various wavelengths ranging from ultraviolet rays to visible rays and infrared rays, depending on the wavelength of light to be absorbed by the sensitizing dye. For example, when an infrared absorbent is used as the sensitizing dye, the photosensitive layer is made to be sensitive to the infrared beams at a wavelength in the range of from 760 nm to 1,200 nm. When a dye having a maximum absorbing wavelength in the range of from 350 nm to 450 nm is used, the photosensitive layer is sensitive to visible rays ranging from blue to violet.

Examples of the preferable spectral sensitizing dyes used as the sensitizing dye in the invention include polynuclear aromatic series (e.g., pyrene, perylene and triphenylene), xanthenes (e.g., fluorescein, eosin, erythrosine, rhodamine B and rose gengal), cyanines (e.g., thiacarbocyanine and oxacarbocyanine), merocyanines (e.g., merocyanine and carbomerocyanine), thiazines (e.g., thionine, methylene blue and toluidine blue), acridines (e.g., acridine orange, chloroflavin and acriflavin), phthalocyanines (e.g., phthalocyanine and metal phthalocyanine), porphyrins (e.g., tetraphenylporphyrin and central metal-substituted porphyrin), chlorophylls (e.g., chlorophyll, chlorophylline, central metal-substituted chlorophill), metal complexes, anthraquinones (e.g., anthraquinone), and squaryliums (e.g., squarylium). Details of these sensitizing dyes are described, for example, in Japanese Patent Application Laid-Open (JP-A) No. 2005-250438, [0188] to [0258], and the compounds described therein may be appropriately selected for the sensitizing dye according to the invention.

The photosensitive layer in the invention preferably contains an infrared absorbent described below as the sensitizing dye.

The infrared absorbent is effective in inducing chemical change by the polymerization initiator at high sensitivity, since the infrared absorbent is brought into an electronically excited state at high sensitivity by irradiation (exposure) with an infrared laser to generate heat energy due to the photothermal converting function thereof, in addition to the aforementioned electron transfer and energy transfer associated with the electron excited state.

The infrared absorbent for use in the invention is preferably a dye or a pigment having the absorption maximum at a wavelength of from 750 nm to 1,400 nm.

The aforementioned dyes may be commercially available products or other known dyes disclosed in, for example, "Dye Handbook", edited by The Society of Synthetic Organic Chemistry, published in 1970. Specific examples thereof include azo dyes, metal complex salt azo dyes, pyrazolone azo dyes, naphthoquinone dyes, anthraquinone dyes, phthalocyanine dyes, carbonium dyes, quinonimine dyes, methine dyes, cyanine dyes, squarylium dyes, pyrylium salts, and metal thiolate complexes.

Preferable examples of the dyes include cyanine dyes disclosed in JP-A Nos. 58-125246, 59-84356, 60-78787 and the like; methine dyes disclosed in JP-A Nos. 58-173696, 58-181690, 58-194595 and the like; naphthoquinone dyes disclosed in Nos. 58-112793, 58-224793, 59-48187, 59-73996, 60-52940, 60-63744 and the like; squarylium dyes disclosed in JP-A Nos. 58-112792; and cyanine dyes disclosed in U.K. Patent No. 434,875 and the like.

Near infrared ray absorption sensitizers disclosed in U.S. Pat. No. 5,156,938 may also be suitably used, and substituted arylbenzo(thio)pyrylium salts disclosed in U.S. Pat. No. 3,881,924, trimethine thiapyrylium salts disclosed in JP-A No. 57-142645 (U.S. Pat. No. 4,327,169), pyrylium compounds disclosed in JP-A Nos. 58-181051, 58-220143, 59-41363, 59-84248, 59-84249, 59-146063 and 59-146061, cyanine dyes disclosed in JP-A No. 59-216146, pentamethine thiopyrylium salts disclosed in U.S. Pat. No. 4,283,475, and pyrylium salts disclosed in JP-B Nos. 5-13514 and 5-19702 are preferably used as the dye. Other preferable examples of the dye include near infrared ray absorption dyes represented by Formulae (I) and (II) described in U.S. Pat. No. 4,756,993.

Further, the specific indolenine cyanine dyes disclosed in JP-A No. 2002-278057, illustrated below, are also preferable examples of the infrared ray absorption dye according to the invention.

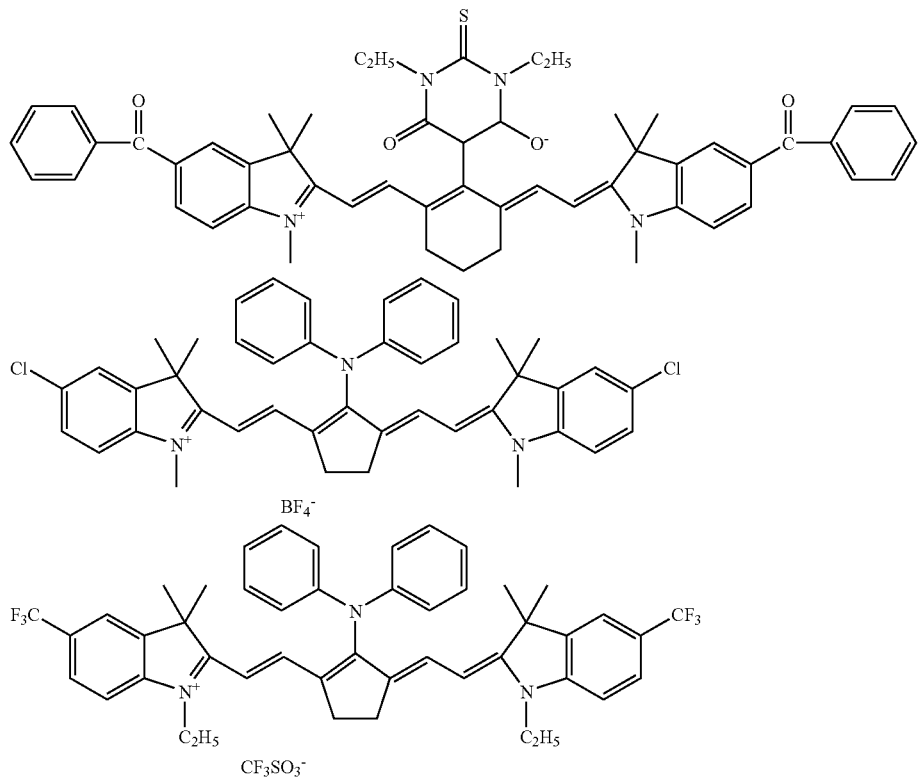

Among the aforementioned dyes, cyanine dyes, squarylium dyes, pyrylium salts, nickel thiolate complexes and indolenine cyanine dyes are preferable, and among which the cyanine dyes and indolenine cyanine dyes are most preferable. The following cyanine dyes represented by the following Formula (a) is a particularly preferable example of the dye according to the invention.

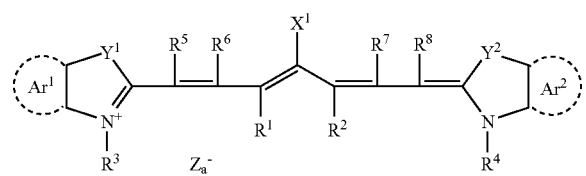

Formula (a)

In Formula (a), $X^1$ represents a hydrogen atom, a halogen atom, —$NPh_2$, $X^2$-$L^1$, or a group represented by Formula (b) shown below. $X^2$ represents an oxygen atom, a nitrogen atom or a sulfur atom, and $L^1$ represents a hydrocarbon group of 1 to 12 carbon atoms, an aromatic ring having at least one hetero atom, or a hydrocarbon group of 1 to 12 carbon atoms containing at least one hetero atom. The hetero atom here represents N, S, O, a halogen atom or Se. In Formula (b), $X_a^-$ is defined in the same manner as $Z_a^-$ described hereinafter, and $R^a$ represents a hydrogen atom or a substituent selected from an alkyl group, an aryl group, a substituted or unsubstituted amino group, and a halogen atom.

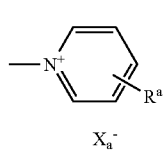

Formula (b)

In Formula (a), $R^1$ and $R^2$ each independently represent a hydrocarbon group of 1 to 12 carbon atoms. $R^1$ and $R^2$ are preferably hydrocarbon groups having two or more carbon atoms, from the viewpoint of storage stability of a photosensitive layer forming liquid. $R^1$ and $R^2$ are particularly preferably bonded to each other to form a five- or six-membered ring.

In Formula (a), $Ar^1$ and $Ar^2$ each independently represent an aromatic hydrocarbon group which may have a substituent. Preferable examples of the aromatic hydrocarbon groups include a benzene ring and a naphthalene ring. Preferable examples of the substituents include a hydrocarbon group of 12 or less carbon atoms, a halogen atom and an alkoxy group of 12 or less carbon atoms. $Y^1$ and $Y^2$ each independently represent a sulfur atom or a dialkylmethylene group of 12 or less carbon atoms. $R^3$ and $R^4$ each independently represent a hydrocarbon group of 20 or less carbon atoms that may have a substituent. Preferable examples of the substituents include an alkoxy group of 12 or less carbon atoms, a carboxyl group and a sulfo group. $R^5$, $R^6$, $R^7$ and $R^8$ each independently represent a hydrogen atom or a hydrocarbon group of 12 or less carbon atoms. In terms of availability of the raw materials, $R^5$, $R^6$, $R^7$ and $R^8$ are preferably hydrogen atoms. $Z_a^-$ represents a counter anion. However, this counter anion is not necessary when the cyanine pigment represented by Formula (a) has an anionic substituent in its structure, and there is no need of neutralizing the charge. $Z_a^-$ is preferably a halogen ion, a perchlorate ion, a tetrafluoro borate ion, a hexafluorophosphate ion or a sulfonate ion, from the viewpoint of storage stability of the photosensitive layer forming solution. $Z_a^-$ is particularly preferably a perchlorate ion, a hexafluorophosphate ion or an arylsulfonate ion.

Specific examples of the cyanine dyes represented by Formula (a) that can be preferably used in the invention include those described in paragraphs [0017] to [0019] in JP-A No. 2001-133969.

Further, other particularly preferable examples include specific indolenine cyanine dyes described in the aforementioned JP-A No. 2002-278057.

The dyes, however, are particularly preferable when no halogen ion is contained as a counter ion.

The pigment used in the invention may be commercially available products or those described in, for example, "Color Index (C.I.) Handbook", "Latest Pigment Handbook" (edited by Japan Pigment Technique Association, published in 1977), "Latest Pigment Applied Technique" (CMC Publishing Co., Ltd., published in 1986), and "Printing Ink Technique" (CMC Publishing Co., Ltd., published in 1984).

Examples of the pigments include black pigments, yellow pigments, orange pigments, brown pigments, red pigments, purple pigments, blue pigments, green pigments, fluorescent pigments, metal powder pigments, and polymer-bound dyes. Specifically, insoluble azo pigments, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, dye lake pigments, azine pigments, nitroso pigments, nitro pigments, natural pigments, fluorescent pigments, inorganic pigments, carbon black and the like can be used. Among these, carbon black is preferable.

These pigments may or may not be surface-treated. Examples of the surface treatments include a method of coating the surface of the pigment with a resin or wax; a method of adhering a surfactant onto the surface of the pigment; and a method of bonding a reactive material (such as a silane coupling agent, epoxy compound, or polyisocyanate) to the surface of the pigment. These surface treatment methods are described, for example, in "Nature and Application of Metal Soap" (Saiwai Shobo), "Printing Ink Technique" (CMC Publishing Co., Ltd., published in 1984), and "Latest Pigment Applied Technique" (CMC Publishing Co., Ltd., published in 1986).

The diameter of the pigment particle is preferably in the range of from 0.01 μm to 10 μm, more preferably in the range of from 0.05 μm to 1 μm, and still more preferably in the range of from 0.1 ηm to 1 μm. When the diameter is within the above preferable ranges, pigment particles can be stably dispersed in the photosensitive layer, and thereby a uniform photosensitive layer can be obtained.

The pigment may be dispersed by known dispersing methods used for production of an ink and a toner. Examples of dispersing machines include an ultrasonic disperser, a sand mill, an attritor, a pearl mill, a super mill, a ball mill, an impeller, a disperser, a KD mill, a colloid mill, a dynatron, a three-roll mill, and a pressing kneader. Details of these machines are described, for example, in "Latest Pigment Applied Technique" (CMC Publishing Co., Ltd., published in 1986).

The aforementioned infrared absorbents, when used in the photosensitive layer, may be added to the same layer together with other components, or added separately to a different layer.

From the viewpoints of uniform dispersion in the photosensitive layer and durability of the photosensitive layer, the content of the sensitizing dye, preferably an infrared ray absorbent, in the photosensitive layer is preferably from 0.01% to 50% by mass, more preferably from 0.1% to 10% by mass, with respect to the total solid content of the photosensitive layer. When a dye is used as a sensitizing dye, the content thereof is particularly preferably from 0.5% to 10% by mass, and when a pigment is used, the content thereof is particularly preferably from 0.1% to 10% by mass, with respect to the total solid content of the photosensitive layer.

(Polymerization Initiator)

The polymerization initiator used in the invention may be any compound as long as that has a function of initiating and advancing curing reaction of a polymerizable compound described hereinafter and generate radicals when energy such as heat or light is applied. Examples thereof include a thermal decomposable radical generator that decomposes by heat and generate radicals; an electron transfer-type radical generator that receives excited electrons from the infrared ray absorbent and generate radicals; and an electron transfer-type radical generator that generates radicals by transferring electrons to the excited infrared ray absorbent. Specific examples thereof include onium salts, active halogenated compounds, oxime ester compounds, and borate compounds. These initiators may be used alone or in combination of two or more. In the invention, the polymerization initiator is preferably an onium salt, and more preferably a sulfonium salt.

The sulfonium salt polymerization initiator preferably used in the invention can be an onium salt represented by the following Formula (I).

Formula (I)

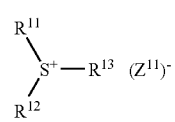

In Formula (I), $R^{11}$, $R^{12}$ and $R^{13}$ each independently represent a hydrocarbon group of 20 or less carbon atoms that may have a substituent. Examples of the substituents include a halogen atom, a nitro group, an alkyl group of 12 or less carbon atoms, an alkoxy group of 12 or less carbon atoms, and an aryloxy group of 12 or less carbon atoms. $(Z^{11})^-$ represents an inorganic or organic counter ion selected from the group consisting of a halogen ion, a perchlorate ion, a tetrafluoroborate ion, a hexafluorophosphate ion, a carboxylate ion, a sulfonate ion, and a structure containing the aforementioned counter ion. $(Z^{11})^-$ is preferably a perchlorate ion, a hexafluorophosphate ion, a carboxylate ion, an arylsulfonate ion, or a structure containing the aforementioned counter ion.

The following are specific examples of the onium salts represented by Formula (I) ([OS-1] to [OS-13]), but the invention is not limited thereto.

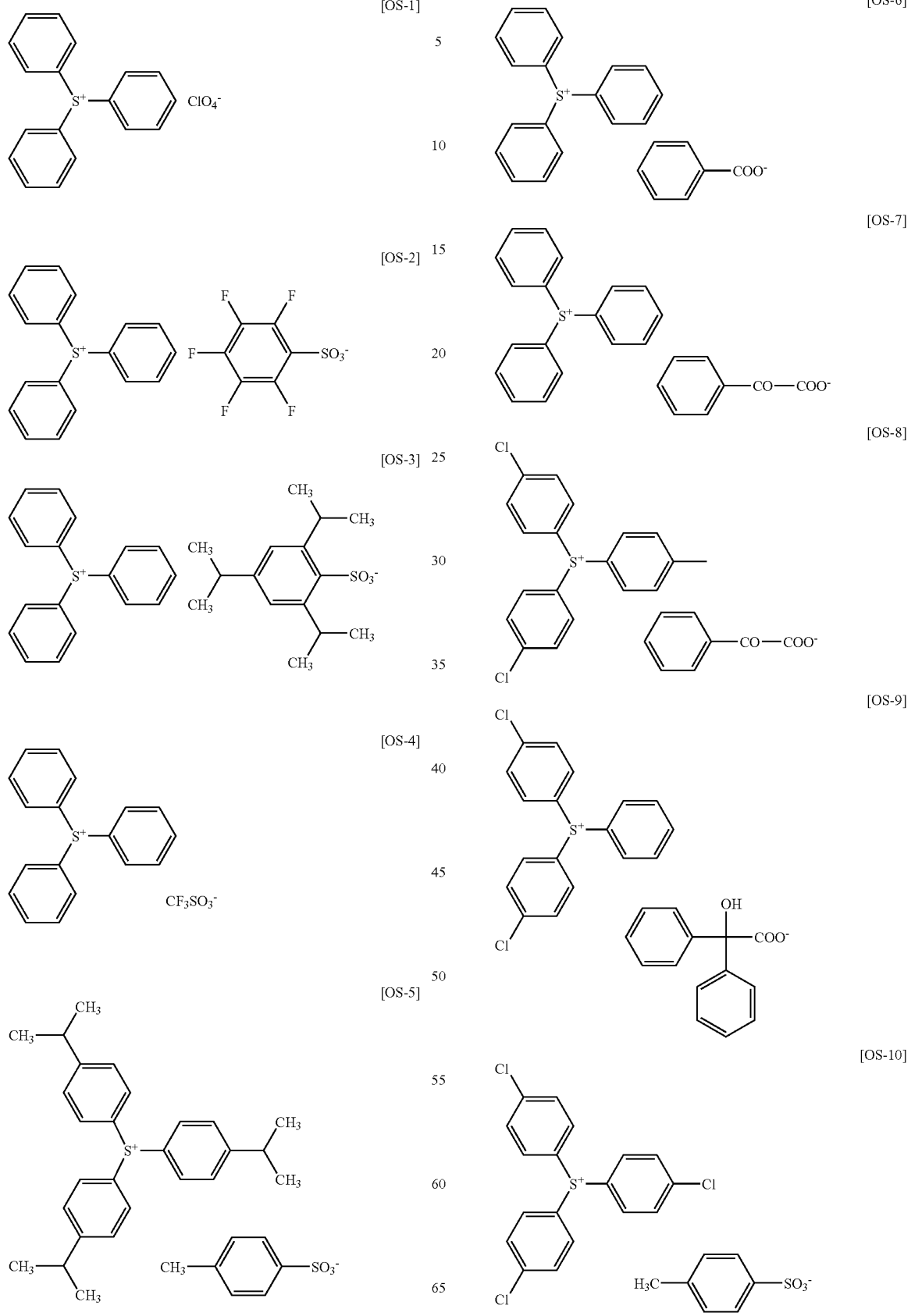

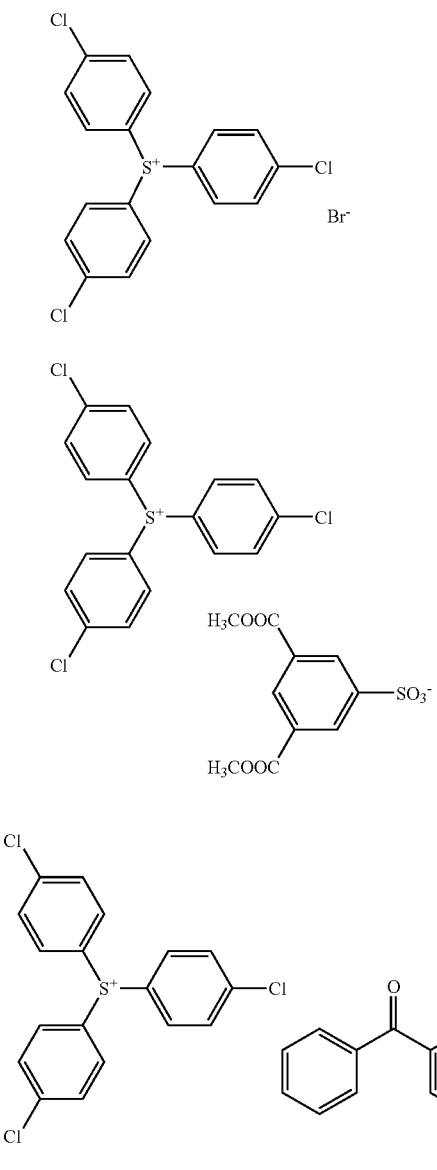

[OS-11]

[OS-12]

[OS-13]

In addition to the above compounds, specific aromatic sulfonium salts described in JP-A Nos. 2002-148790, 2002-350207 and 2002-6482 are also preferably used as the polymerization initiator.

In the invention, polymerization initiators (radical generators) other than the aforementioned sulfonium salt polymerization initiators may also be used. Examples of such radical generators include onium salts other than sulfonium salts, triazine compounds having a trihalomethyl group, peroxides, azo polymerization initiators, azide compounds, quinone diazide, activate halogenated compounds, oxime ester compounds, and triaryl monoalkyl borate compounds. Among these, onium salts are preferably used in view of their high degree of sensitivity. These polymerization initiators (radical generators) may also be used together with the aforementioned sulfonium salt polymerization initiator as an essential component.

Examples of the above onium salts which can be preferably used in the invention include iodonium salts and diazonium salts. In the invention, these onium salts function as a radical polymerization initiator, but not as an acid generating agent.

The other onium salts represented by the following Formulae (II) and (III) may also be used.

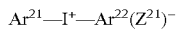   Formula (II)

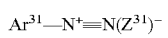   Formula (III)

In Formula (II), $Ar^{21}$ and $Ar^{22}$ each independently represent an aryl group of 20 or less carbon atoms which may have a substituent. When the aryl group has a substituent, preferable examples thereof include a halogen atom, a nitro group, an alkyl group of 12 or less carbon atoms, an alkoxy groups of 12 or less carbon atoms, and an aryloxy group of 12 or less carbon atoms. $(Z^{21})^-$ is a counter ion defined in the same manner as $(Z^{11})^-$ in Formula (I).

In Formula (III), $Ar^{31}$ represents an aryl group of 20 or less carbon atoms which may have a substituent. Preferable examples of the substituents include a halogen atom, a nitro group, an alkyl group of 12 or less carbon atoms, an alkoxy group of 12 or less carbon atoms, an aryloxy group of 12 or less carbon atoms, an alkylamino group of 12 or less carbon atoms, a dialkylamino group of 12 or less carbon atoms, an arylamino group of 12 or less carbon atoms, and a diarylamino group of 12 or less carbon atoms. $(Z^{31})^-$ is a counter ion defined in the same manner as $(Z^{11})^-$ in Formula (I).

The following are specific examples of the onium salts represented by Formula (II) ([OI-1] to [OI-11]) and the onium salts represented by Formula (3) ([ON-1] to [ON-5]), but the invention is not limited thereto.

[OI-1]

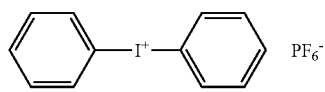

[OI-2]

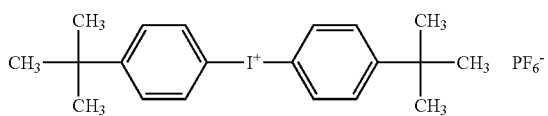

[OI-3]

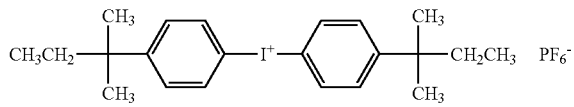

[OI-4]

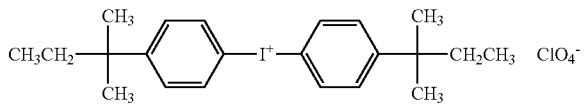

-continued
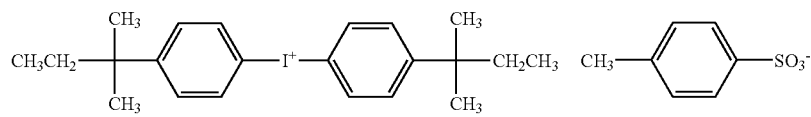 [0I-5]
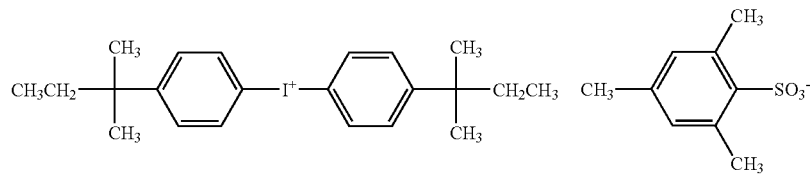 [0I-6]
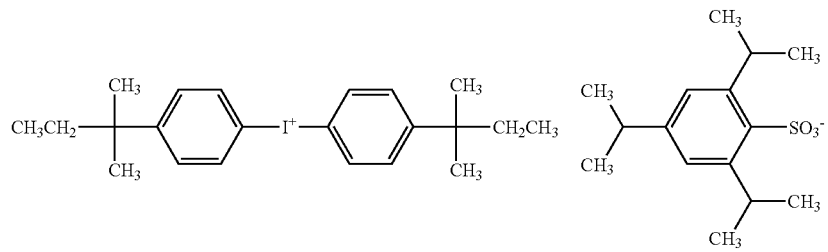 [0I-7]
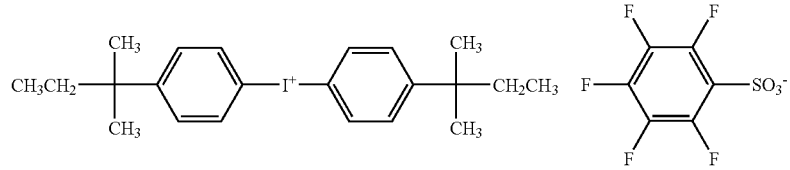 [0I-8]
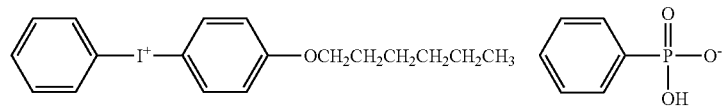 [0I-9]
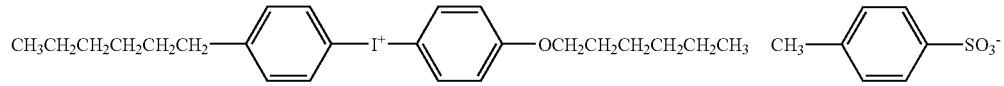 [0I-10]
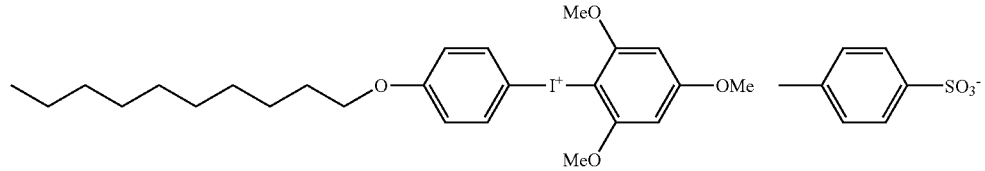 [0I-11]
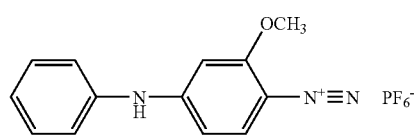 [0N-1]
-continued
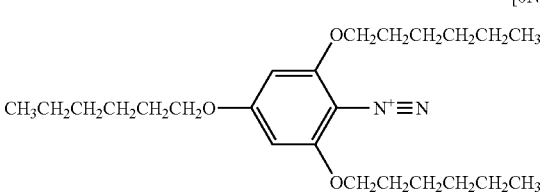 [0N-3]
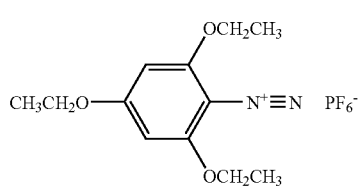 [0N-2]

-continued

[0N-4]

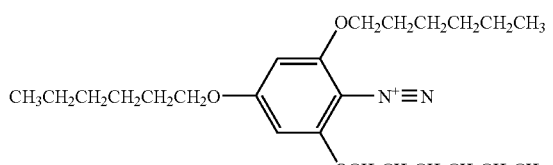

[0N-5]

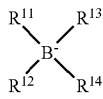

Specific examples of the onium salts preferably used as the polymerization initiator (radical generator) in the invention include those described in JP-A No. 2001-133696.

In the invention, organic borate salts and trihaloalkyl-substituted compounds are preferably used as the polymerization initiator. Combination of a borate salt and a trihaloalkyl-substituted are more preferably used. Combination of an organic borate salt and an onium salt are also preferably used.

The organic borate anion that constitutes the organic borate salt may be exemplified by the following Formula (1).

Formula (1)

$$\begin{array}{c} R^{11} \quad R^{13} \\ \diagdown \diagup \\ B^- \\ \diagup \diagdown \\ R^{12} \quad R^{14} \end{array}$$

In Formula (1), $R^{11}$, $R^{12}$, $R^{13}$ and $R^{14}$ each independently represent an alkyl group, an aryl group, an aralkyl group, an alkenyl group, an alkynyl group, a cycloalkyl group or a heterocyclic group. It is particularly preferable that one of $R^{11}$, $R^{12}$, $R^{13}$ and $R^{14}$ is an alkyl group and the others are aryl groups.

The aforementioned organic borate anion exists together with a cation that forms a salt with the anion. The cation in this case may be an alkali metal ion, onium ion or cationic sensitizing dye.

Examples of the onium ions include an ammonium ion, a sulfonium ion, an iodonium ion and a phosphonium ion.

When a salt of an organic borate anion and an alkali metal ion or onium ion is used as the organic borate salt, a sensitizing dye is added to impart photosensitivity at a wavelength of the light that the dye can absorb. Further, when a salt containing an organic borate anion as a counter anion of a cationic sensitizing dye is used as the organic borate salt, photosensitivity is imparted in accordance with the wavelength of the light that the cationic sensitizing dye can absorb. However, in the latter case, it is preferable that a salt of an alkali metal ion or onium ion and an organic borate anion is further contained.

The organic borate salt used in the invention is preferably a salt containing an organic borate anion represented by the above Formula (1), and an alkali metal ion or onium ion is preferably used as a cation to form the salt. The organic borate salt is particularly preferably a salt of an organic borate anion and an onium ion, and specific examples thereof include ammonium salts such as tetraalkylammonium salts, sulfonium salts such as triarylsulfonium salts, and phosphonium salts such as triarylalkylphosphonium salts.

The following are specific examples of particularly preferable organic borate salts (BC-1) to (BC-6).

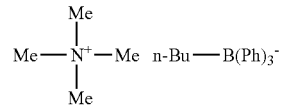
(BC-1)

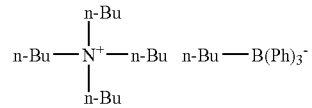
(BC-2)

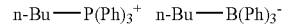
(BC-3)

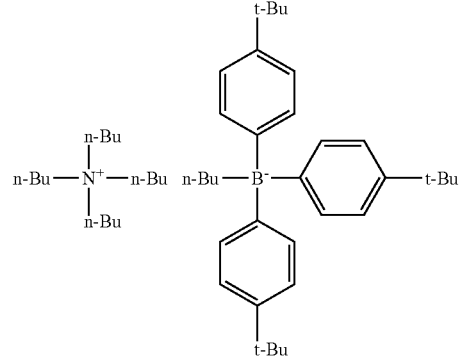
(BC-4)

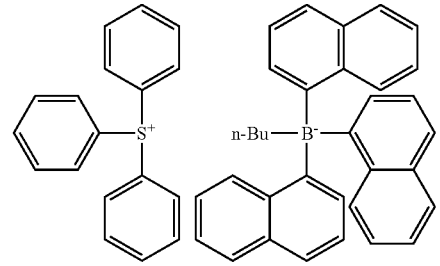
(BC-5)

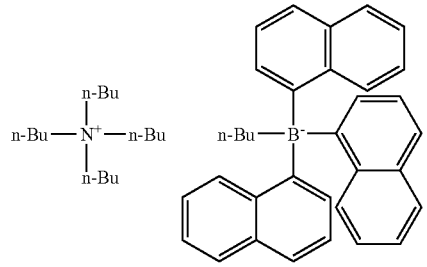
(BC-6)

The trihaloalkyl-substituted compound used in the invention is specifically a compound having at least one trihaloalkyl group such as a trichloromethyl group and a tribromomethyl group in the molecule, and preferable examples thereof include compounds in which the trihaloalkyl group is bonded to a nitrogen-containing heterocyclic group, such as s-triazine derivatives and oxadiazole derivatives, and trihaloalkylsulfonyl compounds in which the trihaloalkyl group is bonded to an aromatic ring or a nitrogen-containing heterocyclic ring via a sulfonyl group.

The following are the particularly preferable specific examples of the compounds in which a trihaloalkyl group is bonded to a nitrogen-containing heterocyclic group (T-1) to (T-15), and particularly preferable specific examples of the trihaloalkylsulfonyl compounds (BS-1) to (BS-10).

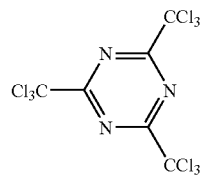
(T-1)

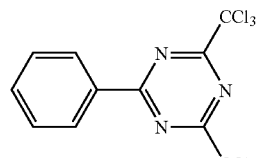
(T-2)

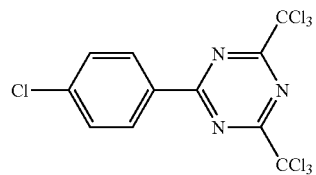
(T-3)

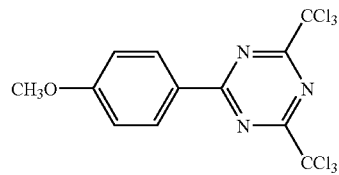
(T-4)

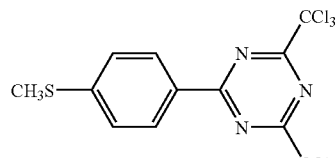
(T-5)

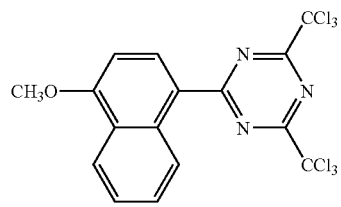
(T-6)

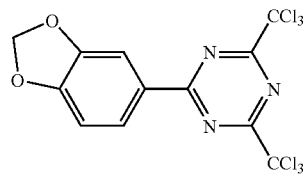
(T-7)

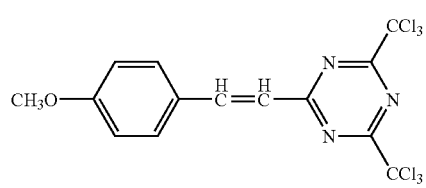
(T-8)

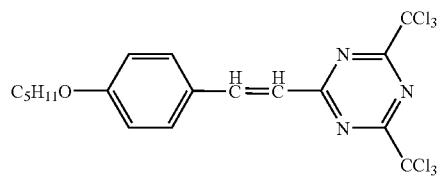
(T-9)

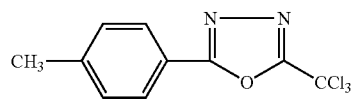
(T-10)

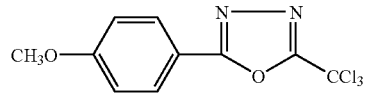
(T-11)

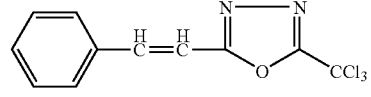
(T-12)

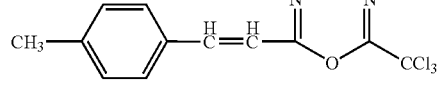
(T-13)

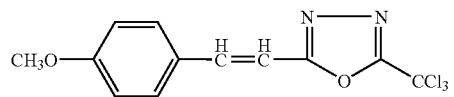
(T-14)

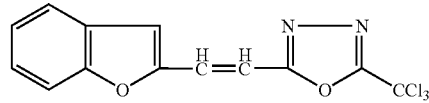
(T-15)

-continued (BS-1) 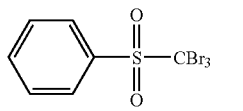

(BS-2) 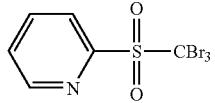

(BS-3) 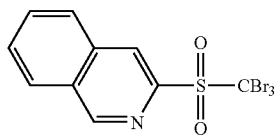

(BS-4) 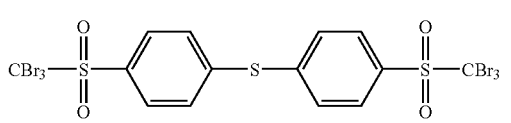

(BS-5) 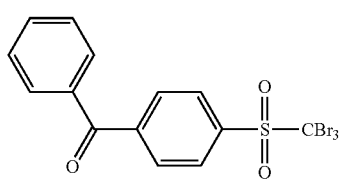

(BS-6) 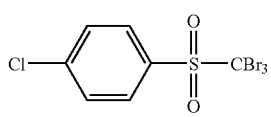

(BS-7) 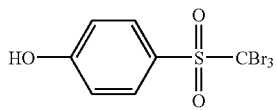

(BS-8) 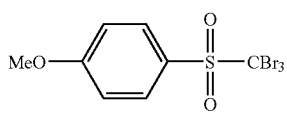

(BS-9) 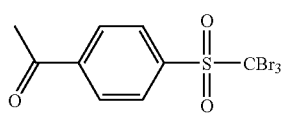

(BS-10) 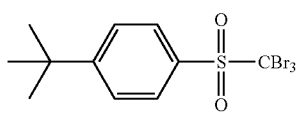

In the invention, organic peroxides may also be used as the polymerization initiator. Examples of the organic peroxides include cumene hydroperoxide, tertiary butyl hydroperoxide, dichloro peroxide, di-tertiary butyl peroxide, benzoyl peroxide, acetyl peroxide, lauroyl peroxide, and the compound having the structure as indicated below.

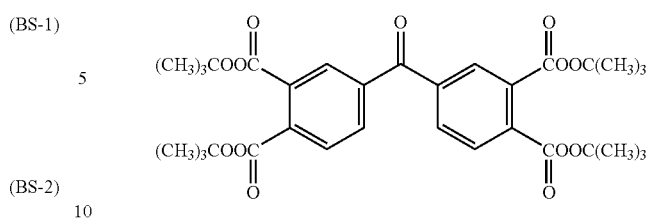

The polymerization initiator (radical generator) used in the invention preferably has a maximum absorption wavelength of 400 nm or less, and more preferably has a maximum absorption wavelength of 360 nm or less. When the polymerization initiator (radical generator) has its absorption wavelength in the UV range as above, the planographic printing plate precursors can be handled under white light.

The total content of the polymerization initiator(s) in the invention may be from 0.1% to 50% by mass, preferably from 0.5% to 30% by mass, and particularly preferably from 1% to 20% by mass, with respect to the total solid content of the photosensitive layer from the viewpoints of sensitivity and prevention of stains on the non-image region during printing.

In the invention, the polymerization initiator may be used alone or in combination of two or more. When two or more polymerization initiators are used together, two or more sulfonium salt polymerization initiators may be used in combination, or a sulfonium salt polymerization initiator and a polymerization initiator other than the sulfonium salt polymerization initiator may be used in combination.

When a sulfonium salt polymerization initiator and a polymerization initiator other than the sulfonium salt polymerization initiator are used in combination, the content ratio (mass ratio) of these initiators (sulfonium salt polymerization initiator/polymerization initiator other than the sulfonium salt) is preferably from 100/1 to 100/50, and more preferably from 100/5 to 100/25.

The polymerization initiator may be contained in the same layer together with other components, or may be separately contained in a different layer.

When a high-sensitive sulfonium salt polymerization initiator, preferably used as the polymerization initiator, is used in the photosensitive layer in the invention, the radical polymerization reaction effectively proceeds and the resulting image region has a remarkably high degree of strength. Therefore, a planographic printing plate having a high degree of strength in the image region can be produced, as well as a high degree of oxygen-blocking property of the later-described protective layer, and consequently the printing durability of the plate is further improved. Further, the sulfonium salt polymerization initiator, having excellent stability over time in itself, also imparts such an advantage as effective suppression of undesired polymerization reaction to the planographic printing plate precursor.

(Polymerizable Compound)

The polymerizable compound used in the invention is an addition polymerizable compound having at least one ethylenically unsaturated double bond, and is selected from compounds having at least one, preferably two or more, ethylenically unsaturated double bond. Such compounds are widely known in this industrial field, and any of these compounds may be used in the invention without being particularly limited. These compounds have a chemical form such as, for example, a monomer, a prepolymer, i.e., a dimer, a trimer, an oligomer, and a mixture or a copolymer of two or more of these compounds. Examples of the monomers and the copolymers thereof include unsaturated carboxylic acids (e.g., acrylic acid, methacrylic acid, itaconic acid, crotonic acid, isocrotonic acid, and maleic acid), and esters and amides thereof. The polymerizable compound is preferably an ester of an unsaturated carboxylic acid and an aliphatic polyhydric alcohol compound, or an amide of an unsaturated carboxylic acid and an aliphatic polyvalent amine compound. An addition reaction product of an ester or amide of an unsaturated carboxylic acid having a nucleophilic substituent such as a hydroxyl group, amino group or mercapto group, and a monofunctional or polyfunctional isocyanates or epoxy compounds; and a dehydration condensation reaction product with a monofunctional or polyfunctional carboxylic acid may also be preferably used. Further, an addition reaction product of an ester or amide of an unsaturated carboxylic acid having an electrophilic substituent such as an isocyanate group or an epoxy group, and a monofunctional or polyfunctional alcohol, an amine or a thiol; a substitution reaction product of an ester or amide of an unsaturated carboxylic acid having a leaving substituent such as a halogen group or a tosyloxy group, and a monofunctional or polyfunctional alcohol, an amine or a thiol are also preferably used. Alternatively, compounds in which an unsaturated phosphonic acid, styrene, vinylether and the like are used instead of the aforementioned unsaturated carboxylic acid may also be used.

Specific examples of the monomers in the form of an ester of an aliphatic polyhydric alcohol compound and an unsaturated carboxylic acid include acrylates, methacrylates, itaconates, crotonates, isocrotonates, and maleates.

Examples of the acrylates include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, and polyester acrylate oligomers.

Examples of the methacrylates include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane.

Examples of the itaconates include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of the crotonates include ethylene glycol dicrotonate, tetramethylene glycol dicrotonate, pentaerythritol dicrotonate, and sorbitol tetradicrotonate.

Examples of the isocrotonates include ethylene glycol diisocrotonate, pentaerythritol diisocrotonate, and sorbitol tetraisocrotonate.

Examples of the maleates include ethylene glycol dimaleate, triethylene glycol dimaleate, pentaerythritol dimaleate, and sorbitol tetramaleate.

Examples of other esters include aliphatic alcohol esters described in JP-B Nos. 46-27926 and 51-47334, and JP-A No. 57-196231; esters having an aromatic skeleton described in JP-A Nos. 59-5240, 59-5241 and 2-226149; and esters containing an amino group described in JP-A No. 1-165613. The aforementioned ester monomers may also be used as a mixture.

Specific examples of the amide monomers of an aliphatic polyamine compound and an unsaturated carboxylic acid include methylenebis-acrylamide, methylenebis-methacrylamide, 1,6-hexamethylenebis-acrylamide, 1,6-hexamethylenebis-methacrylamide, diethylene triamine trisacrylamide, xylylenebis-acrylamide, and xylylenebis-methacrylamide. Other examples of preferred amide monomers include those having a cyclohexylene structure described in JP-B No. 54-21726.

Further, the polymerizable compound in the invention is also preferably an addition-polymerizable urethane compound produced by addition reaction of an isocyanate and a hydroxyl group. Specific examples thereof include vinyl urethane compounds described in JP-B No. 48-41708, which are the compounds containing two or more polymerizable vinyl groups in one molecule and are produced by adding a hydroxyl group-containing vinyl monomer represented by the following Formula (IV) to a polyisocyanate compound containing two or more isocyanate groups in one molecule:

$$CH_2=C(R^a)COOCH_2CH(R^b)OH \qquad \text{Formula (IV)}$$

(In the Formula, $R^a$ and $R^b$ each independently represent H or $CH_3$).

Urethane acrylates described in JP-A No. 51-37193 and JP-B Nos. 2-32293 and 2-16765, and urethane compounds having an ethylene oxide skeleton described in JP-B Nos. 58-49860, 56-17654, 62-39417 and 62-39418 may also be suitably used as the polymerizable compound. Further, by using the addition-polymerizable compounds having an amino structure or a sulfide structure in the molecule described in JP-A Nos. 63-277653, 63-260909 and 1-105238 as the polymerizable compound, a photopolymerizable composition having a remarkably high degree of photosensitizing speed can be obtained.

Other examples of the polymerizable compounds include polyfunctional acrylates and methacrylates such as the polyester acrylates described in JP-A No. 48-64183, and JP-B Nos. 49-43191 and 52-30490, and epoxy acrylates obtained by reacting an epoxy resin with a (meth)acrylic acid. Further, specific unsaturated compounds described in JP-B Nos. 46-43946, 1-40337 and 1-40336, and vinylphosphonic acid compounds described in JP-A No. 2-25493 may also be used as the polymerizable compound. Moreover, in some cases, the compounds having a structure containing a perfluoroalkyl group described in JP-A No. 61-22048 may be appropriately used. In addition, photo-curable monomers and oligomers described in "Nippon Setchaku Kyokai Shi (Journal of Japanese Adhesive Society)", Vol. 20, No. 7, pp. 300-308 (1984), may also be used.

Monomers having two or more phenyl groups substituted by a vinyl group (hereinafter, referred to as "specific monomer" sometimes) as the polymerizable compound in the invention.

By including these components, a negative photosensitive layer having high sensitivity that does not require a heating treatment can be obtained, since such monomers can crosslink more effectively by recombination of styryl radicals resulting from radicals generated by the aforementioned polymerization initiator (radical generator).

Specific monomers in the invention are typically the compounds represented by the following Formula (3).

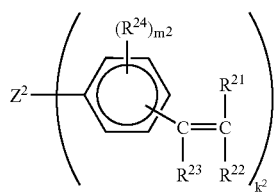

Formula (3)

In Formula (3), $Z^2$ represents a linking group; $R^{21}$, $R^{22}$ and $R^{23}$ each independently represent a hydrogen atom, a halogen atom, a carboxyl group, a sulfo group, a nitro group, a cyano group, an amide group, an amino group, an alkyl group, an aryl group, an alkoxy group, an aryloxy group and the like, wherein these groups may be further substituted by an alkyl group, an amino group, an aryl group, an alkenyl group, a carboxyl group, a sulfo group, a hydroxy group and the like; $R^{24}$ represents an atom or a group that may be substituted; $m^2$ represents an integer of from 0 to 4; and $k^2$ represents an integer of 2 or more.

Examples of the linking group represented by $Z^2$ include an oxygen atom, a sulfur atom, an alkylene group, an alkenylene group, an arylene group, —N($R^5$)—, —C(O)—O—, —C($R^6$)=N—, —C(O)—, a sulfonyl group, a heterocyclic ring structure, a benzene ring structure, and a combination of two or more thereof. $R^5$ and $R^6$ represent a hydrogen atom, alkyl group, aryl group and the like. Further, the aforementioned linking groups may have a substituent such as an alkyl group, an aryl group, a halogen atom and the like.

The heterocyclic ring structure that constitute the linking group represented by $Z^2$ may be a nitrogen-containing heterocyclic ring such as a pyrrole ring, a pyrazole ring, an imidazole ring, a triazole ring, a tetrazole ring, an isooxazole ring, an oxazole ring, an oxadiazole ring, an isothiazole ring, a thiazole ring, a thiadiazole ring, thiatriazole ring, an indole ring, an indazole ring, a benzimidazole ring, a benzotriazole ring, a benzoxazole ring, a benzthiazole ring, a benzselenazole ring, a benzothiadiazolering, a pyridine ring, a pyridazine ring, a pyrimidine ring, a pyrazine ring, a triazine ring, a quinoline ring and a quinoxaline ring; a furan ring, a thiophene ring, and the like. These heterocyclic ring structures may further have a substituent such as an alkyl group, an amino group, an aryl group, an alkenyl group, a carboxyl group, a sulfo group, a hydroxy group and the like.

The atom or group that may be substituted represented by $R^{24}$ may be a halogen atom, a carboxyl group, a sulfo group, a nitro group, a cyano group, an amide group, an amino group, an alkyl group, an aryl group, an alkoxy group, an aryloxy group and the like. These groups may further have a substituent such as an alkyl group, an amino group, an aryl group, an alkenyl group, a carboxyl group, a sulfo group, a hydroxy group and the like.

Among the compounds represented by the above formula (3), those having the structure indicated below are preferable. Specifically, the compounds with $R^{21}$ and $R^{22}$ being hydrogen atoms, $R^{23}$ being a hydrogen atom or a lower alkyl group of 4 or less carbon atoms (such as a methyl group and an ethyl group), and $k^2$ being an integer of 2 to 10 are preferable.

The following are the specific compounds represented by Formula (3), (C-1) to (C-11). However, the compounds are not limited thereto.

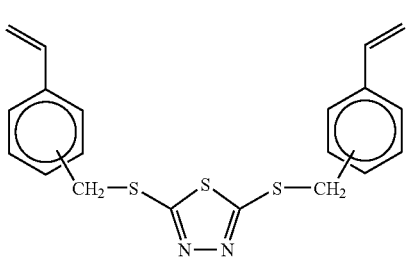

(C-1)

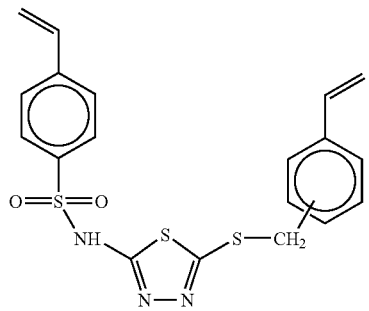

(C-2)

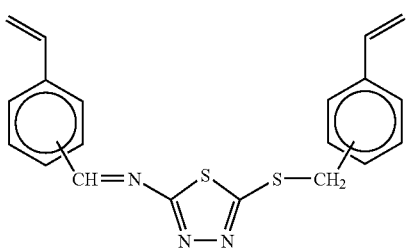

(C-3)

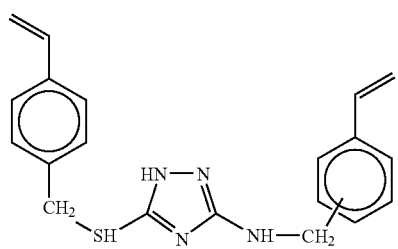

(C-4)

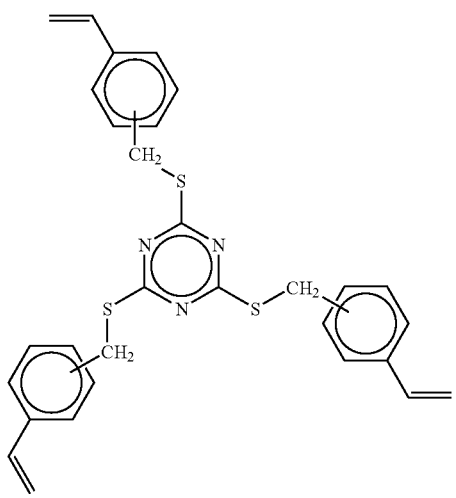
(C-5)
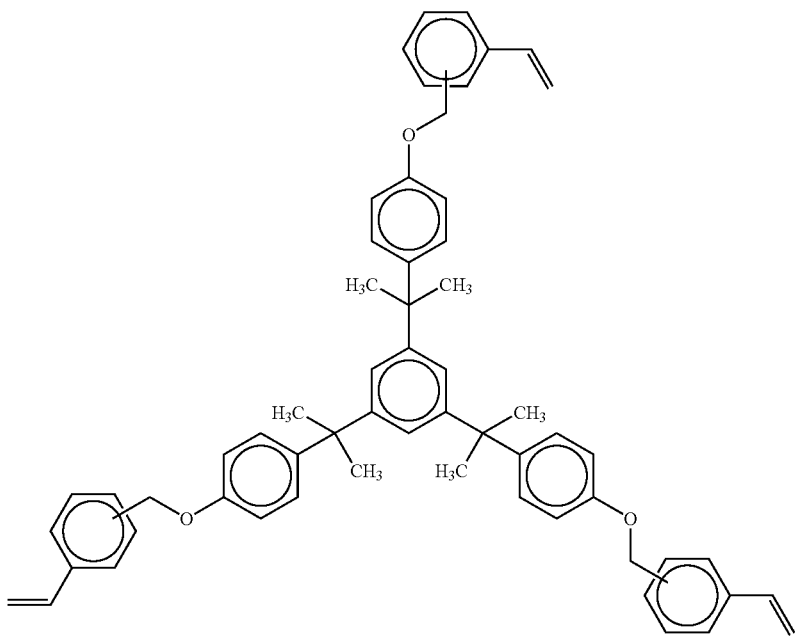
(C-6)

-continued
(C-7)
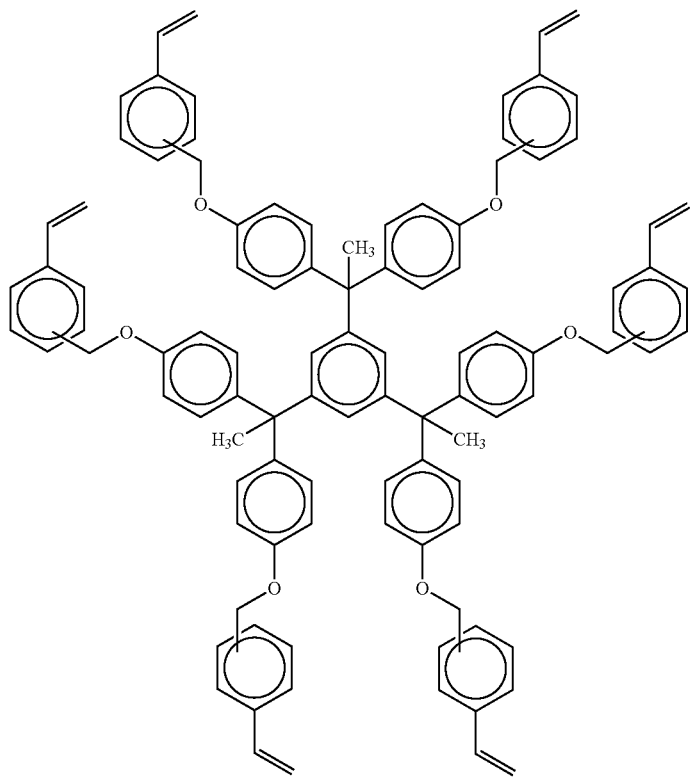
(C-8)
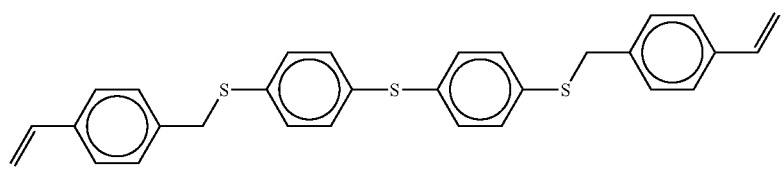
(C-9)
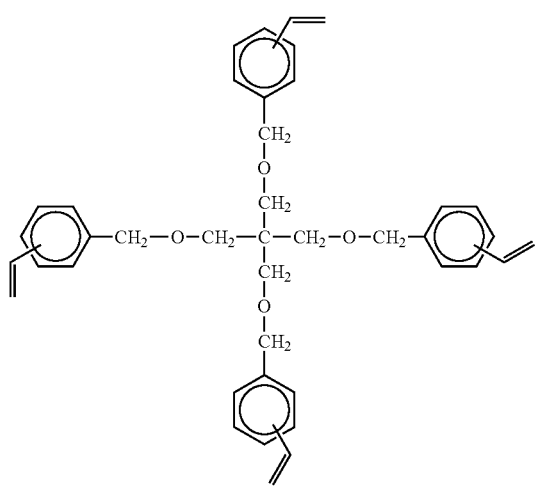
(C-10)
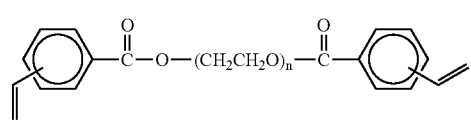
n = 1~50
(C-11)
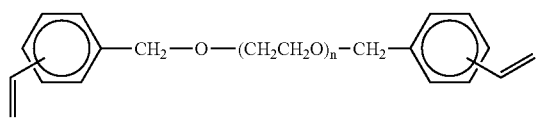
n = 1~50

Details regarding the above addition-polymerizable compounds such as the structure(s) of the compound(s), number of the type of the compounds to be used together, and the amount(s) of the compound(s) to be used, can be optionally determined depending on the desired performance of the resulting planographic printing plate precursor. For example, the compounds may be selected from the viewpoints as indicated below.

In view of photosensitizing speed, the addition-polymerizable compound preferably has plural unsaturated groups in the molecule, usually preferably bifunctional or more. In order to increase the strength of the image region, i.e. the cured region in the layer, the addition-polymerizable compounds are preferably trifunctional or more. It is also effective to regulate both photosensitivity and strength of the layer by combining a compound having different number of functional groups or different type of functional groups (e.g. acrylates, methacrylates, styrene compounds, and vinyl ether compounds). Compounds having a large molecular weight or a high degree of hydrophobicity may have excellent photosensitizing speed and film strength. However, such compounds may also have unfavorable effects on developing speed or may have a problem of easily precipitating in a developing solution. Further, selection and usage of the addition-polymerizable compound is an important factor for compatibility between the compound and other components (e.g. a binder polymer, an initiator, and a coloring agent) and dispersibility thereof in the photosensitive layer compound. For example, the compatibility may be improved by using a compound having low purity, or in combination of two or more thereof.

The addition-polymerizable compound having a particularly selected structure may be used in the planographic printing plate precursor of the invention for the purpose of improving adhesion of the photosensitive layer to a protective layer or a support, as described later.

The content of the addition-polymerizable compound in the photosensitive layer composition is preferably in the range of from 5% to 80% by mass, and more preferably in the range of from 40% to 75% by mass, with respect to the solid content of the photosensitive layer composition, from the viewpoints of sensitivity, phase separation, adhesiveness of the photosensitive layer and a precipitating property of the addition-polymerizable compound in a developing solution.

The addition-polymerizable compound may be used alone or in combination of two or more. As for the usage of the addition-polymerizable compound, the structure, composition and addition amount of the compound can be appropriately selected as needed, considering the degree of polymerization inhibition by oxygen, resolution, fogging, change in refractive index, and adhesive strength on the surface. Further, the planographic printing plate precursor in the invention may have a layer structure including an undercoating or overcoating, and an application method to form such a structure can be carried out.

(Binder Polymer)

The binder polymer for use in the invention may be any kind as long as the binder polymer has a function of improving layer properties, and is contained for the purpose of improving the layer properties.

—Specific Binder Polymer (1)—

A binder polymer having a repeating unit represented by the following Formula (i) may be preferably used as the binder polymer in the invention. Hereinafter, the binder polymer having a repeating unit represented by Formula (i) will be referred to as specific binder polymer (1) sometimes, and will be described in detail.

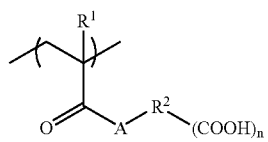

Formula (i)

In Formula (i), $R^1$ represents a hydrogen atom or a methyl group; $R^2$ represents a linking group that includes two or more atoms selected from the group consisting of a carbon atom, a hydrogen atom, an oxygen atom, a nitrogen atom and a sulfur atom, and the total number of the atoms in the group is from 2 to 82; A represents an oxygen atom or —$NR^3$—; $R^3$ represents a hydrogen atom or a monovalent hydrocarbon group having 1 to 10 carbon atoms; and n represents an integer of 1 to 5.

$R^1$ in Formula (i) represents a hydrogen atom or a methyl group, and a methyl group is particularly preferable.

The linking group represented by $R^2$ in Formula (i) contains two or more atoms selected from the group consisting of a carbon atom, a hydrogen atom, an oxygen atom, a nitrogen atom, and a sulfur atom. The total number of the atoms in the linking group is from 2 to 82, preferably from 2 to 50, and more preferably from 2 to 30. If the linking group has one or more substituents, the total number of atoms includes the number of atoms in the substituent(s). More specifically, the number of atoms that constitutes the main skeleton of the linking group represented by $R^2$ is preferably from 1 to 30, more preferably from 3 to 25, still more preferably from 4 to 20, and most preferably from 5 to 10. The term "main skeleton of the linking group" refers to an atom or an atomic group used only for linking "A" and the COOH group at the end in Formula (i). When there are two or more linking routes, the "main skeleton of the linking group" refers to an atom or an atomic group that constitutes the shortest route that links "A" and the COOH group at the end. Accordingly, when the linking group includes a cyclic structure therein, the number of the atoms to be counted in may change depending on the linking position thereof (e.g., ortho, meta, or para).

More specifically, the linking group may be a substituted or unsubstituted alkylene group, a substituted or unsubstituted arylene group, and a structure in which two or more of these groups are linked via an amide or ester bond.

The linking group having a chain structure may be ethylene, propylene and the like. Further, a structure in which two or more of these alkylene groups are linked via an ester bond may also be preferably used.

The linking group represented by $R^2$ in Formula (i) is preferably a hydrocarbon group including an alicyclic structure of 3 to 30 carbon atoms and having a valence of (n+1). More specifically, such hydrocarbon groups having a valence of (n+1) can be obtained by removing (n+1) of hydrogen atoms from optional carbon atoms that constitute a compound having an alicyclic hydrocarbon structure such as cyclopropane, cyclopentane, cyclohexane, cycloheptane, cyclooctane, cyclodecane, dicyclohexyl, tercyclohexyl and norbornane, which may have one or more substituents. Further, $R^2$ preferably has 3 to 30 carbon atoms including carbon atoms in the substituent(s).

One or more carbon atoms of the compound having an alicyclic structure may optionally be substituted by one or more hetero atoms selected from a nitrogen atom, an oxygen atom and a sulfur atom. In view of printing durability, $R^2$ is preferably a hydrocarbon group of 5 to 30 carbon atoms having an alicyclic structure and having a valence of (n+1), which may be substituted and contain two or more rings, such as a condensed polycyclic aliphatic hydrocarbon, a bridged alicyclic hydrocarbon, a spiro aliphatic hydrocarbon, and a combination of two or more aliphatic hydrocarbon rings connected to each other directly or via a linking group. In this case, the number of carbon atoms also includes the number of carbon atoms in the substituent(s).

The linking group represented by $R^2$ particularly preferably contains 5 to 10 carbon atoms in the main skeleton of the linking group, and has a chain structure including an ester bond or the aforementioned cyclic structure.

The substituent that can be introduced into the linking group represented by $R^2$ may be a monovalent non-metal atomic group other than a hydrogen atom, and examples thereof include halogen atoms (—F, —Br, —Cl and —I), a hydroxyl group, alkoxy groups, aryloxy groups, a mercapto group, alkylthio groups, arylthio groups, alkyldithio groups, aryldithio groups, an amino group, N-alkylamino groups, N,N-dialkylamino groups, N-arylamino groups, N,N-diarylamino groups, N-alkyl-N-arylamino groups, acyloxy group, a carbamoyloxy group, N-alkylcarbamoyloxy groups, N-arylcarbamoyloxy groups, N,N-dialkylcarbamoyloxy groups, N,N-diarylcarbamoyloxy groups, N-alkyl-N-arylcarbamoyloxy groups, alkylsulfoxy groups, arylsulfoxy groups, acylthio groups, acylamino groups, N-alkylacylamino groups, N-arylacylamino groups, an ureido group, N'-alkylureido groups, N',N'-dialkylureido groups, N'-arylureido groups, N',N'-diarylureido groups, N'-alkyl-N'-arylureido groups, N-alkylureido groups, N-arylureido groups, N'-alkyl-N-alkylureido groups, N'-alkyl-N-arylureido groups, N',N'-dialkyl-N-alkylureido groups, N',N'-dialkyl-N-arylureido groups, N'-aryl-N-alkylureido groups, N'-aryl-N-arylureido groups, N',N'-diaryl-N-alkylureido groups, N',N'-diaryl-N-arylureido groups, N'-alkyl-N'-aryl-N-alkylureido groups, N'-alkyl-N'-aryl-N-arylureido groups, alkoxycarbonylamino groups, aryloxycarbonylamino groups, N-alkyl-N-alkoxycarbonylamino groups, N-alkyl-N-aryloxycarbonylamino groups, N-aryl-N-alkoxycarbonylamino groups, N-aryl-N-aryloxycarbonylamino groups, a formyl group, acyl groups, a carboxyl group and conjugated base groups thereof, alkoxycarbonyl groups, aryloxycarbonyl groups, a carbamoyl group, N-alkylcarbamoyl groups, N,N-dialkylcarbamoyl groups, N-arylcarbamoyl groups, N,N-diarylcarbamoyl groups, N-alkyl-N-arylcarbamoyl groups, alkylsulfinyl groups, arylsulfinyl groups, alkylsulfonyl groups, arylsulfonyl groups, a sulfo group (—SO$_3$H) and conjugated base groups thereof, alkoxysulfonyl groups, aryloxysulfonyl groups, a sulfinamoyl group, N-alkylsulfinamoyl groups, N,N-dialkylsulfinamoyl groups, N-arylsulfinamoyl groups, N,N-diarylsulfinamoyl N,N-dialkylsulfamoyl groups, N-arylsulfamoyl groups, N,N-diarylsulfamoyl groups, N-alkyl-N-arylsulfamoyl groups, N-acylsulfamoyl groups and conjugated base groups thereof, N-alkylsulfonylsulfamoyl groups (—SO$_2$NHSO$_2$(alkyl)) and conjugated base groups thereof, N-arylsulfonylsulfamoyl groups (—SO$_2$NHSO$_2$(aryl)) and conjugated base groups thereof, N-alkylsulfonylcarbamoyl groups (—CONHSO$_2$(alkyl)) and conjugated base groups thereof, N-arylsulfonylcarbamoyl groups (—CONHSO$_2$(aryl)) and conjugated base groups thereof, alkoxysilyl groups (—Si(Oalkyl)$_3$), aryloxysilyl groups (—Si(Oaryl)$_3$), a hydroxysilyl group (—Si(OH)$_3$) and conjugated base groups thereof, a phosphono group (—PO$_3$H$_2$) and conjugated base groups thereof, dialkylphosphono groups (—PO$_3$(alkyl)$_2$), diarylphosphono groups (—PO$_3$(aryl)$_2$), alkylarylphosphono groups (—PO$_3$(alkyl)(aryl)), monoalkylphosphono groups (—PO$_3$H(alkyl)) and conjugated base groups thereof, monoarylphosphono groups (—PO$_3$H(aryl)) and conjugated base groups thereof, a phosphonoxy group (—OPO$_3$H$_2$) and conjugated base groups thereof, dialkylphosphonoxy groups (—OPO$_3$(alkyl)$_2$), diarylphosphonoxy groups (—OPO$_3$(aryl)$_2$), alkylarylphosphonoxy groups (—OPO$_3$(alkyl)(aryl)), monoalkylphosphonoxy groups (—OPO$_3$H(alkyl)) and conjugated base groups thereof, monoarylphosphonoxy groups (—OPO$_3$H(aryl)) and conjugated base groups thereof, a cyano group, a nitro group, dialkylboryl groups (—B(alkyl)$_2$), diarylboryl groups (—B(aryl)$_2$), alkylarylboryl groups (—B(alkyl)(aryl)), a dihydroxyboryl group (—B(OH)$_2$) and conjugated base groups thereof, alkylhydroxyboryl groups (—B(alkyl)(OH)) and conjugated base groups thereof, arylhydroxyboryl groups (—B(aryl)(OH)) and conjugated base groups thereof, aryl groups, alkenyl groups, and alkynyl groups.

In the planographic printing plate precursor of the invention, a substituent having a hydrogen atom capable of forming a hydrogen bond, and particularly a substituent having an acidity and exhibits a smaller value of acid dissociation constant (pKa) than that of a carboxylic acid are not preferred, due to their tendency to reduce printing durability, although it depends on the design of the photosensitive layer. On the other hand, a substituent having hydrophobicity such as a halogen atom and a hydrocarbon group (e.g., alkyl groups, aryl groups, alkenyl groups and alkynyl groups), an alkoxy group and an aryloxy groups is preferable since they tend to improve printing durability. In particular, when the aforementioned cyclic structure is a mono-alicyclic hydrocarbon of 6 or less membered ring, such as cyclopentane or cyclohexane, the compound preferably has such hydrophobic substituent(s). The substituent may bond to another substituent or a substituted hydrocarbon group to form a ring, if possible, and may further be substituted by a substituent.

When "A" in Formula (i) is NR$^3$—, R$^3$ represents a hydrogen atom or a monovalent hydrocarbon group of 1 to 10 carbon atoms. This monovalent hydrocarbon groups of 1 to 10 carbon atoms represented by R$^3$ may be alkyl groups, aryl groups, alkenyl groups and alkynyl groups.

Specific examples of the alkyl groups include linear, branched, and cyclic alkyl groups of 1 to 10 carbon atoms, such as a methyl group, an ethyl group, a propyl group, a butyl group, a pentyl group, a hexyl group, a heptyl group, an octyl group, a nonyl group, a decyl group, an iso-propyl group, an iso-butyl group, a sec-butyl group, a tert-butyl group, an iso-pentyl group, a neopentyl group, a 1-methylbutyl group, an iso-hexyl group, a 2-ethylhexyl group, a 2-methylhexyl group, a cyclopentyl group, a cyclohexyl group, a 1-adamantyl group, and a 2-norbornyl group.

Specific examples of the aryl groups include aryl groups of 1 to 10 carbon atoms such as a phenyl group, a naphthyl group, and an indenyl group; and hetero aryl groups of 1 to 10 carbon atoms and containing a hetero atom selected from the group consisting of a nitrogen atom, an oxygen atom and a sulfur atom, such as a furyl group, a thienyl group, a pyrrolyl group, a pyridyl group, and a quinolyl group.

Specific examples of the alkenyl groups include linear, branched, and cyclic alkenyl groups of 1 to 10 carbon atoms, such as a vinyl group, a 1-propenyl group, a 1-butenyl group, a 1-methyl-1-propenyl group, a 1-cyclopentenyl group, and a 1-cyclohexenyl group.

Specific examples of the alkynyl groups include alkynyl groups of 1 to 10 carbon atoms, such as an ethynyl group, a 1-propynyl group, a 1-butynyl group, and a 1-octynyl group. R³ may have one or more substituents, and examples thereof are the same as those of the substituents which can be introduced into R². The total number of carbon atoms of R³ including the number of carbon atoms in the substituent(s) is 1 to 10.

The "A" in Formula (i) is preferably an oxygen atom or —NH—, for the easiness of synthesizing the compound.

The "n" in Formula (i) represents an integer of from 1 to 5, and is preferably 1, from the viewpoint of printing durability.

The following are specific examples of the repeating units represented by Formula (i), but the invention is not limited thereto.

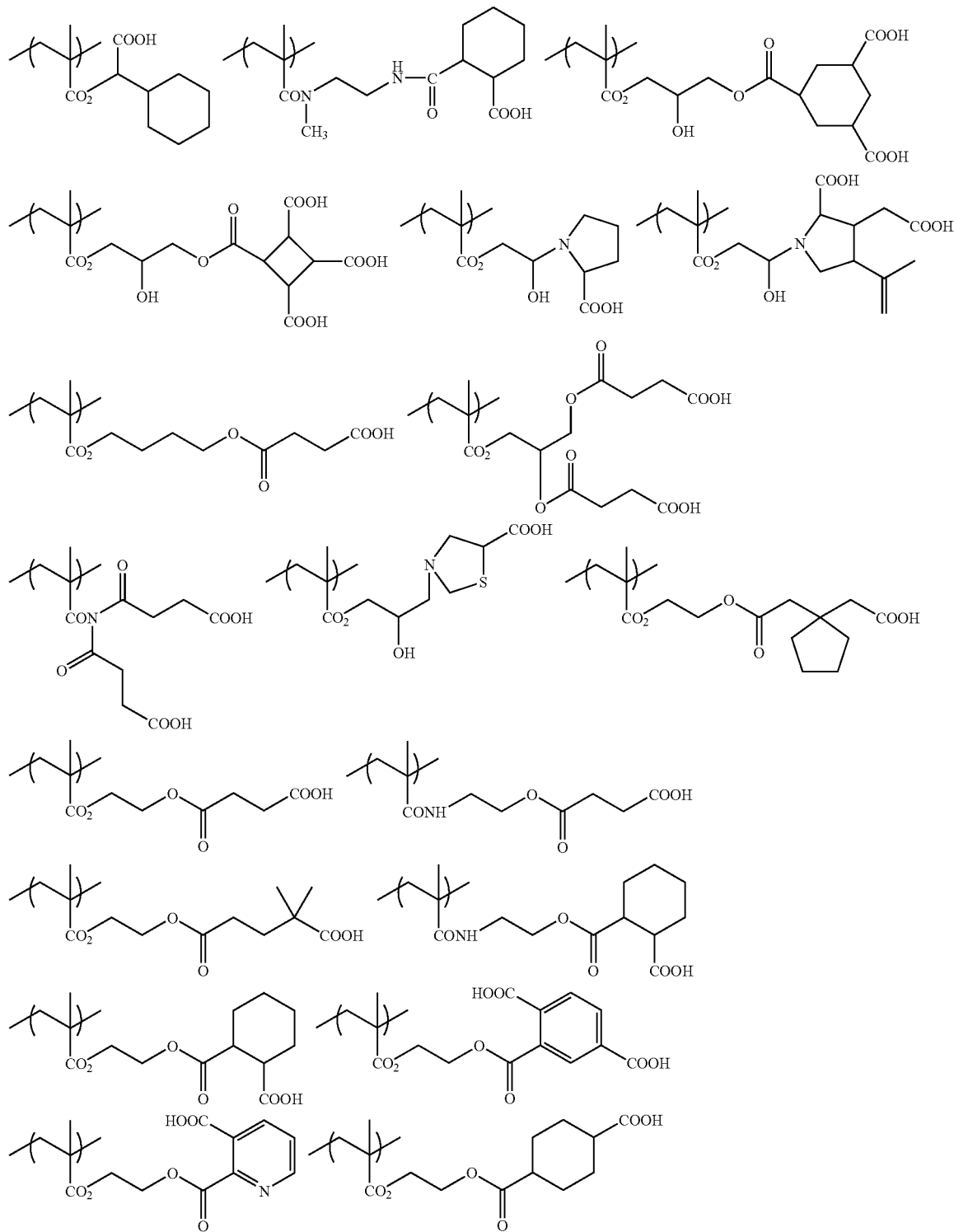

-continued
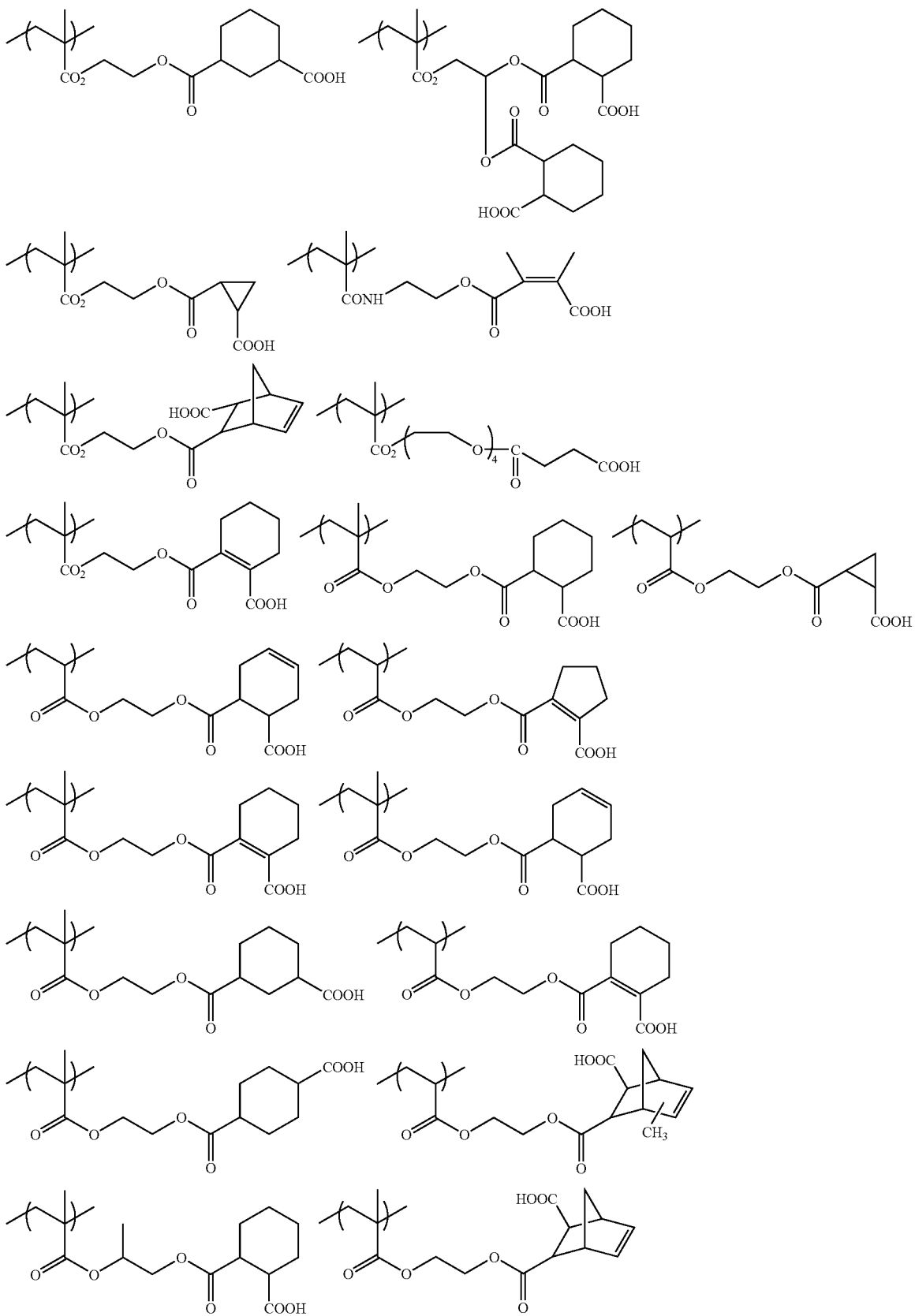

-continued
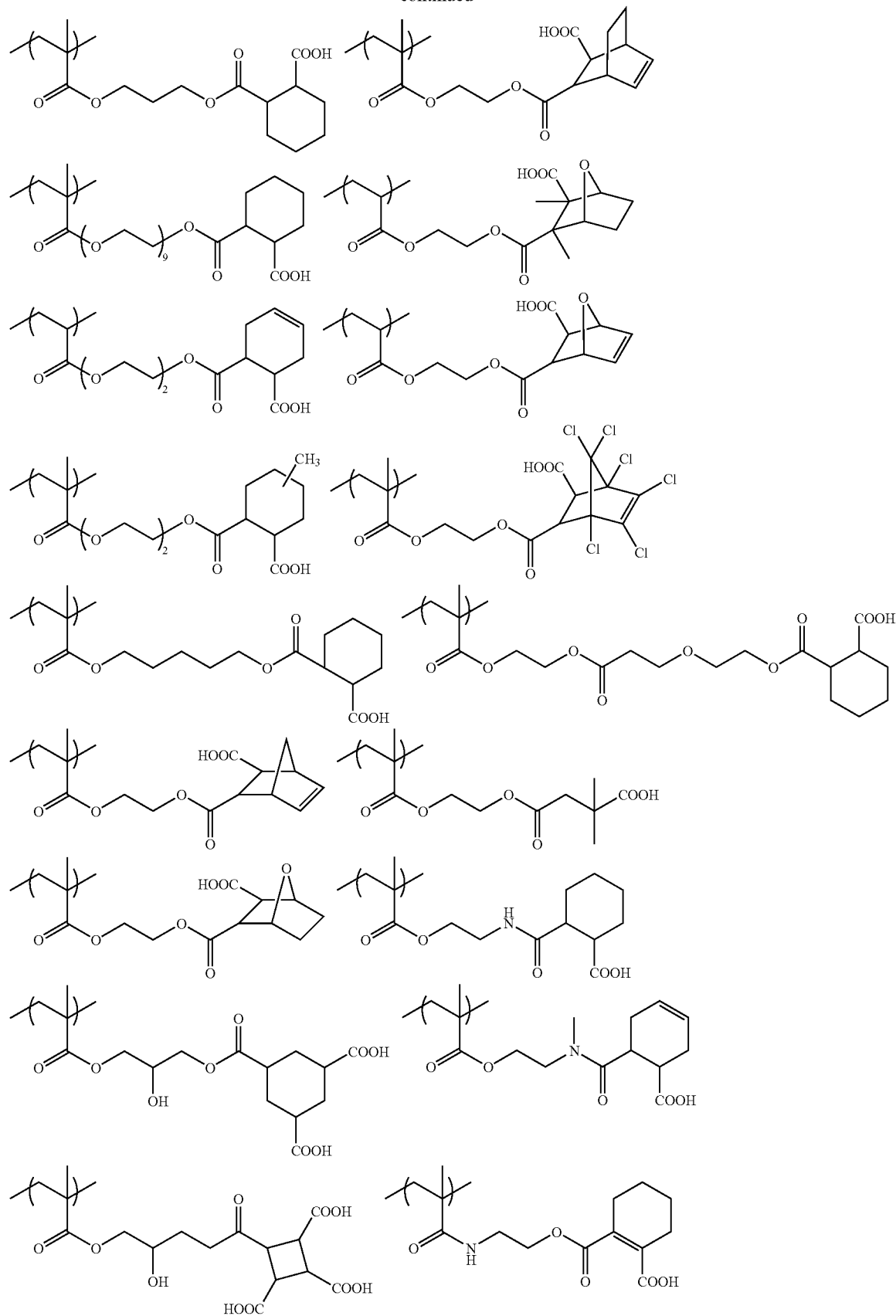

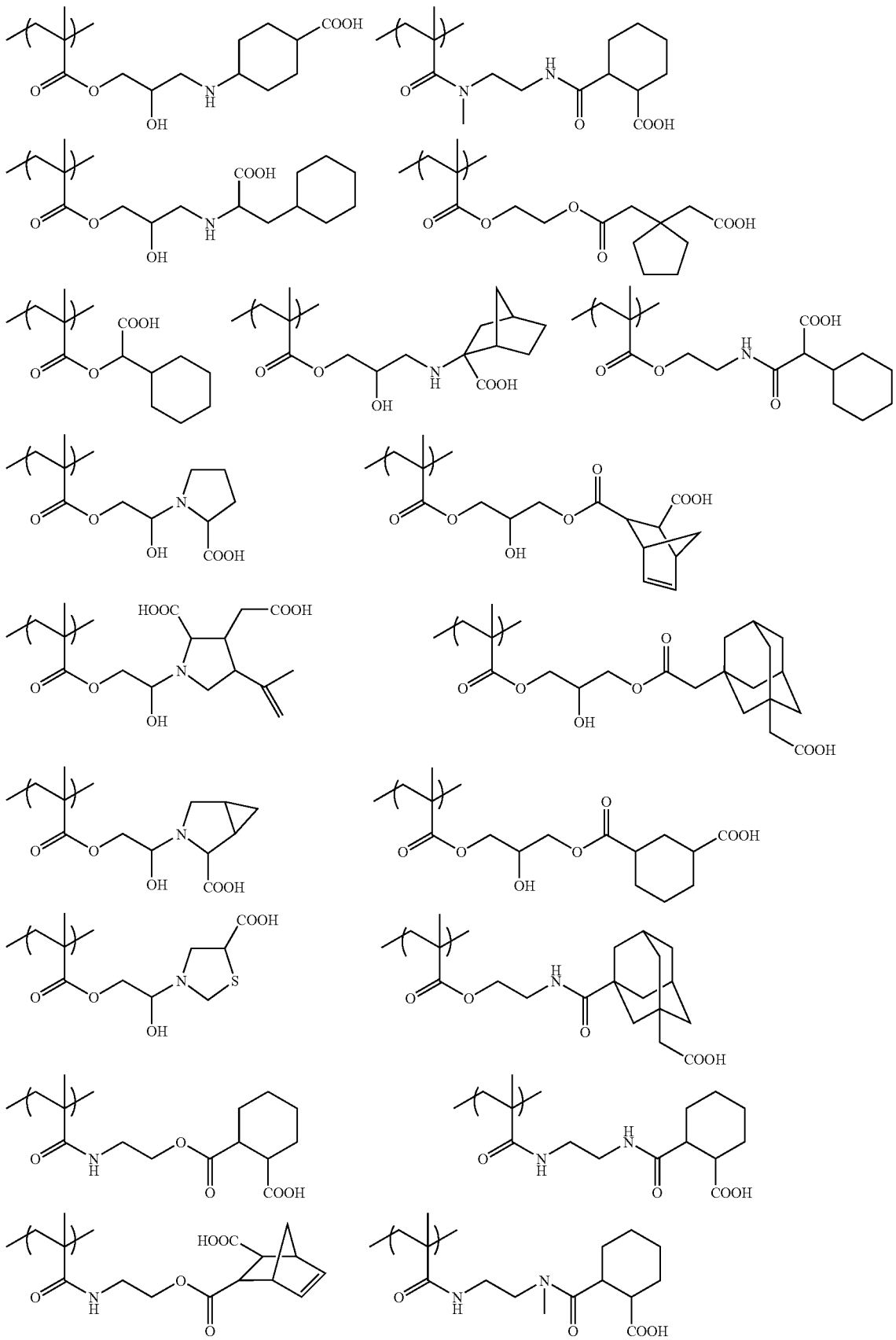

-continued
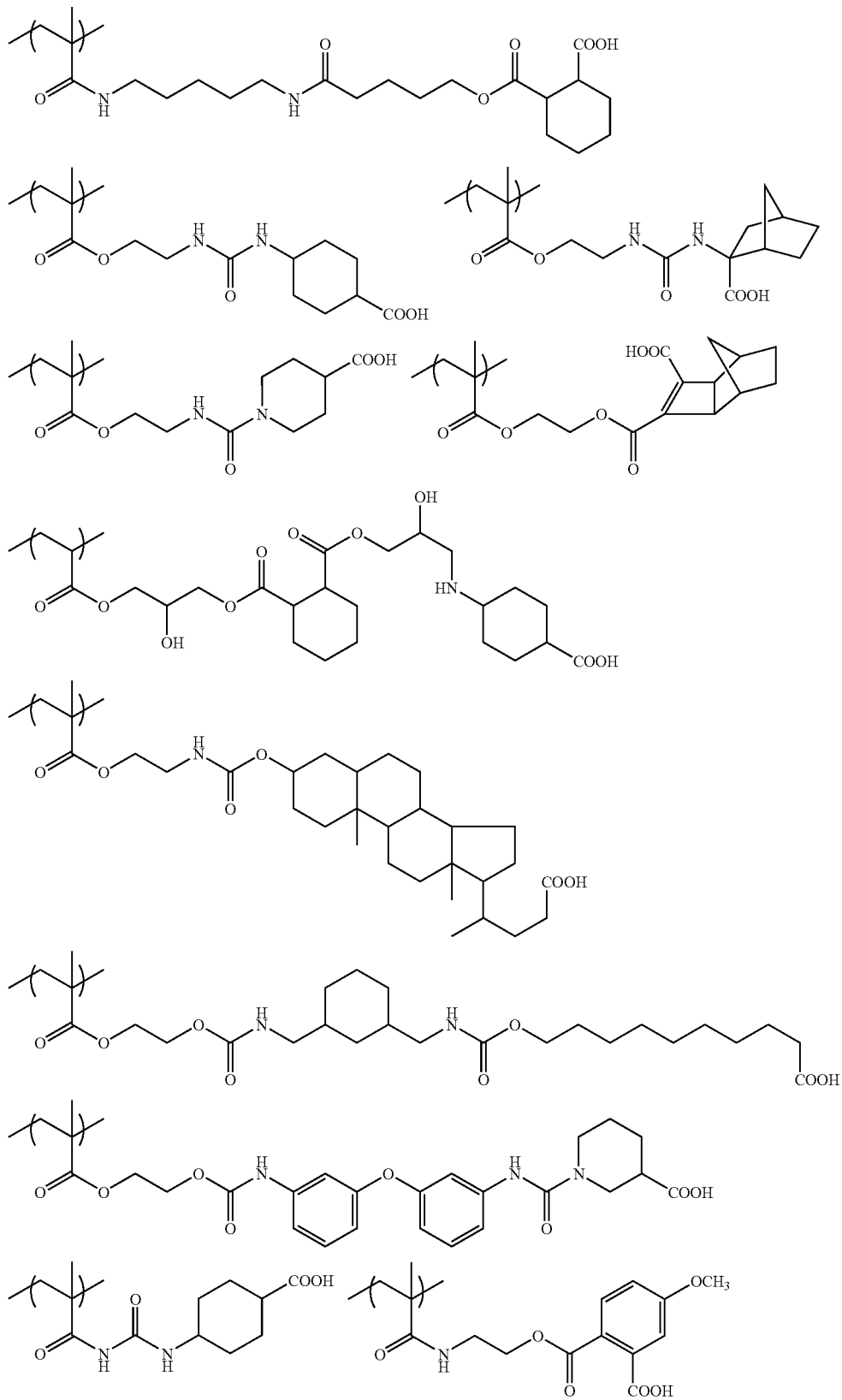

-continued

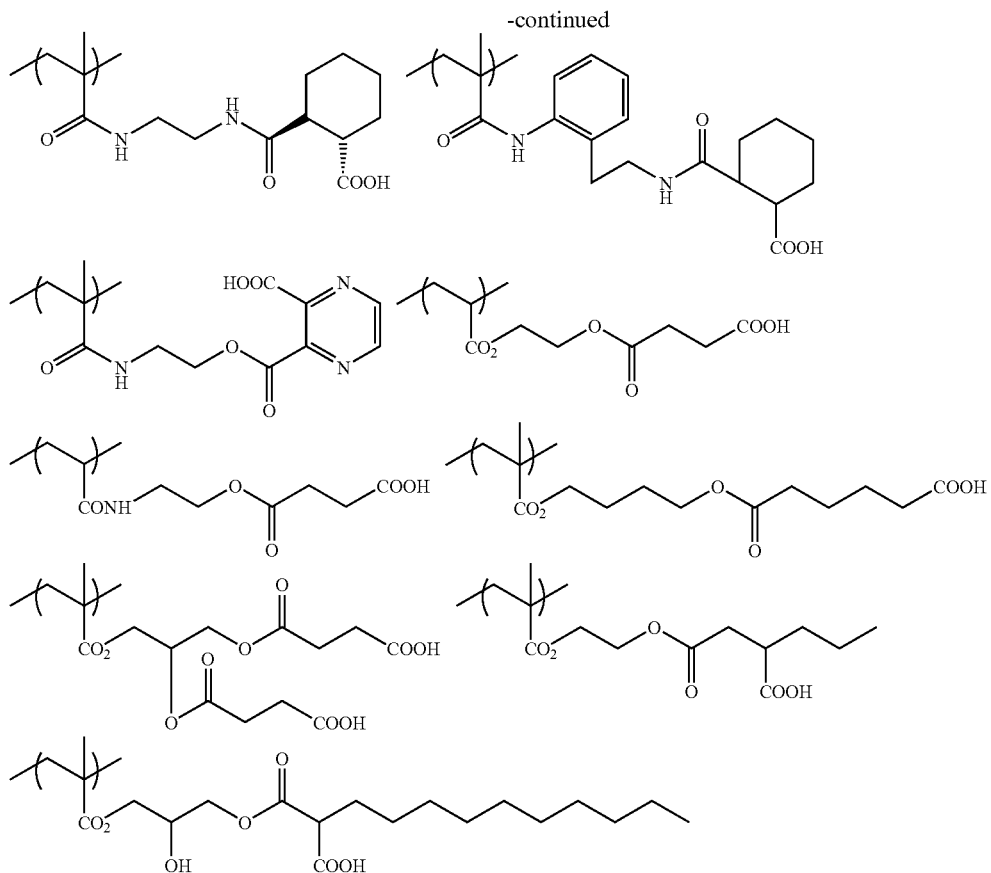

The binder polymer may contain only one type of repeating unit represented by Formula (i), or may contain two or more types in combination. The specific binder polymer (1) used in the invention may entirely consist of the repeating unit(s) represented by Formula (i), but is usually a copolymer in which other copolymerization component(s) are combined. The total content of the repeating unit represented by Formula (i) in the copolymer is appropriately determined depending on the desired structure of the polymer, desired composition for a photosensitive layer and the like, but is preferably in the range of from 1 to 99 mol %, more preferably from 5 to 40 mol %, and still more preferably from 5 to 20 mol %, with respect to the total mol of the polymer components.

The copolymerization component to be combined may be any conventionally known monomers capable of radical polymerization. Specific examples thereof include the monomers described in "Kobunshi Data Handbook, Kiso-hen (Polymer Data Handbook, Fundamental Step)", edited by Kobunshi Gakkai (Society of Polymer Science, Japan), published by BAIFUKAN CO., LTD, 1986)". These copolymerization components may be used alone or in combination of two or more.

The molecular weight of the specific binder polymer (1) used in the invention may be determined from the viewpoints of the image-forming property and printing durability of the precursor, and is preferably in the range of from 2,000 to 1,000,000, more preferably in the range of from 5,000 to 500,000, and still more preferably in the range of from 10,000 to 200,000.

The acid value (meq/g) of the specific binder polymer (1) is preferably in the range of from 2.00 to 3.60.

The specific binder polymer (1) in the invention may be used alone or in combination with other binder polylmer(s).

The amount of the binder polymer(s) other than the specific binder polymer (1) with respect to the total amount of the binder polymer component may be in the range of from 1% to 60% by mass, preferably from 1% to 40% by mass, and more preferably from 1% to 20% by mass. Any known binder polymers may be used as the binder polymer(s) other than the specific binder polymer (1) without being particularly limited, and specific examples thereof include a binder polymer having an acryloyl group in the main chain and a urethane binder polymer, which are commonly used in the art, and a binder polymer having a radical polymerizable group as described below.

—Binder Polymer other than Specific Binder Polymer (1)—

The binder polymer used in combination with the specific binder polymer (1) is preferably a binder polymer containing a radical polymerizable group.

The radical polymerizable group is not particularly limited, as long as the group is capable of radical polymerization. Examples of the radical polymerizable groups include α-substituted methylacrylic groups (—OC(=O)—C(—CH$_2$Z)=CH$_2$, wherein Z is a hydrocarbon group containing a hetero atom at a position bonding to —CH$_2$ group), acrylic group, methacrylic group, allyl groups and styryl groups. Among these, the radical polymerizable group is preferably an acrylic group or a methacrylic group.

The content of the radical polymerizable group(s) in the binder polymer (the content of the radical polymerizable unsaturated double bonds determined by iodimetry) is preferably from 0.1 to 10.0 mmol, more preferably from 1.0 to 7.0 mmol, and most preferably from 2.0 to 5.5 mmol per gram of the binder polymer, from the viewpoints of sensitivity and storability.

It is preferable that the binder polymer other than the specific binder polymer (1) further contains an alkali-soluble group. The content of the alkali-soluble group in the binder polymer (the acid value of the binder polymer determined by neutralization titration) is preferably from 0.1 to 3.0 mmol, more preferably from 0.2 to 2.0 mmol, and still more preferably from 0.45 to 1.0 mmol per gram of the binder polymer, from the viewpoints of precipitation of development scums and printing durability.

The weight-average molecular weight of the binder polymer other than the specific binder polymer (1) is preferably in the range of from 2,000 to 1,000,000, more preferably in the range of from 10,000 to 300,000, and most preferably in the range of from 20,000 to 200,000, from the viewpoints of film-forming property (printing durability) and solubility of the binder polymer in a coating solvent.

Further, the glass transition temperature (Tg) of the binder polymer other than the specific binder polymer (1) is preferably in the range of 70 to 300° C., more preferably in the range of 80 to 250° C., and still more preferably in the range of 90 to 200° C., from the viewpoints of storage stability, printing durability, and sensitivity.

The binder polymer other than the specific binder polymer (1) preferably contains an amide or imide group in the molecule, and more preferably contains a methacrylamide or a methacrylamide derivative, in order to obtain a higher glass transition temperature of the binder polymer.

Urethane binder polymers containing an acid group described in JP-B Nos. 7-12004, 7-120041, 7-120042, 8-12424, JP-A Nos. 63-287944, 63-287947, 1-271741, and Japanese Patent Application No. 11-352691 may also be used in the invention. These binde polymers have excellent strength, and are favorably used in view of printing durability and adaptability to low-level exposure.

Binder polymers containing an amide group described in JP-A No. 11-171907 have excellent developing property and film strength, and are also preferably used.

Water-soluble linear organic polymers such as polyvinylpyrrolidone and polyethyleneoxide are also favorably used. Further, alcohol-soluble nylons or a polyether of 2,2-bis-(4-hydroxyphenyl)-propane and epichlorohydrin and the like are also favorably used in order to improve the strength of the cured film layer.

In the preferred embodiments, the binder polymer is alkali-soluble with substantially no water. By using such a binder polymer, use of an organic solvent that adversely affects the environment can be omitted or the amount thereof can be reduced to a very small level. In this case, the acid value (the acid content per gram of a polymer expressed by chemical equivalent) and the molecular weight of the binder polymer are appropriately determined in consideration of strength of images and developing property. The acid value is preferably in the range of from 0.4 to 3.0 meq/g, and more preferably in the range of from 0.6 to 2.0 meq/g. The mass average molecular weight is preferably in the range of from 3,000 to 500,000 and more preferably in the range of from 10,000 to 300,000.

These binder polymers may be used in combination with the specific binder polymer (2) and (3) described below.

—Specific Binder Polymer (2)—

A binder polymer containing a phenyl group substituted by a vinyl group in a side chain (hereinafter, referred to as specific binder polymer (2) sometimes) may also be preferably used for the binder polymer in the invention.

The binder polymer containing a phenyl group substituted by a vinyl group in a side chain is a polymer in which a phenyl group substituted by a vinyl group is bonded to a main chain directly or via a linking group. Examples of the linking group are not particularly limited and include any groups, atoms or combinations thereof. The aforementioned phenyl group may further be substituted by a group or atom capable of substitution, in addition to the vinyl group. Examples of such groups and atoms include a halogen atom, a carboxyl group, a sulfo group, a nitro group, a cyano group, an amide group, an amino group, an alkyl group, an aryl group, an alkoxy group, and an aryloxy group. Further, the vinyl group may be substituted by a halogen atom, a carboxyl group, a sulfo group, a nitro group, a cyano group, an amide group, an amino group, an alkyl group, an aryl group, an alkoxy group, and an aryloxy group.

The specific binder polymer (2) is preferably a polymer containing a group represented by the following Formula (2) in a side chain.

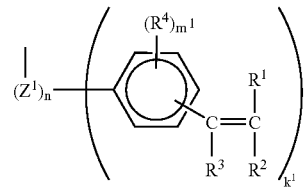

Formula (2)

In Formula (2), $Z^1$ represents a linking group; $R^1$, $R^2$ and $R^3$ each independently represent a hydrogen atom, a halogen atom, a carboxyl group, a sulfo group, a nitro group, a cyano group, an amide group, an amino group, an alkyl group, an aryl group, an alkoxy group, an aryloxy group and the like. These groups may further be substituted by an alkyl group, an amino group, an aryl group, an alkenyl group, a carboxyl group, a sulfo group, a hydroxy group and the like; $R^4$ represents an atom or a group that may be substituted; n represents an integer of 0 or 1; $m^1$ represents an integer of from 0 to 4; and $k^1$ represents an integer of from 1 to 4.

In Formula (2), $R^4$ is preferably a hydrogen atom. Examples of the linking group represented by $Z^1$ include an oxygen atom, a sulfur atom, an alkylene group, an alkenylene group, an arylene group, —N($R^a$)—, —C(O)—O—, —C($R^b$)=N—, —C(O)—, a sulfonyl group, a heterocyclic group, a group having the structure indicated below, and a combination of two or more of these groups. In the above, $R^a$ and $R^b$ each independently represent a hydrogen atom, an alkyl group, an aryl group and the like. These linking groups may be further substituted by an alkyl group, an aryl group, a halogen atom and the like.

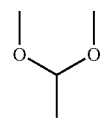

Examples of the above heterocyclic groups include a nitrogen-containing heterocyclic ring such as a pyrrole ring, a pyrazole ring, an imidazole ring, a triazole ring, a tetrazole ring, an isooxazole ring, an oxazole ring, an oxadiazole ring, an isothiazole ring, a thiazole ring, a thiadiazole ring, a thiatriazole ring, an indole ring, an indazole ring, a benzimidazole ring, a benzotriazole ring, a benzoxazole ring, a benzthiazole ring, a benzselenazole ring, a benzothiadiazole ring, a pyridine ring, a pyridazine ring, a pyrimidine ring, a pyrazine ring, a triazine ring, a quinoline ring and a quinoxaline ring; a furan ring, a thiophene ring and the like. These heterocyclic rings may further have a substituent.

Examples of the binder polymers having a group represented by the above Formula (2) in a side chain include those indicated below, but the invention is not limited thereto.

The numbers in the following structures represent percentages by mass of the repeating units, where the total composition of the copolymer is 100% by mass.

(P-1)

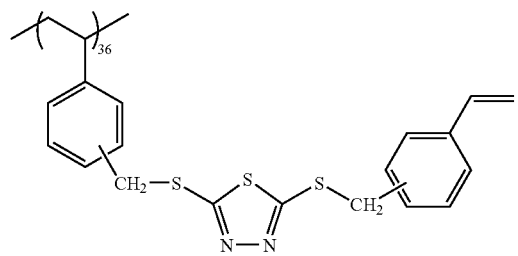
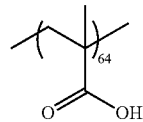
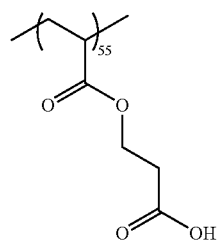

(P-2)

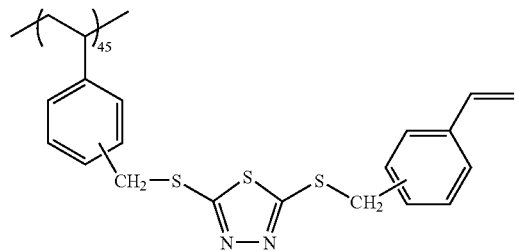

(P-3)

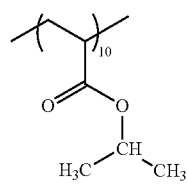
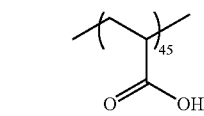
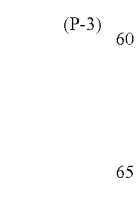

-continued

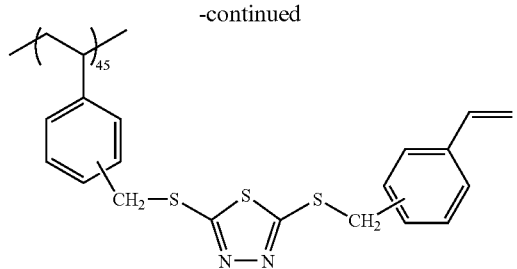

(P-4)

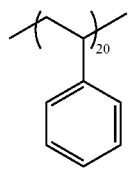
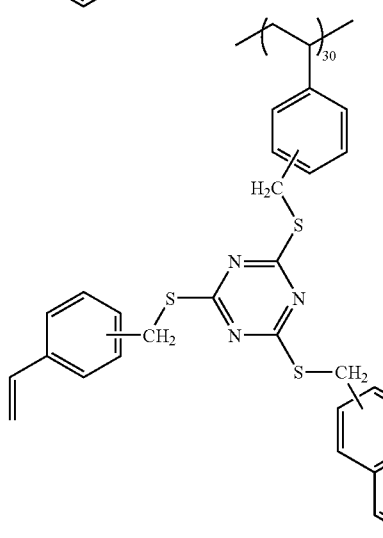
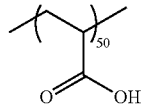

(P-5)

-continued
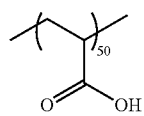
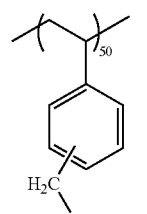
(P-6)
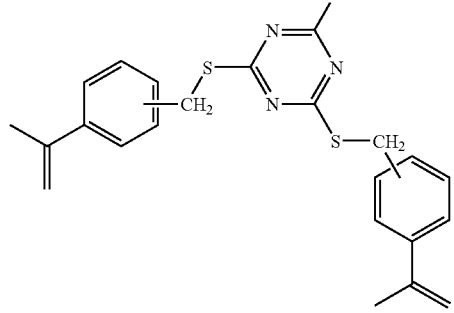
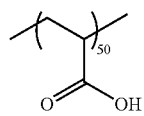
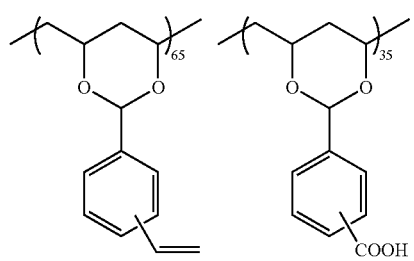
(P-7)
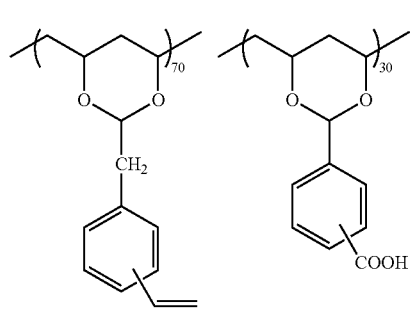
(P-8)
-continued
(P-9)
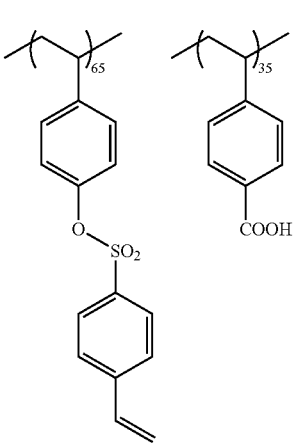
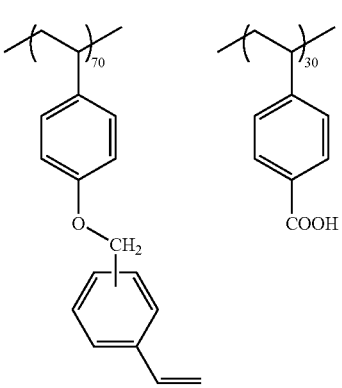
(P-10)
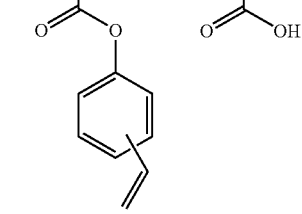
(P-11)
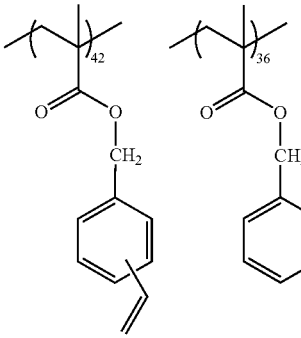
(P-12)

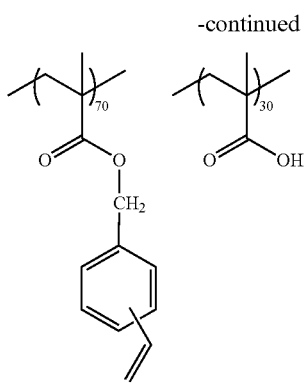
(P-13)

The weight average molecular weight of the specific binder polymer (2) is preferably in the range of from 5,000 to 1,000,000, more preferably in the range of from 10,000 to 500,000, and still more preferably in the range of from 20,000 to 300,000.

—Specific Binder Polymer (3)—

Organic polymers having an allyl group may also be suitably used for the binder polymer in the invention.

Among these, particularly preferred is a binder polymer having an allyl group in the range of from 0.7 meq/g to 8.0 meq/g (i.e., from $7 \times 10^{-4}$ mol per gram to $8.0 \times 10^{-3}$ mol per gram). In the following, such a binder polymer will be referred to as specific binder polymer (3).

The binder polymer (3) is preferably a polymer or copolymer of an allyl acrylilate and/or an allyl methacrylate.

Specific examples thereof include a homopolymer of poly (allyl methacrylate) and the like, or copolymers of the aforementioned allyl acrylate and/or allyl methacrylate and other monomers such as acrylic acid, methacrylic acid, methyl acrylate, methyl methacrylate, ethyl acrylate, ethyl methacrylate, butyl acrylate, butyl methacrylate, alkyl esters thereof, vinyl acetate, styrene, maleic anhydride, acrylonitrile and the like.

Other preferable examples of the specific binder polymer (3) include a polyurethane having an allyl group that may be either a pendant allyl group or a terminal allyl group (hereinafter, referred to as an allyl group-containing polyurethane sometimes).

The allyl group-containing polyurethane may be prepared by reacting diisocyanate with a diol having excess of allyl groups to give a polyurethane.

Further, the allyl group-containing polyurethane may also be prepared by reacting a diisocyanate with a diol having a carboxyl group such as dimethylol propionate to give a polyurethane having a carboxyl group, and then converting the carboxyl group into an allyl ester group, e.g., by esterifying with an allyl alcohol.

Examples of the diols having an allyl group include 3-allyloxy-1,2-propanediol and trimethylolpropane allyl ether. Examples of the diols having an allyl ester group include allyl 4,4-bis(hydroxyethyloxyphenyl)-pentanoate and 2,2-bis(hydroxymethyl)propanoate. Among these, preferred is 3-allyloxy-1,2-propanediol: $(HO)CH_2-CH(OH)-CH_2-O-CH_2-CH=CH_2$.

The diols containing an allyl group may be used alone or in combination thereof, or in combination with a diol not containing an allyl group. However, the diol with no allyl group is used under such conditions that the allyl groups exist in the range of from 0.7 meq/g to 8.0 meq/g in the resulting polymer.

In the invention, examples of the diols not containing an allyl group include ethylene glycol, diethylene glycol, polyethylene glycol, propylene glycol, polypropylene glycol, neopentyl glycol, 1,4-butanediol and 1,6-hexanediol.

The allyl group-containing polyurethane may further contain an acid group, i.e., a group having a pKa of 7 or less such as a sulfonic acid group, a phosphoric acid group, a phosphonic acid group, and a carboxylic acid group. Such polyurethanes may be obtained by reacting a diisocyanate with an excess amount of a mixture of a diol containing an allyl group and a diol containing one or more acid groups, as described above. Usable diols containing one or more acid groups may be exemplified by dialkanol alkyl sulfonic acids, dialkanol alkyl phosphoric acids, and dialkanol alkyl phosphonic acids.

The polyurethane containing an allyl group and an acid group is preferably a polyurethane containing a carboxyl group and an allyl group. The polyurethane containing a carboxyl group and an allyl group may be obtained by reacting a diisocyanate with an excess amount of a mixture of a diol containing an allyl group and a diol containing a carboxyl group to give a polyurethane.

The mixing ratio of the diols in the mixture can be determined so that the allyl groups exist in the resulting polymer in the range of from 0.7 meq/g to 8.0 meq/g.

Examples of the usable diols having a carboxyl group include dihydroxy carboxilic acids obtained by reacting a diol with an acid anhydride, e.g., products obtained by reacting an acid anhydride such as dialkanol alkanoic acids such as 2,2-bis(hydroxymethyl) propionic acid (2,2-dimethylol propionic acid), 2,2-bis(2-hydroxyethyl) propionic acid, 2,2-bis(3-hydroxypropyl)propanoic acid, bis(hydroxymethyl)acetic acid, bis(4-hydroxyphenyl)acetic acid, 2,2-bis(3-hydroxypropyl)propanoic acid, bis(hydroxymethyl)acetic acid, bis(4-hydroxyphenyl)acetic acid, 2,2-bis(hydroxymethyl)butyric acid, 2,2-bis(hydroxymethyl)pentanoic acid, and tartaric acid (dihydroxysuccinic acid); dihydroxy benzoic acids such as 3,5-dihydroxy benzoic acid; pyromellitic acid anhydride; 3,3',4,4'-benzophenone tetracarboxylic acid anhydride, 3,3',4,4'-diphenyl tetracarboxylic acid anhydride; and 2,3,6, 7-naphthalene tetracarboxylic acid anhydride, with a diol such as ethylene glycol, diethylene glycol, triethylene glycol, polyethylene glycol, 1,2- or 1,3-propanediol, polypropylene glycol, 1,2- or 1,4-butanediol, neopentyl glycol, and 1,6-hexanediol.

Aromatic and/or aliphatic diisocyanates may be used as the isocyanate used in synthesis of polyurephane.

Examples of the aromatic diisocyanates include 2,4-toluene diisocyanate, 2,6-toluene diisocyanate, p-xylene diisocyanate, m-xylene diisocyanate, tetramethylxylene diisocyanate, 4,4-diphenylmethane diisocyanate, 1,5-naphthalene diisocyanate, and 3,3'-dimethylbiphenyl-4,4'-diisocyanate.

Examples of the aliphatic diisocyanates include hexamethylene diisocyanate, trimethylhexamethylene diisocyanate, isophorone diisocyanate, 4,4-methylene-bis(cyclohexylisocyanate), methylcyclohexane-2,4-diisocyanate, methylcyclohexane-2,6-diisocyanate, and 1,4-bis(isocyanatemethyl) cyclohexane.

In the invention, the aromatic diisocyanates are particularly preferably used.

The specific binder polymer (3) as described above has a weight average molecular weight as measured by gel permeation chromatography of from 5,000 to 100,000, preferably from 5,000 to 75,000, and more preferably from 5,000 to 50,000.

The molecule structure of the specific binder polymer (3) may be either linear or branched, and preferably has a polydispersity of from 1 to 5.

Further, the specific binder polymer (3) preferably has an acid value of from 0 to 70 mg KOH/g, and more preferably from 0 to 30 mg KOH/g.

In the invention, the total amount of the binder polymer in the photosensitive layer with respect to the total mass of the nonvolatile component may be appropriately determined in the range of from 10% to 90% by mass, preferably from 20% to 80% by mass, and further preferably from 30% to 70% by mass.

Further, the ratio of the polymerizable compound and the binder polymer (polymerizable compound/binder polymer) is preferably in the range of from 1/9 to 7/3 by mass.

(Other Components)

The photosensitive layer of the invention may contain, besides the aforementioned essential components, other components suitably used for the intended use and the production method, if necessary. In the following, such preferred additives will be described.

—Colorant—

A dye or pigment may be added to the photosensitive layer in the invention for coloring. Such coloring is effective to improve so-called plate-checking properties, such as visibility of images formed onto the printing plate after plate-making and applicability for an image densitometer. Typical examples of the colorants include pigments such as phthalocyanine pigments, azo pigments, carbon black and titanium oxide, and dyes such as ethyl violet, crystal violet, azo dyes, anthraquinone dyes and cyanine dyes. Among these, cationic dyes are preferable.

Further, a dye having a maximum absorption at a wavelength in the range of from 500 nm to 700 nm may also be used. Such dyes are described in paragraphs [0013] to [0017] of JP-A 2005-107389.

The addition amount of the dye or pigment as the colorant is preferably in the range of about 0.5% to about 5% by mass, with respect to the total amount of nonvolatile components in the photosensitive layer.

—Polymerization Inhibitor—

The photosensitive layer in the invention or a solution used for forming the photosensitive layer (photosensitive layer forming solution) preferably contains a small amount of a thermal polymerization inhibitor in order to inhibit undesired thermal polymerization of the polymerizable compound. Examples of the suitable thermal polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and a cerium (I) salt of N-nitrosophenylhydroxylamine.

The addition amount of the thermal polymerization inhibitor is preferably in the range of from about 0.01% to about 5% by mass, with respect to the total mass of the nonvolatile components contained in the photosensitive layer (or photosensitive layer forming solution).

In order to prevent oxygen from inhibiting polymerization, a higher fatty acid derivative such as behenic acid and behenic acid amide may also be added to the photosensitive layer forming solution, and dried so that the substance locally exist in the vicinity of the surface of the layer, if necessary. The addition amount of the higher fatty acid derivative is preferably in the range of from about 0.5% to about 10% by mass with respect to the mass of the nonvolatile components contained in the photosensitive layer (or photosensitive layer forming solution).

—Specific Carboxylic Acid Compound—

The photosensitive layer in the invention may contain a compound having a weight average molecular weight of 3,000 or less and at least one carboxylic acid group (hereinafter, referred to as specific carboxylic acid compound, sometimes). The specific carboxylic acid compound may be selected from compounds such as aliphatic carboxylic acids that may have a substitutent, aromatic carboxylic acids that may have a substituent, and carboxylic acids directly bonded to a heterocyclic ring that may have a substituent. Among these, derivatives of phthalic acid, trimellitic acid, pyromellitic acid, succinic acid, benzoic acid, glycine and the like are preferable.

In the invention, the weight average molecular weight of the specific carboxylic acid compound is 3,000 or less, preferably in the range of from 60 to 2,000, and more preferably in the range of from 100 to 1,500. When the weight average molecular weight is more than 3,000, the specific carboxylic acid compound may adsorb to the support.

The following are the specific examples of the specific carboxylic acid compounds (Nos. 1 to 20) preferably used in the invention, but the invention is not limited thereto.

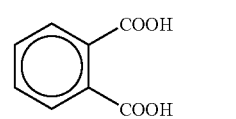

1

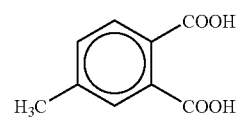

2

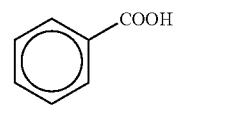

3

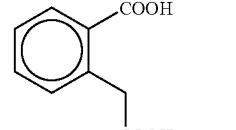

4

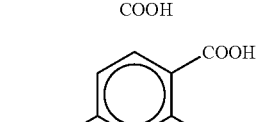

5

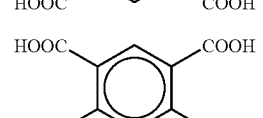

6

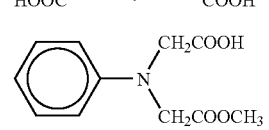

7

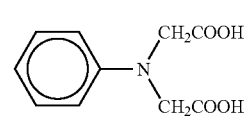

8

-continued

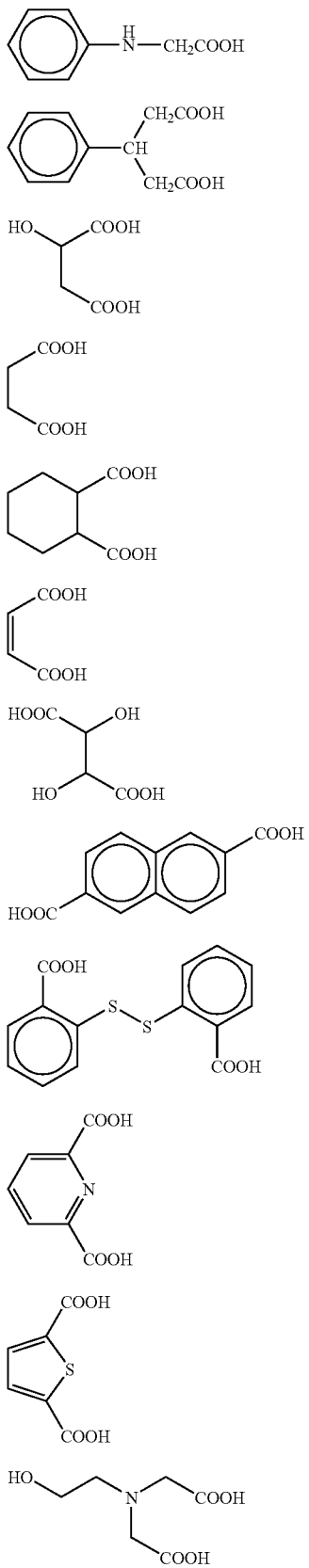

The content of the specific carboxylic acid compound is preferably in the range of from 0.5% to 30% by mass, and more preferably in the range of from 2% to 20% by mass, with respect to the total solid content of the photosensitive layer.

The specific carboxylic acid compound may be used alone or in combination or two or more.

—Other Additives—

Further, the photosensitive layer in the invention may contain known additives such as an inorganic filler to improve properties of the cured film layer, a plasticizer, or an oil sensitizer to improve compatibility with an ink applied onto the surface of the photosensitive layer.

Examples of the plasticizers include dioctylphthalate, didodecylphthalate, triethylene glycol dicaprylate, dimethylglycol phthalate, tricresylic phosphate, dioctyl adipate, dibutyl sebacate, and triacetyl glycerin.

These additives may be added to the photosensitive layer typically in an amount of 10% by mass or less, with respect to the total mass of the binder polymer and polymerizable compound.

Further, a UV initiator or a heat crosslinking agent may also be added to the photosensitive layer in the invention, in order to improve the later-described film strength (printing durability) by strengthening the effects of heating and exposure with light after development.

The polymerizable negative photosensitive layer in the invention can be formed by preparing a solution containing the aforementioned components dissolved in a suitable solvent (a photosensitive layer forming solution), and applying the solution onto the support, or onto an undercoating layer formed on the support (described later).

Examples of the solvents that can be used in the invention include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisoproplyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butylolactone, methyl lactate, and ethyl lactate.

These solvents may be used alone or in combination. The appropriate range of the solid content in the photosensitive layer forming solution is from 2% to 50% by mass.

In the invention, the coating amount of the photosensitive layer has an effect mainly on sensitivity and developability of the photosensitive layer, strength and printing durability of the exposed film. Therefore, the coating amount of the photosensitive layer is preferably determined as appropriate according to usage. When the coating amount is too small, sufficient printing durability may not be obtained. On the other hand, when the coating amount is too much, sensitivity of the photosensitive layer may be lowered to lengthen the time taken for exposure and development.

The appropriate range of coating amount of the photosensitive layer for a planographic printing plate precursor that can be subjected to scanning exposure is from about 0.1 g/m$^2$ to about 10 g/m$^2$, and more preferably from 0.5 g/m$^2$ to 5 g/m$^2$, in terms of mass after drying.

[Protective Layer]

The planographic printing plate precursor in the invention may have a protective layer on or above the photosensitive layer.

The protective layer does not substantially block transmission of light used for exposure, has an excellent adhesion property to the photosensitive layer, and is capable of easily removed in a development process after exposure. Various methods for improving the protective layer have been proposed and examples thereof are described in U.S. Pat. No. 3,458,311 and JP-A No. 55-49729. Such protective layers may also be applied to the planographic printing plate precursor in the invention.

Further, as mentioned above, the photosensitive recording layer of the planographic printing plate precursor in the invention is preferably a polymerizable negative photosensitive layer containing a sensityzing dye, a polymerization initiator, a polymerizable compound, and a binder polymer. Onto this polymerizable negative photosensitive layer is preferably provided a protective layer having an oxygen blocking property by which oxygen in the air is blocked to inhibit polymerization, at the time of exposure. On the other hand, from the viewpoints of storage stability and safelight compatibility, it is also preferable that the protective layer has oxygen permeability to such a degree that dark polymerization is inhibited, and more preferably has an oxygen transmission property of such a degree that both of the above functions can be satisfied.

(Water Soluble Polymer Compound)

The material used as a main component of the protective layer is preferably a water soluble polymer compound having a relatively favorable level of crystallinity, and examples thereof include polyvinylalcohol, polyvinylpyrrolidone, acidic celluloses, gelatin, gum arabic, and polyacrylic acids. These polymer compounds may be used alone or in combination of two or more.

Among these, polyvinylalcohol is the compound that gives most favorable outcomes to such basic properties as oxygen blocking and development removability.

The polyvinylalcohol used in the protective layer may be partly substituted by an ester, ether or acetal group, as long as the polymer contain an unsubstituted vinylalcohol unit that imparts the polymer a necessary oxygen blocking property and water solubility. Further, the polymer may also be a copolymer including other repeating unit(s) than polyvinylalcohol.

The aforementioned copolymer may be, for example, 88 to 100% hydrolyzed polyvinylacetate chloroacetate or propionate, polyvinylformal, polyvinyl acetal or copolymers thereof.

The polyvinylalcohol used in the invention preferably may have a saponification degree of from 71% to 100% by mol and a weight average molecular weight of from 200 to 2400. From the viewpoint of obtaining a favorable oxygen blocking property, film forming property, and a surface with a low degree of adhesion, it is preferable to use a polyvinylalcohol having a saponification degree of 91% or more by mol.

Polyvinylalcohols available as commercial products may also be used and specific examples thereof include PVA-102, PVA-103, PVA-104, PVA-105, PVA-110, PVA-117, PVA-117H, PVA-120, PVA-124, PVA-124H, PVA-135H, PVA-HC, PVA-617, PVA-624, PVA-706, PVA-613, PVA-CS, PVA-CST, PVA-203, PVA-204, PVA-205, PVA-210, PVA-217, PVA-220, PVA-224, PVA-217EE, PVA-217E, PVA-220E, PVA-224E, PVA-405, PVA-420 and L-8 (manufactured by KURARAY CO., LTD); GOSENOL NL-05, NM-11, NM-14, AL-06, P-610, C-500, A-300 and AH-17 (manufactured by NIPPON SYNTHETIC CHEMICAL INDUSTRY CO., LTD); and JF-04, JF-05, JF-10, JF-17, JF-17L, JM-05, JM-10, JM-17, JM-17L, JT-05, JT-13 and JT-15 (manufactured by JAPAN VAM & POVAL CO., LTD).

Further, acid-modified polyvinylalcohols may also be preferably used. Specific examples thereof include carboxy-modified polyvinylalcohols that are modified by itaconic acid, maleic acid and the like, and sulfonic acid-modified polyvinylalcohols. These acid-modified polyvinylalcohols also preferably have a saponification degree of 91% by mol or more.

Specific examples of the acid-modified polyvinylalcohols include KL-118, KM-618, KM-118, SK-5102, MP-102 and R-2105 (manufactured by KURARAY CO., LTD); GOSENAL CKS-50, T-HS-1, T-215, T-350, T-330 and T-330H (manufactured by NIPPON SYNTHETIC CHEMICAL INDUSTRY CO., LTD); and AF-17 and AT-17 (manufactured by JAPAN VAM & POVAL CO., LTD).

The water soluble polymer compounds in the invention is preferably contained in the protective layer in an amount of from 45% to 95% by mass, more preferably from 50% to 90% by mass with respect to the total solid content of the protective layer, from the viewpoints of sensitivity of the planographic printing plate precursor and suppressing the adhesion of planographic printing plate precursors to each other when stacked, and the like.

The water soluble polymer compound may be contained, in the protective layer, alone or in combination of two or more. In a case where two or more types of the water soluble polymer compounds are used together, the total amount thereof (% by mass) is also preferably in the aforementioned range.

On the other hand, in the protective layer, properties such as adhesiveness to the image region of the photosensitive layer (polymerizable negative type) and uniformity of the film are also very important, in terms of handleability of planographic printing plate precursors. Specifically, when a hydrophilic layer of a water soluble polymer compound is formed on a lipophilic photosensitive layer, the layers tend to be peeled from each other due to an insufficient level of adhesion, and the peeled portion may cause such defects as insufficient film curing due to the action of oxygen to inhibit polymerization.

In order to overcome the above problem, various methods to improve the adhesion of the two layers have been proposed. For example, U.S. Pat. Nos. 4,072,527 and 4,072,528 disclose that sufficient adhesion can be obtained by preparing a solution containing 20 to 60% by mass of an acrylic emulsion, water-insoluble vinyl pyrrolidone-vinyl acetate copolymer and the like, in a hydrophilic polymer mainly composed of polyvinylalcohol, and then applying the solution onto the recording layer. These known methods may be applied in the invention.

In the invention, polyvinylalcohol and polyvinylpyrrolidone may be used in combination from the viewpoints of adhesion to the photosensitive layer (polymerizable negative type), sensitivity, and prevention of undesired fogging. In this case, the addition amount ratio of the polyvinylalcohol having a saponification of 91% or more by mol/polyvinylpyrrolidone is preferably 3/1 or less. Other than polyvinylpyrrolidone, compounds having relatively good crystallinity such as acidic celluloses, gelatin, gum arabic, polyacrylic acids and copolymers thereof may also be used together with the polyvinylalcohol.

—Filler—

The protective layer in the invention preferably contains a filler, in addition to the aforementioned water soluble polymer compound. By containing the filler, scratch resistance of the surface of the photosensitive recording layer (polymerizable negative type) may be improved, and further, adhesion of planographic printing plate precursors in contact with each other can be prevented, when stacked without inserting a slip sheet, thereby giving excellent releasability of the planographic printing plate precursors from each other, and also improving handleability thereof.

Examples of such fillers include organic fillers, inorganic fillers and inorganic-organic composite fillers, which may be used alone or in combination of two or more. A combination of inorganic and organic fillers is preferably used as the filler.

The shape of the filler is appropriately selected according to usage, and examples thereof include fibers, needles, plates, spheres, particles (the term "particles" refers to "particles in an amorphous form", hereinafter the same), tetrapods and balloons. Among these, fillers in the shape of plates, spheres and particles are preferably used in the invention.

Examples of the organic fillers include synthetic resin particles and natural polymer particles. Preferable examples thereof include resin particles of an acrylic resin, polyethylene, polypropylene, polyethyleneoxide, polyethyleneimine, polystyrene, polyurethane, polyurea, polyester, polyamide, polyimide, carboxymethylcellulose, gelatin, starch, chitin, and chitosan. Among these, resin particles of an acrylic resin, polyethylene, polypropylene, polystyrene and the like are most preferable.

The organic fillers available as commercial products may also be used in the invention.

Specific examples of the commercially available organic fillers suitably added to the protective layer include CHEMIPEARL W100, W200, W300, W308, W310, W400, W401, W4005, W410, W500, WF640, W700, W800, W900, W950 and WP100 (manufactured by MITSUI CHEMICALS, INC.); MX-150, MX-180, MX-300, MX-500, MX-1000, MX-1500H, MX-2000, MR-2HG, MR-7HG, MR-10HG, MR-3GSN, MR-5GSN, MR-2G, MR-7G, MR-10G, MR-20G, MR-5C, MR-7GC, SX-130H, SX-350H, SX-500H, SGP-50C and SGP-70C (manufactured by SOKEN CHEMICAL & ENGINEERING CO., LTD.); and MBX-5, MBX-8, MBX-12, MBX-15, MBX-20, MB20X-5, MB30X-5, MB30X-8, MB30X-20, SBX-6, SBX-8, SBX-12 and SBX-17 (manufactured by SEKISUI PLASTICS CO., LTD.).

The particle size distribution of the filler may be either monodisperse or polydisperse, but is preferably monodisperse. The average particle diameter of the filler is preferably in the range of from 1 to 20 µm, more preferably from 2 to 15 µm, and further preferably from 3 to 10 µm. When the average particle diameter is within the above range, the aforementioned effects of the invention can be more effectively achieved.

The content of the organic filler with respect to the total solid content in the protective layer is preferably in the range of from 0.1% to 20% by mass, more preferably from 1% to 15% by mass, and further preferably from 2% to 10% by mass.

Examples of the inorganic fillers include metals or metallic compounds (for example, oxides, composite oxides, hydroxides, carbonates, sulfates, silicates, phosphates, nitrides, carbides, sulfides, and composite compounds of two or more thereof). Specific examples thereof include mica, glass, zinc oxide, alumina, zirconia, tin oxide, potassium titanate, strontium titanate, aluminum borate, magnesium oxide, magnesium borate, aluminum hydroxide, magnesium hydroxide, calcium hydroxide, titanium hydroxide, basic magnesium sulfate, calcium carbonate, magnesium carbonate, calcium sulfate, magnesium sulfate, calcium silicate, magnesium silicate, calcium phosphate, silicon nitride, titanium nitride, aluminum nitride, silicon carbide, titanium carbide, zinc sulfide, and composite compounds of two or more thereof.

Preferable examples of the inorganic fillers include mica, glass, alumina, potassium titanate, strontium titanate, aluminum borate, magnesium oxide, calcium carbonate, magnesium carbonate, calcium silicate, magnesium silicate, calcium phosphate, and calcium sulfate.

Among these, inorganic lamellar compounds as represented by mica are the inorganic fillers particularly preferably used in the invention.

By containing an inorganic lamellar compound in the protective layer, an oxygen blocking property and strength of the layer may be further improved to give enhanced scratch resistance, as well as imparting matte properties to the layer. Consequently, the protective layer becomes capable of suppressing degradation thereof caused by deformation or scratches, as well as blocking oxygen and the like. Further, by imparting the matte property to the protective layer, adhesion of the top surface of a planographic printing plate precursor to a back surface of another planographic printing plate precursor, which is in contact with the aforementioned top surface, can be suppressed.

Examples of the inorganic lamellar compounds include natural micas and synthetic micas represented by the formula: $A(B,C)_2\text{-}5D_4O_{10}(OH,F,O)_2$ (in the formula, A represents K, Na or Ca; B and C each independently represent Fe(II), Fe(III), Mn, Al, Mg or V; and D represents Si or Al).

Specific examples of natural micas include white mica, paragonite, bronze mica, black mica and lipidolite; and specific examples of synthetic micas include non-swelling micas such as fluorophlogopite $KMg_3(AlSi_3O_{10})F_2$, potassium tetrasililic mica $KM_{2.5}(Si_4P_{10})F_2$, and swelling micas such as Na tetrasililic mica $NaMg_{2.5}(Si_4O_{10})F_2$, Na or Li taeniolite (Na, Li)$Mg_2Li(Si_4O_{10})F_2$, montmorillonite-type Na or Li hectolite $(Na, Li)_{1/8}Mg_{2/5}Li_{1/8}(Si_4O_{10})F_2$. Further, synthetic smectites are also usable.

Among the micas, fluorinated swelling micas are particularly usable. Specifically, these swelling synthetic micas have a significantly high degree of interlattice metal atom substitution, as compared with other clay minerals, due to a layered structure thereof consisting of unit crystal lattice layers of about 1-1.5 nm thick. As a result, cations such as $Na^+$, $Ca^{2+}$ and $Mg^{2+}$ are adsorbed to the lattice layer to compensate the shortage of positive charge in the lattice layer. The cations existing between these layers are called exchangeable cations and are exchanged by various cations. In particular, when the cations existing between the layers is $Li^+$ or $Ma^+$, the mica tends to swell by water to a greater degree, since the bond between the crystal lattice layers is relatively weak due to the smaller ion diameters of such cations. Consequently, the mica readily cleaves when applied a shear, and thereby forming a stable sol in water. Such a tendency is particularly strong in the swelling synthetic micas. Therefore, the swelling synthetic micas are particularly preferably used in the invention.

The thickness of the mica is preferably as thin as possible and the plane size thereof is preferably as large as possible, so far as the mica does not impairs smoothness and actinic light permeability of the applied surface, from the viewpoint of controlling dispersion. Accordingly, the aspect ratio of the mica is 20 or more, preferably 100 or more, and particularly preferably 200 or more. The aspect ratio refers to a ratio of the major axis of a particle with respect to the thickness thereof (major axis/thickness), which can be determined, for example, by a micrographic projected image of a mica particle. The larger the aspect ratio is, the greater the effect will be obtained.

The average major axis of the mica particle is from 0.3 to 20 µm, preferably from 0.5 to 10 µm, and particularly preferably from 1 to 5 µm. The average thickness of the mica particle is 0.1 µm or less, preferably 0.05 µm or less, and particularly preferably 0.01 µm or less. Specifically, for example, a swelling synthetic mica particle as a typical compound has a size of from about 1 to about 50 nm in thickness, and from about 1 to about 20 µm in plane size (major axis).

When an inorganic lamellar compound is used as a filler, the amount of the inorganic lamellar compound contained in the protective layer is preferably in the range of from 5 to 50% by mass, and particularly preferably from 10 to 40% by mass, with respect to the total solid content of the protective layer, from the viewpoints of suppressing adhesion of stacked planographic printing plate precursors, preventing scratches, preventing lowering of sensitivity due to laser blocking upon exposure, and a low degree of oxygen transmission. In a case where two or more inorganic lamellar compounds are used together, the total amount thereof is preferably in the above range.

When an inorganic filler other than the inorganic lamellar compound is contained together, the total amount of the inorganic filler and the inorganic lamellar compound is preferably in the range of from 5 to 50% by mass, and particularly preferably from 10 to 40% by mass, as is the case with the above.

It is also preferable that an organic filler and an inorganic filler are used in combination in the protective layer, and the combination ratio thereof (organic filler:inorganic filler) is preferably in the range of from 1:1 to 1:5. In this case, the content of the total amount of the organic and inorganic fillers in the protective layer is preferably in the range of from 5 to 50% by mass, and more preferably in the range of from 10 to 40% by mass, with respect to the total solid content of the protective layer.

An inorganic-organic composite filler may also be used in the protective layer. Examples of the inorganic-organic composite filler include composite compounds of organic filler and an inorganic filler, where the inorganic filler used in the composite may be particles of metal powder, metallic compounds (for example, oxides, nitrides, sulfides, carbides and composite compounds thereof), and the like. Among these, oxides and sulfides are preferable, and particularly preferred are particles of glass, $SiO_2$, ZnO, $Fe_2O_3$, $ZrO_2$, $SnO_2$, ZnS, CuS and the like.

The content of such organic-inorganic composite fillers are, as is the case above, preferably in the range of from 5 to 50% by mass, and more preferably in the range of from 10 to 40% by mass, with respect to the total solid content of the protective layer.

The inorganic-organic composite filler used in the invention preferably contains a silica component, particularly preferably in the form of silica-coated microparticles having at least a part of the surface coated with a silica layer.

When the filler has silica on at least a part of the surface thereof, compatibility of the filler with a binder (such as polyvinylalcohol) can be improved, coming off of the filler upon application of an external stress to the protective layer can be suppressed, and favorable scratch resistance and adhesion resistance can be maintained. In the invention, the term "silica-coated" includes such a situation that silica exist on at least a part of the surface of the filler, as mentioned above.

As an organic resin that constitutes the inorganic-organic composite filler as a core of silica-coated microparticles, any organic resins can be used as long as they have the properties required for a filler as mentioned above, and specific examples thereof include polyacrylic resins, polyurethane resins, polystyrene resins, polyester resins, epoxy resins, phenol resins, melamine resins, and silicone resins.

Among these, polyacrylic resins, polyurethane resins and melamine resins are preferable from the viewpoint of compatibility with polyvinylalcohol that serves as a preferable binder resin of the protective layer.

As the materials that form a silica layer coating the surface of a filler, preferable examples thereof include compounds having an alkoxysilyl group, such as condensates of alkoxysiloxane compounds, and particularly preferably siloxane materials used in a sol-gel method, silica sol, colloidal silica, and silica particles such as silica nanoparticles.

The structure of the silica-coated microparticles may be such that silica particles are attached to the surface of the filler as a solid component, or that a layer of siloxane compound is formed on the surface of a filler by condensation reaction of an alkoxysiloxane compound.

The surface of the filler is not necessarily coated entirely with silica, and the aforementioned effects can be achieved when the amount of the silica coating the filler is 0.5% by mass or more with respect to that of the filler.

The conditions of the surface coated with silica can be observed by a scanning electron microscope (SEM) and the like. The coating amount of silica can be determined by detecting Si atoms by elemental analysis such as fluorescence X-ray spectroscopy, and then calculating the amount of the silica existing there.

The production method of silica-coated microparticles is not particularly limited, and may be a method of forming a silica coating layer at the same time as forming a filler, by allowing silica particles or a silica derivative compound to coexist with a monomer component as a raw material for resin particles. Alternatively, the silica-coated microparticles may be produced by forming a filler, then physically attaching silica particles onto the surface of the filler, and thereafter fixing the silica particles on the surface of the filler.

The following is an example of the production method of silica-coated microparticles:

(i) Adding silica and a raw material resin (more specifically a raw material resin that constitute the aforementioned organic resin, such as a monomer capable of suspension polymerization, a prepolymer capable of suspension crosslinking, and a resin liquid) into water containing a suspension stabilizer (that can be selected from water-soluble polymers such as polyvinylalcohol, methyl cellulose and polyacrylic acid, and inorganic suspending agents such as calcium phosphate and calcium carbonate), then stirring the mixture to prepare a suspension in which silica and a hydrophobic raw resin are suspended. At this time, an emulsion (suspension) containing particles having a desired diameter can be prepared by appropriately regulating the type of the suspension stabilizer, concentration thereof, or number of times of stirring.

(ii) After the above processes, the suspension is heated to start reaction to form resin particles by suspension polymerization or suspension crosslinking of the raw material resin. At this time, the coexisting silica is fixed onto the resin particles, which are capable of curing by polymerization or crosslinking reaction, particularly concentrating in the vicinity of the surface of the resin particles due to the physical characteristics thereof. Thereafter, the suspension is subjected to solid-liquid separation and the resulting particles are washed to remove the suspension stabilizer attaching to the particles, then dried. In this way, organic resin particles having silica fixed thereon and having an almost spherical shape of desired diameter can be obtained.

As mentioned above, resin particles having a desired diameter can be obtained by regulating conditions at the time of conducting suspension polymerization or suspension crosslinking. However, such silica-coated microparticles may also be obtained without regulating the conditions so strictly as mentioned above, by performing a mesh filtration after forming a silica-attached inorganic-organic composite filler.

As for the addition amounts of raw materials in a mixture when silica-coated microparticles are produced in accordance with the above method, the process can be carried out as indicated below.

Specifically, when the total amount of the raw material resin and silica is 100 parts by mass, 0.1 to 20 parts mass of a suspension stabilizer is added to 200 to 800 parts by mass of water as a dispersing medium, adequately dissolved and dispersed in the water. Into the dispersion, the aforementioned 100 parts by mass of a mixture of raw material resin and silica is added and stirred, while regulating the stirring speed to obtain the desired particles sizes of the dispersed particles, and then elevating the temperature of the dispersion to 30 to 90° C., and allowing the dispersion to react for 1 to 8 hours.

The aforementioned method is an example of production methods of silica-coated microparticles, and other usable methods are described in JP-A Nos. 2002-327036, 2002-173410, 2004-307837, 2006-38246 and the like. The silica-coated microparticles obtained by these methods are also preferably used in the invention.

Further, the silica-coated microparticles usable for the invention are also available as commercial products, and examples thereof include silica/melamine composite particles under the trade names of OPTBEADS 2000M, OPTBEADS 3500M, OPTBEADS 6500M, OPTBEADS 10500M, OPTBEADS 3500S, and OPTBEADS 6500S (manufactured by NISSAN CHEMICAL INDUSTRIES, LTD.); silica/acrylic composite particles under the trade names of ART PEARL G-200, ART PEARL G-400 TRANSPARENT, ART PEARL G-800 TRANSPARENT, ART PEARL GR-400 TRANSPARENT, ART PEARL GR-600 TRANSPARENT, ART PEARL GR-800 TRANSPARENT, and ART PEARL J-7P (manufactured by NEGAMI CHEMICAL INDUSTRIAL CO., LTD.); silica/urethane composite particles under the trade names of ART PEARL C-400 TRANSPARENT, C-800 TRANSPARENT, P-800T, U-600T, U-800T, CF-600T, CF-800T (manufactured by NEGAMI CHEMICAL INDUSTRIAL CO., LTD.), DIMIC-BEADS CN5070D and DANPLACOAT THU (manufactured by DAINICHISEIKA COLOR & CHEMICALS MFGCO., LTD.)

The hardness of the silica-coated microparticles as determined by an atomic force microscope under the trade name of MULTIMODE AFM (manufactured by VEECO INSTRUMENTS, INC.) interfacing with a nanomechanical test instrument under the trade name of TRIBOSCOPE (manufactured by HYSITRON, INC.) is preferably in the range of from 0.0005 to 0.20 GPa, more preferably from 0.001 to 0.15 GPa, and most preferably from 0.003 to 0.010 GPa. The hardness of the silica-coated nanoparticles can be appropriately regulated by selecting the material thereof or regulating coating amount of the silica layer.

When the protective layer in the invention has a layered structure and the silica-coated microparticles are contained in the upper protective layer, the hardness of the silica-coated microparticles is preferably the same as, or lower than, the hardness of the lower protective layer.

The shape of the silica-coated microparticles may be spherical, planar or oval, although preferably spherical.

The average particle diameter of the silica-coated microparticles is preferably in the range of from 1 to 30 μmϕ, more preferably in the range of from 1.5 to 20 μmϕ, and still more preferably in the range of from 2 to 15 μmϕ. When the average particle diameter of the silica-coated microparticles is in the above range, sufficient functions as a spacer and matting property can be achieved, fixation onto the surface of the protective layer can be facilitated, and excellent retaining property against an external contact stress can be achieved.

The silica-coated microparticles particularly preferably has an absolute specific gravity of from 0.90 to 1.30 together with an average particle diameter of from 2.0 to 15 μm, and further preferably has an absolute specific gravity of from 0.90 to 1.20 together with an average particle diameter of from 3.0 to 12 μm.

The addition amount of the silica-coated microparticles to the protective layer is preferably in the range of from 5 to 1000 mg/m$^2$, more preferably in the range of from 10 to 500 mg/m$^2$, and further preferably in the range of from 20 to 200 mg/m$^2$.

More specifically, the content of the silica-coated microparticles in the solid content of the protective layer is preferably in the range of from 1.0% by mass to 20% by mass, and more preferably in the range of from 2.0% by mass to 10% by mass, from the viewpoint of achieving a surface matting effect and sensitivity, and preventing coming off of the particles from the surface of the protective layer.

The component of the protective layer (such as polyvinylalcohol, inorganic lamellar compounds and additives) or the application amount of the protective layer can be selected in consideration of an oxygen blocking property, developer removability, fogging, adhesiveness, scratch resistance and the like.

In the invention, the structure of the protective layer is not limited to a single layer and may be a layered structure of plural protective layers that may have different compositions from each other. One of the preferable embodiments of the protective layers of a layered structure is that a protective layer containing an inorganic lamellar compound is in contact with a recording layer as a lower protective layer, and onto which a protective layer containing an inorganic laminated compound and an organic filler is further provided as an upper protective layer.

The protective layer having such a layered structure can sufficiently harness both of the scratch resistance and adhesion resistance due to the filler in the uppermost protective layer, and an excellent oxygen blocking property due to the underlying protective layer, and thereby effectively preventing image defects caused by scratches or undesired oxygen transmission.

The protective layer in the invention preferably has an oxygen transmission at 25° C. and 1 atm of from 0.5 ml/m$^2$ per day to 100 ml/m$^2$ per day, and the application amount for the protective layer is preferably regulated so as to satisfy the above range of the oxygen transmission.

The protective layer may further contain a colorant (water soluble dye) that has a high degree of transmission of the light used for exposure of the recording layer, and is capable of efficiently absorbing light at a wavelength irrelevant to exposure. By containing such a colorant, safe light properties of the protective layer can be improved without lowering the sensitivity thereof.

(Formation of Protective Layer)

The process of forming the protective layer is not particularly limited and can be carried out by applying a coating solution for forming a protective layer containing the aforementioned components (protective layer forming solution) onto the photosensitive recording layer (polymerizable negative type). For example, methods disclosed in U.S. Pat. No. 3,458,311 and JP-A No. 55-49729 can be employed in the invention.

The following is an exemplary method of forming a protective layer containing an inorganic lamellar compound such as mica and a water soluble polymer compound such as polyvinylalcohol.

Specifically, the protective layer is formed by applying, onto the photosensitive recording layer (polymerizable negative type), a protective layer forming solution prepared by mixing a dispersion in which the aforementioned inorganic lamellar compound such as mica is dispersed and the aforementioned water soluble polymer compound such as polyvinylalcohol.

The following is an exemplary method of dispersing an inorganic lamellar compound such as mica used in the protective layer.

First, 5 to 10 parts by mass of a swelling-type mica (the mica of preferable type as mentioned above) is added to 100 parts by mass of water, sufficiently soaked in water to swell, then dispersed in water by a dispersor. The dispersor used here may be various types of mills that carry out the dispersion by mechanically and directly applying force; high-speed agitating dispersors having a high degree of sheering force; and dispersors that apply a high degree of ultrasonic energy. Specific examples thereof include a ball mill, sand grinder mill, visco mill, colloid mill, homogenizer, dissolver, polytron, homomixer, homoglender, Keddy mill, jet agitator, capillary emulsifier, and emulsifiers equipped with a liquid siren, electromagnetic strain-type ultrasonic generator, or Poleman whistle.

The dispersion in which 2 to 15% by mass of mica is dispersed by the aforementioned method generally has a high degree of viscosity or in a gel state, and has an extremely high level of storage stability. This dispersion is preferably diluted by water and adequately agitated, prior to combining with the water soluble polymer compound such as polyvimylalcohol (or an aqueous solution thereof) to prepare the coating solution.

The protective layer forming solution may contain known additives such as a surfactant to improve application properties or a water soluble plasticizer to improve the properties of resulting film layer.

Examples of the water soluble plasticizer include propionamide, cyclohexanediol, glycerin and sorbitol. Water soluble (meth)acrylic polymers may also be added.

Further, other known additives for improvement in adhesion to a recording layer and temporal stability of the coating solution may also be added.

The application amount of the protective layer is preferably in the range of from $0.1 \text{ g/m}^2$ to $4.0 \text{ g/m}^2$, and more preferably in the range of from $0.3 \text{ g/m}^2$ to $3.0 \text{ g/m}^2$, from the viewpoints of obtaining an adequate level of oxygen transmission to provide the protective layer with film strength, scratch resistance, maintenance of image quality, and safe light properties.

The process of forming a protective layer having a layered structure is also not particularly limited, and may be carried out by applying solutions to form the layers at the same time or in sequence. The coating amount for a lower protective layer containing an inorganic lamellar compound in a dried state is preferably in the range of from $0.1 \text{ g/m}^2$ to $1.5 \text{ g/m}^2$, and more preferably in the range of from $0.2 \text{ g/m}^2$ to $1.0 \text{ g/m}^2$. The coating amount for an upper protective layer containing an inorganic lamellar compound and an organic filler is preferably in the range of from $0.1 \text{ g/m}^2$ to $4.0 \text{ g/m}^2$, and more preferably in the range of from $0.2 \text{ g/m}^2$ to $3.0 \text{ g/m}^2$. The ratio of both (lower protective layer:upper protective layer) is preferably in the range of from 1:1 to 1:5.

[Support]

The support used in the invention is preferably a sheet of paper, a polyester film, or an aluminum plate. Among these, most preferred is an aluminum plate which is dimensionally stable and relatively cost efficient, and the surface thereof can be modified to have favorable hydrophilicity and strength by a surface treatment as needed. In addition, composite sheets composed of an aluminum sheet laminated onto a polyethylene terephthalate film, such as those disclosed in JP-B No. 48-18327, are also preferable.

The aluminum plate that can serve as a particularly preferable support in the invention is a metal plate containing dimensionally stable aluminum as a main component, and examples thereof include a pure aluminum plate, an alloy plate containing aluminum as a main component and a trace amount of element(s) other than aluminum, and a sheet of plastic or paper onto which aluminum or an aluminum alloy is laminated or vapor-deposited. In the following, the aforementioned supports made of aluminum or aluminum alloy are collectively referred to as an aluminum support. Examples of the elements other than aluminum that may be contained in the aluminum alloy include silicon, iron, manganese, copper, magnesium, chromium, zinc, bismuth, nickel and titanium. The content of such element(s) in the alloy is 10% by mass or less. Although the support in the invention is most preferably a pure aluminum support, the aluminum plate in the invention may contain a trace amount of elements other than aluminum, since it is difficult to produce completely pure aluminum because of problems accompanying a purifying process. As described above, the composition of the aluminum plate used in the invention is not particularly limited, and any aluminum plates which are known and used in the art, for example, those satisfying the standards stipulated in JIS A1050, A1100, A3103, or A3005, may be appropriately used.

The thickness of the aluminum support for use in the invention is preferably from about 0.1 mm to about 0.6 mm. The thickness may be suitably changed according to the size of a printing machine, size of a printing plate, needs of users, and the like. The surface of the aluminum support used in the invention may be subjected to a treatment described hereinafter for imparting hydrophilicity, if necessary.

(Surface Roughening Treatment)

The surface of the aluminum support may be subjected to a roughening treatment. Examples of the methods of surface roughening include mechanical surface roughening, chemical etching, and electrolytic graining disclosed in JP-A No. 56-28893. Further, there are also an electrochemical surface roughening method of performing electrochemical roughening in a hydrochloric acid or nitric acid electrolyte; and mechanical surface roughening methods such as a wire brush graining method of scratching an aluminum surface with a metal wire, a ball graining method of roughening an aluminum surface with a polishing ball and an abrasive, and a brush graining method of roughening a surface with a nylon brush and an abrasive. These methods can be conducted singly or in combination of two or more. Among these, particularly preferred surface roughening method is the electrochemical method in which the surface is chemically roughened in a hydrochloric or nitric acid electrolyte. In this electrochemical method, the suitable amount of electric current is in the range of from 50 C/dm$^2$ to 400 C/dm$^2$, when the support serves as an anode. More specifically, alternate and/or direct current electrolysis is preferably carried out in an electrolyte with a hydrochloric or nitric acid content of 0.1% to 50%, at a temperature of 20° C. to 80° C., and at an electric current density of from 100 C/dm$^2$ to 400 C/dm$^2$ for one second to 30 minutes.

The aluminum support whose surface has been roughened may be chemically etched with an acid or alkali solution. Typical examples of the etching agents include sodium hydroxide, sodium carbonate, sodium aluminate, sodium metasilicate, sodium phosphate, potassium hydroxide and lithium hydroxide. The concentration and the temperature of the etching agent are preferably from 1% to 50% and from 20° C. to 100° C., respectively. The support is washed with an acid to remove stains (smuts) remaining on the etched surface, after etching. Typical examples of the acids used for the washing include nitric acid, sulfuric acid, phosphoric acid, chromic acid, hydrofluoric acid and borofluoric acid. Preferable examples of the method for removing smuts from the electrochemically roughened surface are described in JP-A No. 53-12739, where the surface is brought into contact with 15% to 65% by mass of sulfuric acid at a temperature of 50° C. to 90° C., and a method described in JP-B 48-28123 where the surface is etched with an alkali. The methods and conditions of the treatment are not particularly limited, as long as the surface roughness (Ra) of the surface after the treatment is from about 0.2 μm to about 0.5 μm.

(Anodizing Treatment)

The aluminum support which has been subjected to the aforementioned treatment to form an oxide layer is then subjected to an anodizing treatment.

In the anodizing treatment, one or more aqueous solutions of sulfuric acid, phosphoric acid, oxalic acid, and boric acid/sodium borate are used as the main component of an electrolytic solution. The electrolyte solution may contain other components, i.e., at least those commonly found in aluminum alloy plates, electrodes, tap water, and underground water. The electrolyte solution may also contain a second component, and further a third component. Examples of the second and third components include cations including metal ions such as Na, K, Mg, Li, Ca, Ti, Al, V, Cr, Mn, Fe, Co, Ni, Cu and Zn, and an ammonium ion; and anions such as nitrate, carbonate, chloride, phosphate, fluoride, sulfite, titanate, silicate, and borate ions. The second and third components may be contained in an amount of from 0 to about 10,000 ppm. Although the conditions for the anodizing treatment are not particularly limited, the treatment is preferably performed by direct or alternating current electrolysis under such conditions of 30 to 500 g/liter; the temperature of the electrolyte solution of 10° C. to 70° C.; and the electric current density of 0.1 A/m$^2$ to 40 A/m$^2$. The thickness of the resultant anodic oxidation film is in the range of from 0.5 μm to 1.5 μm, and preferably in the range of from 0.5 μm to 1.0 μm. The conditions for the above treatment are preferably regulated such that the anodic oxidation film formed on the support has micropores having pore sizes of from 5 nm to 10 nm, and a pore density of from $8\times10^{15}$ pores/m to $2\times10^{16}$ pores/m$^2$.

A treatment for imparting hydrophilicity to the surface of the support may be carried out by any known methods. Among these, hydrophilicity imparting treatments with silicate or polyvinylphosphonic acid are particularly preferably conducted. The resulting film contains 2 mg/m$^2$ to 40 mg/m$^2$ of silicon or phosphorus, and preferably from 4 mg/m$^2$ to 30 mg/m$^2$, in terms of element amount. The coating amount of the film can be measured by fluorescent X-ray spectroscopy.

The hydrophilicity imparting treatment as mentioned above may be performed, for example, by immersing the aluminum support having an anodic oxidation film in an aqueous solution containing from 1% to 30% by mass, and preferably from 2% to 15% by mass of an alkali metal silicate or polyvinylphosphonic acid, and having a pH at 25° C. of from 10 to 13, at a temperature of from 15° C. to 80° C. for 0.5 to 120 seconds.

The alkali metal silicate used for the above hydrophilizing treatment may be, for example, sodium silicate, potassium silicate and lithium silicate. Hydroxides, which are used to heighten the pH of the alkali metal silicate salt solution, may be sodium hydroxide, potassium hydroxide or lithium hydroxide. An alkaline earth metal salt or a salt of Group IVB metal may be added to the above solution. Examples of the alkaline earth metal salts include water-soluble salts, e.g., nitrates such as calcium nitrate, strontium nitrate, magnesium nitrate and barium nitrate, sulfates, hydrochlorides, phosphates, acetates, oxalates, and borates. Examples of the salts of Group IVB metal include titanium tetrachloride, titanium trichloride, titanium potassium fluoride, titanium potassium oxalate, titanium sulfate, titanium tetraidodide, zirconium oxychloride, zirconium dioxide, and zirconium tetrachloride.

The alkaline earth metal salt or the salt of a Group IVB metal may be used alone or in combination of two or more. The content of the metal salt is preferably from 0.01% to 10% by mass, and more preferably from 0.05% to 5.0% by mass. Further, silicate electrodeposition described in U.S. Pat. No. 3,658,662 is also effective. Also usable are the surface treatments in which the aforementioned anodizing treatment and the hydrophilicity imparting treatment are performed to a support that has been subjected to an electrolytical graining process, such as those disclosed in JP-B No. 46-27481, JP-A Nos. 52-58602 and 52-30503.

[Intermediate Layer (Undercoat layer)]

The planographic printing plate precursor of the invention may have an intermediate layer (also referred to as an undercoat layer) for the purpose of improving adhesiveness between the photosensitive layer and the support and stain resistance of the precursor. Specific examples of such intermediate layers include those described in JP-B No. 50-7481, JP-A Nos. 54-72104, 59-101651, 60-149491, 60-232998, 3-56177, 4-282637, 5-16558, 5-246171, 7-159983, 7-314937, 8-202025, 8-320551, 9-34104, 9-236911, 9-269593, 10-69092, 10-115931, 10-161317, 10-260536, 10-282682, 11-84674, 11-38635, 11-38629, 10-282645, 10-301262, 11-24277, 11-109641, 10-319600, 11-84674, 11-327152, 2000-10292, 2000-235254, 2000-352854, and 2001-209170; and Japanese Patent Application No. 11-284091.

<Plate Making Method>

Hereinafter, the method of making the planographic printing plate according to the invention will be described in detail.

The plate-making method according to the invention includes processes of preparing a stack of plural planographic printing plate precursors stacked in such a manner that the outermost layers of the recording side of at least one precursor is in contact with the outermost layer of the backcoat layer side of another precursor; setting the stack in a plate setter; automatically conveying the planographic printing plate precursors from the stack in a one-by-one manner; exposing each precursor with light; and developing each precursor.

According to the invention, adhesion between the precursors and scratches on the protective layer thereof can be prevented, even when stacked without interleaving slip sheets between the precursors, and therefore the plate making method as mentioned above can be employed. Further, the productivity of the plate making process can be improved, since there is no process for removing slip sheets from the precursors.

When the planographic printing plate precursor according to the invention has a structure in which a photosensitive layer is polymerizable negative type containing an infrared absorbent as a sensitizing dye and is formed onto a protective layer, the plate making process can be carried by placing, in a plate setter, the stack of plural precursors in which the protective layer and the backcoat layer of the precursors are in direct contact with each other, automatically conveying the planographic printing plate precursors in a one-by-one manner; exposing the precursors with light at a wavelength of from 750 nm to 1,400 nm; and developing the precursors at a conveying rate of 1.25 m/min, without substantially heating the precursors.

[Exposure]

Any known lights may be used for the light source in the invention. The wavelength of the light source is preferably in the range of from 300 nm to 1,200 nm. Specifically, semiconductor lasers such as a semiconductor laser that irradiates infrared rays having wavelengths of from 760 nm to 1,200 may be used.

The light source is preferably a laser and available examples thereof at a wavelength in the range of from 350 nm to 450 nm include gas lasers such as Ar ion laser (364 nm, 351 nm, 10 mW to 1 W), Kr ion laser (356 nm, 351 nm, 10 mW to 1 W), and He—Cd laser (441 nm, 325 nm, 1 mW to 100 mW); and solid lasers such as a combination of Ne:YAG ($YVO_4$) and SHG crystal×twice (355 mm, 5 mW to 1 W), a combination of Cr: LiSAF and SHG crystal (430 nm, 10 mW); and semiconductor lasers such as $KNbO_3$, a ring resonator (430 nm, 30 mW), a combination of a waveguiding wavelength converter and semiconductors of AlGaAs and InGaAs (380 nm to 450 nm, 5 mW to 100 mW), a combination of a waveguiding wavelength converter and semiconductors of AlGaInP and AlGaAs (300 nm to 350 nm, 5 mW to 100 mW), and AlGaInN (350 nm to 450 nm, 5 mW to 30 mW); and pulse lasers such as $N_2$ laser (337 nm, pulse 0.1 to 10 mJ) and XeF (351 nm, pulse 10 to 250 mJ).

Among the above, an AlGaInN semiconductor laser (commercially available InGaN-type semiconductor laser, 400 nm to 410 nm, 5 mW to 30 mW) is preferable from the viewpoints of wavelength properties and cost efficiency.

Other lasers may also be preferably used and examples include those available in the range of from 450 nm to 700 nm such as an Ar+laser (488 nm), a YAG-SHG laser (532 nm), a He—Ne laser (633 nm), a He—Cd laser, and red semiconductor lasers (650 nm to 690 nm); and those available in the range of 700 nm to 1,200 nm such as semiconductor lasers (800 to 850 nm) and a Nd-YAG laser (1,064 nm).

Further, other light sources may also be used in the invention and examples thereof include mercury lamps of superhigh-, high-, middle- and low-pressure lamps, a chemical lamp, a carbon arc lamp, a xenon lamp, a metal halide lamp, ultraviolet laser lamps such as ArF excimer laser or KrF excimer laser, various visible laser lamps, fluorescent lamps, tungsten lamps and sun light. Radiation rays such as electron rays, X rays, ion beams and far-infrared rays.

Among the above, light sources having a luminescence wavelength in the range of from near-infrared to far-infrared are preferably used, and solid lasers and semiconductor lasers are particularly preferable.

When the exposure is carried out by a light source having a wavelength of from 750 nm to 1,400 nm, examples of the light source are not particularly limited, but a solid laser or a semiconductor laser that irradiates infrared rays of from 750 nm to 1,400 nm is preferably used.

The output power of the laser is preferably 100 mW or more, and a multi beam laser device is preferably used for shortening the exposure time. Further, the exposure time per pixel is preferably 20 microseconds or less.

The energy amount per unit irradiated onto the planographic printing plate precursor is preferably in the range of from 10 $mJ/cm^2$ to 300 $mJ/cm^2$.

In the invention, the exposure may be carried out in order that the light beams emitted from a light source overlap each other. The term "overlap" here refers to the situation that the width of a pitch in the direction of sub-scanning is smaller than the diameter of the light beam. The degree of overlap can be, for example, quantitatively expressed by the value of FWHM/sub-scanning pitch (overlap coefficient), where the beam diameter is expressed by a full width half maximum (FWHM) of the beam intensity. In the invention, the overlap coefficient is preferably 0.1 or higher.

The method of scanning with a light source in the exposure device for use in the invention is not particularly limited, and examples thereof include methods of scanning outer or inner surface of a printing plate precursor arranged in the form of a cylinder, and a method of scanning a flat printing plate precursor. The channel of the light source may be single-channeled or multi-channeled, but a multi-channeled light source is favorably used in a case of scanning the external surface of the cylindrical printing plate precursor.

As mentioned above, the planographic printing plate precursor in the invention that has been exposed may further be subjected to a heat treatment and/or washing treatment.

Additionally, depending on the type of the planographic printing plate precursor, for example, when the planographic printing plate precursor has a polymerizable negative type photosensitive layer, it may be subjected to a developing treatment without particularly undergoing a heat and/or washing treatment. By omitting the heat treatment, unevenness in the image due to the heat treatment may be suppressed. Further, by skipping the heat and/or washing treatment, more stable development treatment of the planographic printing plate precursor can be carried out at high speed.

[Development]

The non-image region in the photosensitive layer is removed with a developing solution during a development process in the invention.

As mentioned above, the processing speed of development, i.e., the conveyance speed (line speed) of the planographic printing plate precursor during development, is preferably 1.25 m/min or more, and more preferably 1.35 m/min or more, when the planographic printing plate precursor has a protective layer on the polymerizable negative type photosensitive layer containing an infrared absorber as a sensitizing dye. The upper limit of the conveyance speed is not particularly limited, but is preferably 3 m/min or less from the viewpoint of stability.

The following is a detailed description of the developing solution for use in the invention.

(Developing Solution)

The developing solution for use in the invention is preferably an aqueous alkaline solution having a pH of 14 or lower and preferably contains an aromatic anionic surfactant.

(Aromatic Anionic Surfactant)

The aromatic anionic surfactant for use in the developing solution according to the invention has such effects as accelerating the development and dispersing/stabilizing the components of the polymerizable negative photosensitive layer and the protective layer in the developing solution, and is thus favorable in view of stabilizing the development process. In particular, the aromatic anionic surfactant for use in the invention is preferably a compound represented by the following Formula (A) or (B):

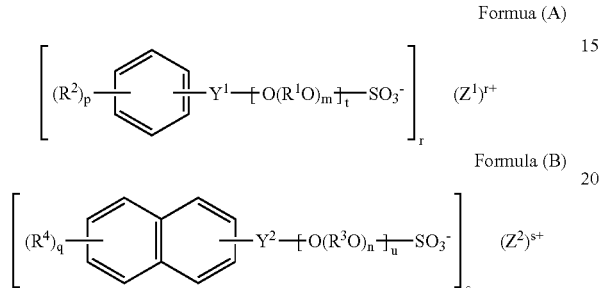

Formula (A)

Formula (B)

In Formula (A) or (B), $R^1$ and $R^3$ each independently represent a linear or branched alkylene group of 1 to 5 carbon atoms, and specific examples thereof include an ethylene group, a propylene group, a butylene group, and a pentylene group. Each of $R^1$ and $R^3$ is particularly preferably an ethylene group or a propylene group.

m and n each independently are an integer of 1 to 100, and are preferably an integer of 1 to 30, and more preferably an integer of 2 to 20. When m is 2 or more, two or more of $R^1$ may be the same or different from each other. Similarly, when n is 2 or more, two or more of $R^3$ may be the same or different from each other.

t and u each independently are 0 or 1.

$R^2$ and $R^4$ each independently represent a linear or branched alkyl group of 1 to 20 carbon atoms, and specific examples thereof include a methyl group, an ethyl group, a propyl group, a butyl group, a hexyl group, and a dodecyl group. Each of $R^2$ and $R^4$ is particularly preferably a methyl group, an ethyl group, an iso-propyl group, an n-propyl group, an n-butyl group, an iso-butyl group, or a tert-butyl group.

p and q each independently represent an integer of 0 to 2. $Y^1$ and $Y^2$ each independently represent a single bond or an alkylene group of 1 to 10 carbon atoms. Each of $Y^1$ and $Y^2$ is preferably a single bond, a methylene group, or an ethylene group, and more preferably a single bond.

$(Z^1)^{r+}$ and $(Z^2)^{s+}$ each independently represent an alkali metal ion, an alkaline earth metal ion, or a unsubstituted or alkyl-substituted ammonium ion, and specific examples thereof include a lithium ion, a sodium ion, a potassium ion, a magnesium ion, a calcium ion, an ammonium ion, and secondary to quaternary ammonium ions substituted by a group of 1 to 20 carbon atoms such as an alkyl group, an aryl group, and/or an aralkyl group. Each of $(Z^1)^{r+}$ and $(Z^2)^{s+}$ is particularly preferably a sodium ion.

r and s each independently represent 1 or 2.

Specific examples of the above compounds are shown below, but the invention is not limited thereto.

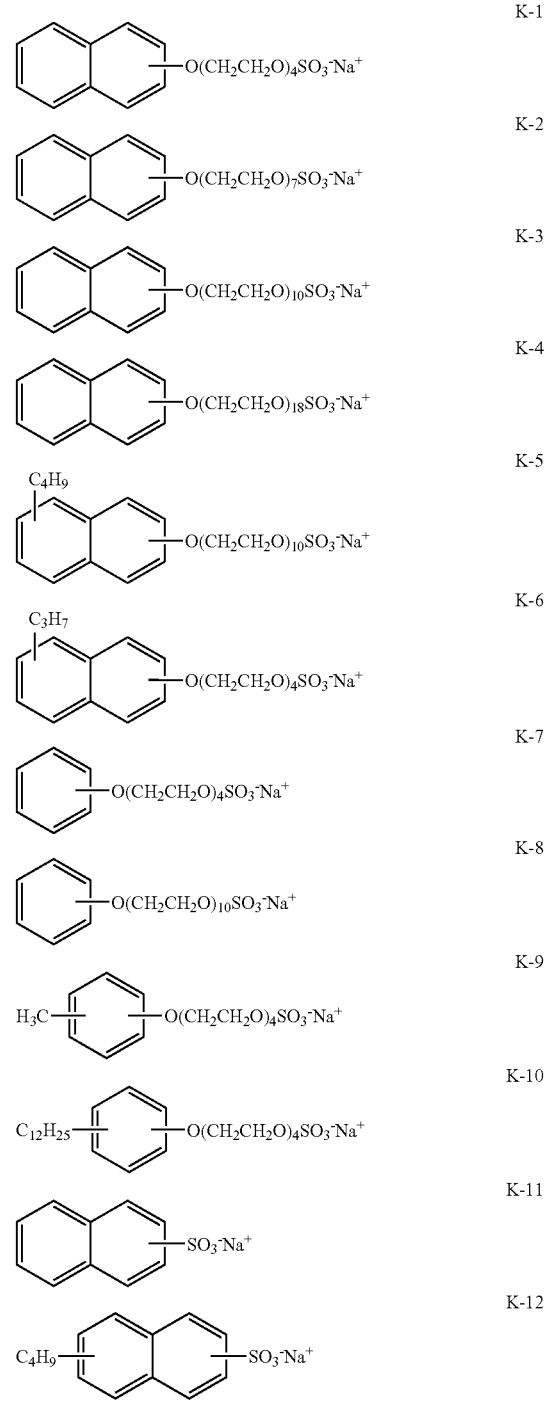

The aforementioned aromatic anionic surfactants may be used alone or in combination of two or more. The addition amount of the aromatic anionic surfactant in the developing solution is preferably such that the concentration thereof is in the range of from 1.0% to 10% by mass, and more preferably in the range of 2 to 10% by mass. When the above concentration is less than 1.0% by mass, developability and solubility of the components in the photosensitive layer may be lowered. When the above concentration is more than 10% by mass, printing durability of the printing plate may deteriorate.

The developing solution used in the invention may also contain other surfactants, in addition to the aromatic anionic surfactant. Examples of such surfactants include nonionic surfactants including polyoxyethylene alkyl ethers such as polyoxyethylene naphthyl ether, polyoxyethylene alkyl phenyl ethers, polyoxyethylene lauryl ether, polyoxyethylene cetyl ether, and polyoxyethylene stearyl ether; polyoxyethylene alkyl esters such as polyoxyethylene stearate; sorbitan alkyl esters such as sorbitan monolaurate, sorbitan monostearate, sorbitan distearate, sorbitan monooleate, sorbitan sesquioleate, and sorbitan trioleate; and monoglyceride alkyl esters such as glycerol monostearate and glycerol monooleate.

The content of the surfactant(s) other than the aromatic anionic surfactant(s) in the developing solution is preferably from 0.1 to 10% by mass when calculated on the basis of active components.

(Chelating Agent for Bivalent Metal)

The developing solution used in the invention preferably contains a chelating agent for bivalent metal(s), for example, to suppress the adverse effects of the bivalent metals such as a calcium ion contained in hard water. Examples of the chelating agents for bivalent metal(s) include polyphosphates such as $Na_2P_2O_7$, $Na_5P_3O_3$, $Na_3P_3O_9$, $Na_2O_4P(NaO_3P)PO_3Na_2$, and Calgon (sodium polymetaphosphate); amino-polycarboxylic acids such as ethylenediamine tetraacetic acid and potassium, sodium, and amine salts thereof, diethylenetriamine pentaacetic acid and potassium and sodium salts thereof, triethylenetetramine hexaacetic acid and potassium and sodium salts thereof, hydroxyethylethylenediamine triacetic acid and potassium and sodium salts thereof, nitrilotriacetic acid and potassium and sodium salts thereof, 1,2-diaminocyclohexane tetraacetic acid and potassium and sodium salts thereof, and 1,3-diamino-2-propanol tetraacetic acid and potassium and sodium salts thereof; and organic phosphonic acids such as 2-phosphono-1,2,4-butane tricarboxylic acid and potassium and sodium salts thereof, 2-phosphono-2,3,4-butanone tricarboxylic acid and potassium and sodium salts thereof, 1-phosphono-1,2,2-ethane tricarboxylic acid and potassium and sodium salts thereof 1-hydroxyethane-1,1-diphosphonic acid and potassium and sodium salts thereof, and aminotri(methylenephosphonic acid) and potassium and sodium salts thereof.

Among the above, the chelating agent for bivalent metal(s) is preferably ethylenediamine tetraacetic acid or a potassium, sodium, or amine salt thereof, ethylenediamine tetra(methylenephosphonic acid) or a ammonium or potassium salt thereof, or hexamethylenediamine tetra(methylenephosphonic acid) or an ammonium or potassium salt thereof.

The optimum content of the chelating agent depends on the hardness and the amount of hard water used. However, the content of the chelating agent in the developing solution is generally in the range of from 0.01 to 5% by mass and preferably 0.01 to 0.5% by mass.

The developing solution used in the invention may contain an alkali metal salt of an organic acid or an alkali metal salt of an inorganic acid as a development adjusting agent. For example, an alkali metal salt such as sodium carbonate, potassium carbonate, ammonium carbonate, sodium citrate, potassium citrate and ammonium citrate, or a combination of two or more, may be contained in the developing solution.

(Alkali Agent)

Examples of the alkali agent contained in the developing solution used in the invention include inorganic alkali agents such as sodium tertiary phosphate, potassium tertiary phosphate, ammonium tertiary phosphate, sodium borate, potassium borate, ammonium borate, sodium hydroxide, potassium hydroxide, ammonium hydroxide, and lithium hydroxide; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. In the invention, these alkali agents may be used alone or in combination of two or more.

In addition, an alkali silicate may also be used as the alkali agent. The alkali silicate may be used in combination with a base. The alkali silicate salt used in the invention is a salt that becomes alkaline when dissolved in water, and examples thereof include sodium silicate, potassium silicate, lithium silicate, and ammonium silicate. These alkali silicates may be used alone or in combination of two or more.

The developing solution for use in the invention can be optimally adjusted by controlling the mixing ratio and the concentrations of silicon oxide ($SiO_2$), a component of the silicate salt that serves as a hydrophilizer for a support, and an alkali oxide $M_2O$ (M represents an alkali metal or an ammonium group) used as an alkali component. The mixing ratio (molar ratio) of the silicon oxide ($SiO_2$) to alkali oxide $M_2O$, i.e., $SiO_2/M_2O$ is preferably in the range of 0.75 to 4.0, and more preferably in the range of 0.75 to 3.5, from the viewpoints of suppressing stains that occurs when a support is immersed too long in the developing solution to dissolve (etch) the anodic oxide film on the support to an excessive degree, or suppressing generation of insoluble gases due to formation of a complex of dissolved aluminum and a silicate.

The concentration of the alkali silicate in the developing solution in terms of the content of silicon dioxide is preferably in the range of from 0.01 to 1 mol/L, and more preferably in the range of from 0.05 to 0.8 mol/L, with respect to the total mass of the developing solution, from the viewpoints of suppressing dissolution (etching) of the anodic oxide film on the support, developing properties, suppression of precipitation and crystal growth, and suppression of gelling of the alkali silicate caused by neutralization at the time of discharging the solution.

The developing solution used in the invention may further contain the following components in addition to the components described above, as necessary. Examples thereof include organic carboxylic acids such as benzoic acid, phthalic acid, p-ethylbenzoic acid, p-n-propylbenzoic acid, p-iso-propylbenzoic acid, p-n-butylbenzoic acid, p-t-butylbenzoic acid, p-2-hydroxyethylbenzoic acid, decanoic acid, salicyclic acid, and 3-hydroxy-2-naphthoic acid; organic solvents such as propylene glycol; reducing agents, dyes, pigments, water softeners, and antiseptics.

The pH at 25° C. of the developing solution for use in the invention is preferably in the range of from 10 to 12.5, and more preferably in the range of from 11 to 12.5. Since the developing solution contains the above-described surfactant, the developing solution can exhibit an excellent developing property in the non-image portion, even when the developing solution used in the invention has such a low pH as mentioned above. By regulating the pH of the developing solution to be a relatively low level, damages on image portions during development can be lessened and handleability of the developing solution can be improved.

The electric conductivity of the developing solution, referred to as x, preferably satisfies the relation 2 mS/cm<x<30 mS/cm, and more preferably 5 mS/cm<x<25 mS/cm.

Here, an alkali metal salt of an organic or inorganic acid is preferably added to the developing solution as an agent for adjusting the electric conductivity of the developing solution.

The aforementioned developing solution may be used as a developing solution and as a replenishing development solution for the planographic printing plate precursor that has undergone exposure, and is preferably applied to automatic developing machines. When the precursor is developed in an automatic developing machine, a replenishing solution or a fresh developing solution may be added to recover the developing capability of the developing solution that has become fatigued as the amount of processing increases. This replenishing system is also preferably used in the plate-making method according to the invention.

Further, the replenishing is preferably carried out according to a method described in U.S. Pat. No. 4,882,246 for recovering the processing capability of the developing solution in an automatic developing machine. The developing solutions described in JP-A Nos. 50-26601 and 8-54341 and JP-B Nos. 56-39464, 56-42860, and 57-7427 are also preferably used.

The replenishing solution used in the invention is more preferably an aqueous solution having a pH of from 11 to 13.5, containing an oxycarboxylic acid chelating agent capable of forming a water-soluble chelate compound together with an aluminum ion, an alkali metal hydroxide and a surfactant, and not containing a silicate. By using such a replenishing solution as above, excellent developability and strength of the image region of the planographic printing plate can be maintained, precipitation of aluminum hydroxide formed by dissolution of the aluminum support by the alkali in the developing solution can be effectively suppressed, and adhesion of stains mainly composed of aluminum hydroxide on the surfaces of developing bath rollers in the automatic developing machine or accumulation of aluminum hydroxide precipitates in the subsequent water bath can be reduced. Therefore, the development process can be carried out in a stable manner, over a long period of term.

The planographic printing plate precursor that has gone through the development process as described above is then subjected to a post-treatment with washing water, a rinsing solution containing a surfactant or the like, and a desensitizing solution containing gum arabic, starch derivatives or the like, as described in JP-A Nos. 54-8002, 55-115045, 59-58431, and others. These treatments may be carried out alone or in combination of two or more.

The planographic printing plate according to the invention may be post-heated or post-exposed on the entire area of the image, after development, for the purpose of improving image strength and printing durability.

The heating after development may be conducted under highly intense conditions. The heating is generally performed at a temperature in the range of from 200 to 500° C. When the temperature after development is too low, sufficient image strength may no be obtained, while the temperature is too high, problems such as degradation of the support and thermal decomposition of the image region may be caused.

The planographic printing plate that thus obtained by the above treatments is then set to an offset printing machine, and used to produce a number of printing sheets.

As a plate cleaner used to remove stains on the plate during printing, conventionally known plate cleaners for PS plates may be used and examples thereof include those under the trade names of MULTI CLEANER, CL-1, CL-2, CP, CN-4, CN, CG-1, PC-1, SR, and IC (manufactured by FUJIFILM CORPORATION).

The following are exemplary embodiments of the invention.

1. A planographic printing plate precursor comprising a support, a photosensitive recording layer formed on the support, and a backcoat layer including an epoxy resin, the backcoat layer being formed on the side of the support opposite to the photosensitive recording layer side.

2. The planographic printing plate precursor of 1, wherein the backcoat layer further comprises a resin having a phenolic hydroxyl group.

3. The planographic printing plate precursor of 2, wherein the resin having a phenolic hydroxyl group is a novolac resin or a pyrrogallol resin.

4. The planographic printing plate precursor of 2, wherein the content of the resin having a phenolic hydroxyl group is in the range of from 0.1% by mass to 50% by mass with respect to the total mass of the backcoat layer.

5. The planographic printing plate precursor of 4, wherein the content of the resin having a phenolic hydroxyl group is in the range of from 0.5% by mass to 30% by mass with respect to the total mass of the backcoat layer.

6. The planographic printing plate precursor of 1, wherein the backcoat layer further comprises a rosin.

7. The planographic printing plate precursor of 6, wherein the rosin is a rosin modified phenol resin or a rosin ester.

8. The planographic printing plate precursor of 1, wherein the photosensitive recording layer contains a sensityzing dye, a polymerization initiator, a polymerizable compound and a binder polymer, and wherein a protective layer having an oxygen blocking property is formed on or above the photosensitive recording layer.

9. The planographic printing plate precursor of 8, wherein the protective layer comprises a filler.

10. The planographic printing plate precursor of 1, wherein the photosensitive recording layer contains an infrared absorber, a polymerization initiator, a monomer having two or more phenyl groups substituted by a vinyl group in the molecule, and a polymer having a phenyl group substituted by a vinyl group in a side chain.

11. The planographic printing plate precursor of 1, wherein the photosensitive recording layer contains a binder polymer containing allyl groups in the range of 0.7 meq/g to 8.0 meq/g.

12. A stack of a plurality of the planographic printing plate precursors of 1, wherein the surface of the photosensitive recording layer side of at least one of the planographic printing plate precursors and the surface of the backcoat layer side of at least one of the planographic printing plate precursors are in direct contact with each other.

EXAMPLES

The invention will now be explained according to the following examples, but the invention is not limited thereto.

Synthesis Example 1

Synthesis of Polymer (P-1)

150 grams of Bismuthiol (2,5-dimercapto-1,3,4-thiadiazole) was suspended in 600 ml of methanol, and 101 grams of triethylamine was gradually added therein while cooling to obtain a homogeneous solution. p-chloromethylstyrene (trade name: CMS-14, manufactured by SEIMI CHEMICAL CO., LTD.) was dripped into the solution over 10 minutes and the solution was continuously agitated for three hours. At this time, a reaction product was gradually separated out. After the agitation, the solution was cooled in a water bath to have an internal temperature of 10° C., and then the product was separated by suction filtration. The resultant was washed with methanol and dried in a vacuum dehydrator for one day, thereby obtaining a compound (monomer) represented by the following formula at an yield of 75%.

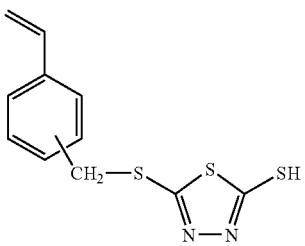

40 grams of the above monomer was put in a 1-liter flask having four openings equipped with an agitator, nitrogen introducing tube, thermometer and reflux condenser, and 70 grams of methacrylic acid, 200 ml of ethanol and 50 ml of distilled water were added. 110 grams of triethylamine was added into the mixture while agitated, in a water bath. Under a nitrogen atmosphere, the mixture was heated to have an internal temperature of 70° C., and at this temperature, 1 gram of azobisisobutyronitrile (AIBN) was added to start polymerization. After heating and agitating for 6 hours, the polymerization system was cooled down to room temperature. A part of the product was taken out and diluted with hydrochloric acid to adjust the pH to about 3, and was released in water to obtain a polymer having a structure described below.

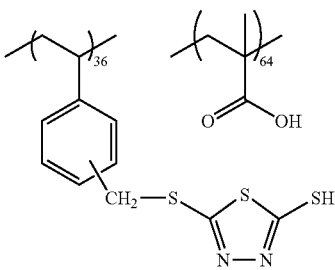

Into the remaining polymerization product solution from which a part of the above polymer had been taken out, 100 grams of 1,4-dioxane and 23 grams of p-chloromethylsthyrene were added, and further agitated for 15 hours at room temperature. Thereafter, 80 to 90 grams of concentrated hydrochloric acid (35 to 37% aqueous solution) was added, and when the pH of the system became 4 or lower, the system was put into 3 liters of distilled water. The polymer precipitate was separated by filtration and washed for several times with distilled water, and then dried in a vacuum dehydrator for one day. The polymer (P-1) was thus obtained at an yield of 90%. The average molecular weight of the polymer (P-1) according to determination of molecular weight by gel permeation chromatography was 90,000 (in terms of polysthyrene), and it was determined that the structure of the polymer (P-1) was supported by proton NMR analysis.

The polymer (P-1) corresponds to the aforementioned compound described as specific example (P-1) of the binder polymer having a group represented by Formula (2) in a side chain (specific binder polymer (2)).

Synthesis Example 2

Synthesis of Monomer (C-5)

89 grams of thiocyanuric acid was suspended in 1.5 liters of methanol, and into which a 30% aqueous solution containing 84 grams of potassium hydrate was gradually added while cooling to obtain a homogeneous solution. 230 grams of p-chloromethylstyrene was gradually dripped into the solution in order that the internal temperature thereof remained 40° C. or less, at room temperature. A product began to precipitate shortly after the above addition, but the agitation was continued. After three hours of agitation, the product was separated by suction filtration, washed by methanol, and dried in a vacuum dehydrator for one day to obtain the monomer (C-5) at an yield of 90%.

The monomer (C-5) corresponds to the aforementioned compound described as specific example (C-5) of the compound represented by Formula (3) (specific monomer).

Synthesis Example 3

Synthesis of Polymer (P-2)

352.1 grams of N,N-dimethylacetamide was put in a 1-liter flask having four openings equipped with a mantle heater, thermoregulator, machine agitator, condenser, isobaric dropping funnel and nitrogen introducing tube. Into the flask, 150.4 grams (0.6 mol) of 4,4'-methylene-bis(phenylisocyanate) was slowly added while agitating at room temperature. 10 minutes after, 40.2 grams (0.3 mol) of 2,2-dimethylol propanoic acid was added at an ambient temperature. The temperature of the reaction mixture was increased up to 57° C. After that, 43.6 grams (0.33 mol) of 3-allyloxy-1,2-propanediol was added for 30 minutes. The resulting reaction mixture was further agitated for two hours to obtain a transparent solution containing the polymer (P-2). The completion of the reaction was determined by disappearance of an infrared absorption band of isocyanate at 2,275 cm$^{-1}$. The obtained transparent solution had a kinetic viscosity (Gardner-Holt) of $Z_1$ at 40% of nonvolatile matter.

Subsequently, 4.5 kilograms of water and 1.5 kilograms of ice were added to the transparent solution containing polymer (P-2) while agitating with a multipurpose high-shearing laboratory mixer (SILVERSTONE MODEL #S4RT-A) at 6,000 rpm to allow polymer (P-2) to precipitate in the form of powder. The mixture was then agidated with a laboratory dispersator (SERIES2000, MODEL #84) at 4,000 rpm for 10 to 15 minutes. Further, polymer (P-2) was separated and dried in a drying oven at 60° C. The obtained polymer (P-2) had about 1.41 meq of allyl groups per gram, an acid value of 57 mg KOH per gram, and an average molecular weight of 100,000.

The polymer (P-2) corresponds to the aforementioned specific binder polymer (3).

Example 1

Preparation of Support

An aluminum plate (JIS A 1050) of 0.30 mm in thickness and 1,030 mm in width was prepared and a surface treatment as described below was performed.

<Surface Treatment>

The surface treatment was performed in the order of the following steps (a) to (f). After each step and washing, residual solution was removed with a nip roller.

(a) An aluminum plate was subjected to an etching treatment with an aqueous solution containing 26% by mass of caustic soda and 6.5% by mass of aluminum ion at 70° C. to dissolve 5 grams/m² of the aluminum plate. The plate was then washed with water.

(b) The aluminum plate was subjected to a desmut treatment by spraying an aqueous solution containing 1% by mass of nitric acid (including 0.5% by mass of aluminum ion) at 30° C. The plate was then washed with water.

(c) The aluminum plate was subjected to a continuous electrochemical surface roughening treatment with an alternating voltage of 60 Hz. The electrolysis solution at this time was an aqueous solution containing 1% by mass of nitric acid (including 0.5% by mass of aluminum ion and 0.007% by mass of ammonium ion) at 30° C. The alternating voltage was a trapezoidal rectangular alternating current wherein the time for the current value to reach the peak from zero (TP) was 2 msec and the duty ratio was 1:1. A carbon electrode was used as a counter electrode and ferrite was used as a subsidiary anode. The current density was 25 A/dm at the current peak value, and the electric quantity when the aluminum plate was the anode was 250 C/cm² in total. 5% of the current from the electric source was distributed for the subsidiary anode. The plate was then washed with water.

(d) The aluminum plate was subjected to an etching treatment by spraying an aqueous solution containing 26% by mass of caustic soda and 6.5% by mass of aluminum ion at 35° C. to dissolve 0.2 grams/m² of the aluminum plate to remove a smut component that had been generated during the above electrochemical surface roughening treatment with an alternating current, and dissolve the edge parts of the pits that had been generated for smoothing. The plate was then washed with water.

(e) The aluminum plate was subjected to a desmut treatment by spraying an aqueous solution containing 25% by mass of sulfuric acid (including 0.5% by mass of aluminum ion) at 60° C. The plate was then spray-washed with water.

(f) The aluminum plate was subjected to an anodizing treatment in an aqueous solution containing 170 grams per liter of sulfuric acid (including 0.5% by mass of aluminum ion) at 30° C., at a current density of 5 A/dm² for 50 seconds. The plate was then washed with water. The amount of the anodized oxide layer at this time was 2.7 grams/m².

The resulting aluminum support had a surface roughness Ra of 0.27 (measured by SURFCOM, the tip diameter of sensing pin; 2 micrometers, manufactured by TOKYO SEIMITSU CO., LTD.), a surface area ratio ΔS of 75% and a steepness a45 of 44% (measured by SPA300/SPI3800N, manufactured by SEIKO INSTRUMENTS INC.).

(Formation of Backcoat Layer)

Backcoat layer forming solution having the following composition was prepared and applied onto the aforementioned aluminum support with a wire bar, then dried by a hot-air drier at 100° C. for 70 seconds, thereby obtaining a support onto which a backcoat layer was formed. The total application amount of the backcoat layer (the amount of the layer after drying) was 0.46 g/m².

<Backcoat Layer Forming Solution>

| | |
|---|---|
| Epoxy resin having the following structure (trade name: jER1009, manufactured by JAPAN EPOXY RESIN CO., LTD.) | 1.00 g |
| Fluorocarbon surfactant (trade name: MEGAFAC F-780-F, manuractured by DAINIPPON INK AND CHEMICALS, INC.), a 30% by mass solution of methyl isobutyl ketone (MIBK) | 0.005 g |
| Methyl ethyl ketone | 22.5 g |
| 1-methoxy-2-propanol | 2.5 g |

(Formation of Undercoat Layer)

An undercoat layer forming solution having the following composition was prepared and applied onto the surface of the aluminum support opposite to the backcoat layer side with a wire bar, then dried at 90° C. for 30 seconds. The application amount of the undercoat layer forming solution was 10 mg/m².

<Undercoat Layer Coating Solution>

| | |
|---|---|
| Polymer compound A having the following structure (weight average molecular weight: 10,000) | 0.05 g |
| Methanol | 27 g |
| Ion exchange water | 3 g |

Polymer Compound A (Formation of Photosensitive Layer)

Photosensitive layer forming composition A having the following composition was prepared and applied onto the aforementioned undercoat layer with a wire bar and dried in a hot-air oven at 125° C. for 34 seconds. The coating applied amount after drying was 1.4 g/m².

<Photosensitive Layer Forming Composition A>

| | |
|---|---|
| Infrared absorbent (IR-1) | 0.038 g |
| Polymerization initiator (S-1) | 0.061 g |
| Polymerization initiator (I-1) | 0.094 g |
| Mercapto compound (E-1) | 0.015 g |

| | |
|---|---|
| Polymerizable compound (M-1) (trade name: A-BPE-4, manuractured by SHIN-NAKAMURA CHEMICAL CO., LTD.) | 0.425 g |
| Binder polymer (B-1) | 0.311 g |
| Binder polymer (B-2) | 0.250 g |
| Binder polymer (B-3) | 0.062 g |
| Additiong agent (T-1) | 0.079 g |
| Polymerization inhibitor (Q-1) | 0.0012 g |
| Ethyl violet (EV-1) | 0.021 g |
| Fluorocarbon surfactant (trade name: MEGAFAC F-780-F, manuractured by DAINIPPON INK AND CHEMICALS, INC.), a 30% by mass solution of methyl isobutyl ketone (MIBK) | 0.0081 g |
| Methyl ethyl ketone | 5.886 g |
| Methanol | 2.733 g |
| 1-methoxy-2-propanol | 5.886 g |

The following are the structures of infrared absorbent (IR-1), polymerization initiator (S-1), polymerization initiator (I-1), mercapto compound (E-1), polymerizable compound (M-1), binder polymer (B-1), binder polymer (B-2), binder polymer (B-3), addition agent (T-1), polymerization inhibitor (Q-1) and ethyl violet (EV-1).

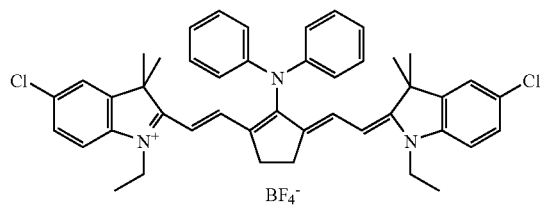
(IR-1)

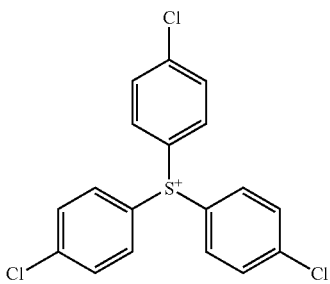
(S-1)

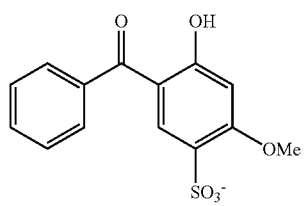

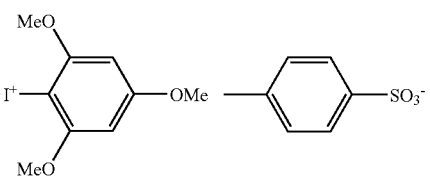
(I-1)

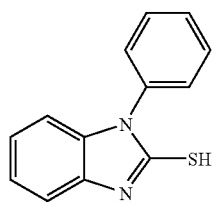
(E-1)

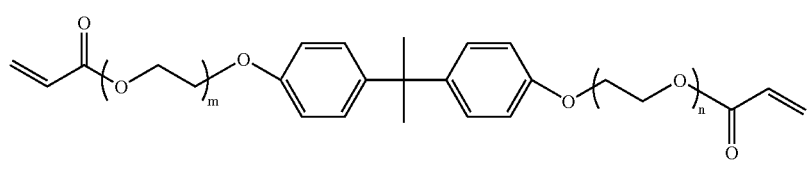
m + n = 4
(M-1)

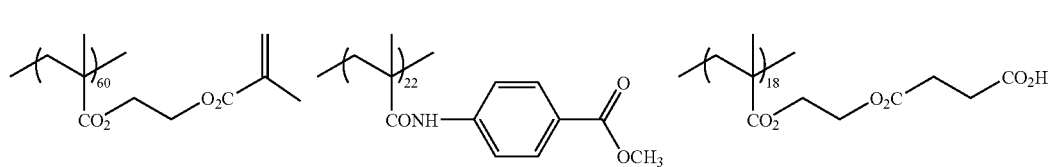
(B-1)

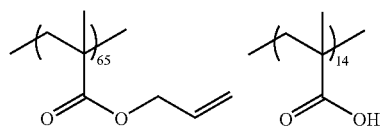 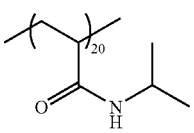

(B-2)

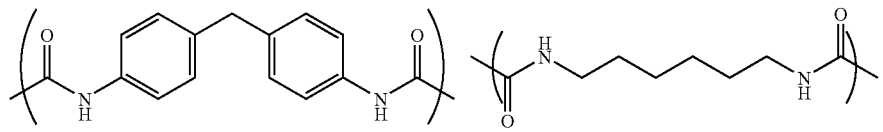

(B-3)

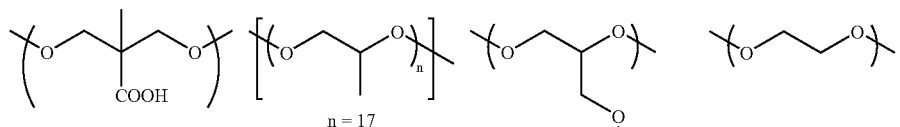

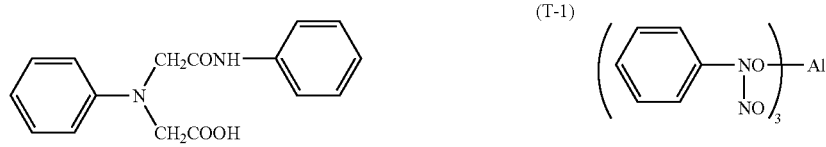

(T-1)

(Q-1)

(EV-1)

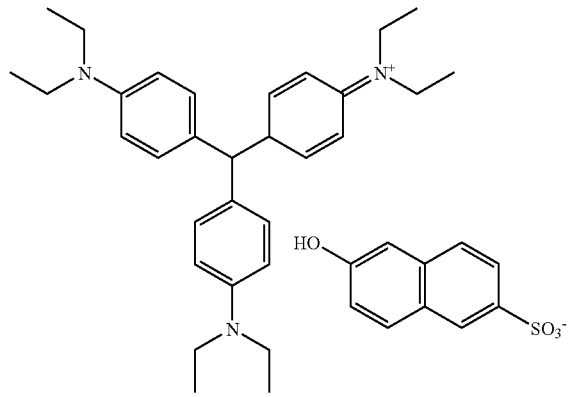

<Formation of Lower Protective Layer>

An aqueous solution (protective layer forming solution) containing a synthetic mica (trade name: SOMASIF MEB-3L, 3.2% aqueous dispersion, manufactured by CORP CHEMICAL CO., LTD.), sulfonic acid-modified polyvinylalcohol (trade name: GOHSERAN CKS-50, saponification degree: 99 mol %, polymerization degree: 300, manufactured by NIPPON SYNTHETIC CHEMICAL INDUSTRY CO., LTD.), surfactant A (trade name: EMALEX 710, manufactured by NIHON EMULSION CO., LTD.), and surfactant B (trade name: ADEKAPLURONIC P-84, manufactured by ADEKA CORPORATION) was applied onto the surface of the aforementioned photosensitive layer with a wire bar, and then dried at 125° C. for 30 seconds.

The composition ratio of synthetic mica (solid component)/polyvinylalcohol/surfactant A/surfactant B in the aqueous solution (protective layer forming solution) was 7.5/89/2/1.5 (% by mass) and the application amount (amount of the coating after drying) was 0.5 g/m$^2$.

(Formation of Upper Protective Layer)

An aqueous solution (protective layer forming solution) containing an organic filler (ARTPEARL J-7P, manufactured by NEGAMI CHEMICAL INDUSTRIAL CO., LTD.), synthetic mica (trade name: SOMASIF MEB-3L, 3.2% aqueous dispersion, manufactured by CORP CHEMICAL CO., LTD.), sulfonic acid-modified polyvinylalcohol (trade name: GOHSERAN L-3266, saponification degree: 87 mol %, polymerization degree: 300, manufactured by NIPPON SYNTHETIC CHEMICAL INDUSTRY CO., LTD.), thickening agent (trade name: CELOGEN FS-B, manufactured by DAIICHI KOGYO SEIYAKU CO., LTD.), polymer compound A (shown above) and surfactant (EMALEX 710, manufactured by NIHON EMULSION CO., LTD.) was applied onto the surface of the aforementioned lower protective layer with a wire bar, and then dried at 125° C. for 30 seconds.

The composition ratio of organic filler/synthetic mica (solid component)/polyvinylalcohol/thickening agent/polymer compound A/surfactant was 4.7/2.8/67.4/18.6/2.3/4.2

(% by mass) and the application amount (amount of the coating after drying) was 1.2 g/m².

The planographic printing plate precursor of Example 1 was thus obtained.

Examples 2 to 20

The planographic printing plate precursors of Examples 2 to 20 were obtained in the same manner as in Example 1 except that the amounts of the epoxy resin were changed and other resins were used together, as indicated in Table 1.

The following are details of the other resins shown in Tables 1 and 2.

Rosin modified phenol resin A (TAMANOL 386, manufactured by ARAKAWA CHEMICAL INDUSTRIES, LTD.)

Rosin modified phenol resin B (TAMANOL 352, manufactured by ARAKAWA CHEMICAL INDUSTRIES, LTD.)

Rosin modified phenol resin C (TAMANOL 380, manufactured by ARAKAWA CHEMICAL INDUSTRIES, LTD.)

Rosin modified phenol resin D (TAMANOL 409, manufactured by ARAKAWA CHEMICAL INDUSTRIES, LTD.)

Rosin ester (ESTERGUM HP, manufactured by ARAKAWA CHEMICAL INDUSTRIES, LTD.)

Pyrogallol resin (following structure, weight average molecular weight: 3,000) Novolac resin A (m-cresol/p-cresol=6:4 by mol, weight average molecular weight: 4,100)

Novolac resin B (phenol/m-cresol/p-cresol=5:3:2 by mol, weight average molecular weight: 5,300)

Novolac resin C (phenol/m-cresol/p-cresol=5:3:2 by mol, weight average molecular weight: 30,000)

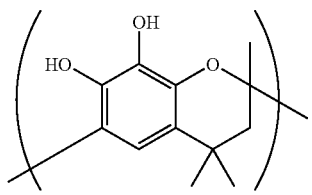

Pyrogallol Resin

Example 21

A planographic printing plate precursor of Example 21 was obtained in the same manner as Example 4, except that a single-layered protective layer was formed in accordance with the following method, instead of the double-layered protective layer in Example 4.

(Formation of Single-Layered Protective Layer)

An aqueous solution (protective layer forming solution) containing a synthetic mica (trade name: SOMASIF ME-100, 8% aqueous dispersion, manufactured by CORP CHEMICAL CO., LTD.), sulfonic acid-modified polyvinylalcohol (trade name: GOHSERAN CKS-50, saponification degree: 99 mol %, polymerization degree: 300, manufactured by NIPPON SYNTHETIC CHEMICAL INDUSTRY CO., LTD.) and surfactant (EMALEX 710, manufactured by NIHON EMULSION CO., LTD.) was applied onto the surface of the photosensitive layer with a wire bar, and then dried at 125° C. for 75 seconds.

The composition ratio in the above mixture (protection layer forming solution A) of synthetic mica (solid component)/polyvinylalcohol/surfactant was 16/82/2 (% by mass) and the application amount (amount of the coating after drying) was 1.6 g/m².

Example 22

The planographic printing plate precursor of Example 21 was obtained in the same manner as in Example 21, except that protection layer forming solution B not containing synthetic mica was used instead of protection layer forming solution A.

The composition ratio in protection layer forming solution B of polyvinylalcohol/surfactant was 98/2 (% by mass).

Example 23

The planographic printing plate precursor of Example 23 was prepared by forming a backcoat layer on an aluminum support in the same manner as in Example 1 except that the type and amount of the epoxy resin and other resin were changed as indicated in Table 2, and by forming a photosensitive layer (photosensitive recording layer) on the surface of the aluminum support opposite to the backcoat layer-side surface by applying photosensitive layer forming solution B having the following composition, to a thickness after drying of 1.4 micrometers, and dried in a dry oven at 70° C. for 5 minutes.

<Photosensitive Layer Forming Solution B>

| | |
|---|---|
| Polymer (P-1) | 10 parts by mass |
| Polymerization initiator (BC-6) | 2 parts by mass |
| Polymerization initiator (T-4) | 2 parts by mass |
| Monomer (C-5) | 3.5 parts by mass |
| Infrared absorvent (IR-2) | 0.5 part by mass |
| Dye (D-4) | 0.3 part by mass |
| Dioxiane | 70 parts by mass |
| Cyclohexane | 20 parts by mass |

The polymer (P-1) used in the above photosensitive layer forming solution B is a polymer obtained in the aforementioned Synthesis Example 1, and the monomer (C-5) is a monomer obtained in the aforementioned Synthesis Example 2.

The structures of polymerization initiator (BC-6), polymerization initiator (T-4), infrared absorbent (IR-2) and dye (D-4) are shown below.

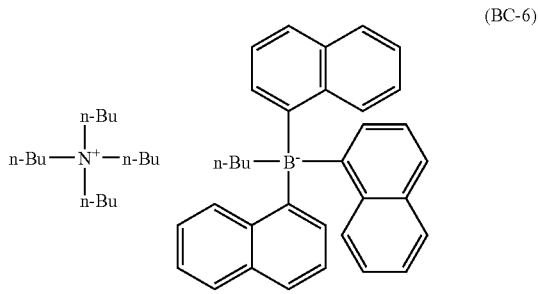

(BC-6)

-continued

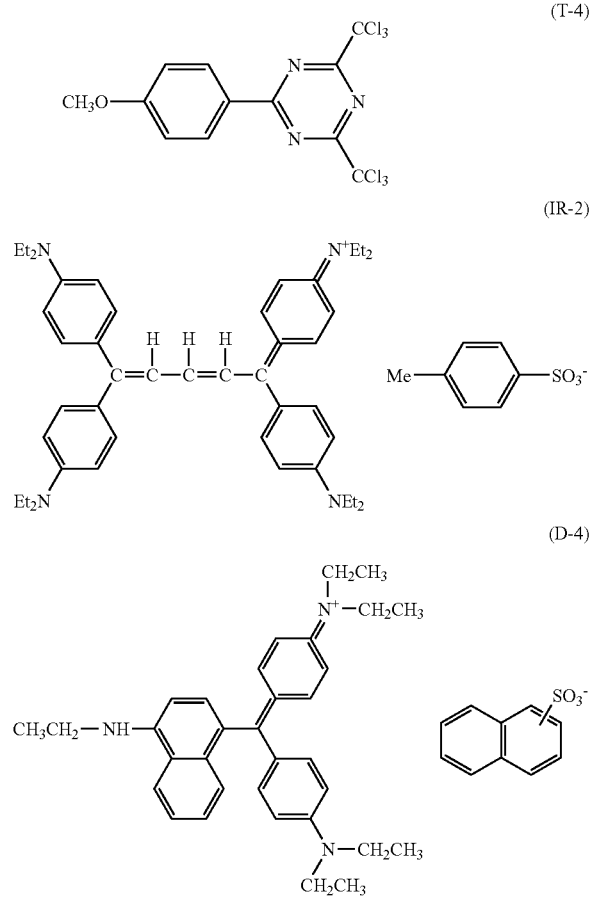

Examples 24 to 26

The planographic printing plate precursors of Examples 24 to 26 were obtained in the same manner as in Example 23, except that the type and amount of the epoxy resin and other resin in the backcoat layer forming solution were changed as indicated in Table 2.

Example 27

An aluminum support was prepared by performing electrochemical polishing and anodization to the same aluminum plate as the one used in Example 1.

Subsequently, a backcoat layer was formed on the above aluminum support in the same manner as in Example 1, except that the type and amount of the epoxy resin and other resin in the backcoat layer forming solution were changed as indicated in Table 2.

Further, a photosensitive layer C (photosensitive recording layer) was formed on the surface of the aluminum support opposite to the backcoat layer-side by applying photosensitive layer forming solution C having the following composition, with a rod around which a wire was wound, to an application amount after drying of 2 g/m², and then drying at about 94° C. for 60 seconds in a Ranar conveyer oven.

<Photosensitive Layer Forming Solution C>

| | |
|---|---|
| Urethane acrylate A | 3.55 parts by mass |
| SARTOMER 355 | 0.74 parts by mass |
| Polymer (P-2) | 3.24 parts by mass |
| 2-(4-methoxyphenyl)-4,6-bis(trichloromethyl)-2-triazine | 0.40 part by mass |
| N-phenylimino diacetate | 0.22 part by mass |
| Infrared absorbent (IR-3) | 0.08 part by mass |
| Crylstal violet | 0.10 part by mass |
| BYK 307 | 0.02 part by mass |
| Methyl ethyl ketone | 13.75 parts by mass |
| Toluene | 22.91 parts by mass |
| 1-methoxy-2-propanol | 54.99 parts by mass |

The polymer (P-2) used in photosensitive layer forming solution C is a polymer obtained in the aforementioned Synthesis Example 3.

The following are details of urethane acrylate A, SARTOMER 355, infrared absorbent (IR-3), and BYK 307.

Urethane acrylate A: a 80% methyl ethyl keton solution of urethane acrylate obtained by reacting DESMODUR (registered trade name) N100, hydroxyethyl acrylate and pentaerythritol acrylate; containing 0.5 per 100 grams of double bonds after the reaction of isocyanate group.

SARTOMER 355: a polyfunctional monomer (ditrimethylol propane tetraacrylate) manufactured by SARTOMER COMPANY, INC.

Infrared absorbent (IR-3): 2-[2-[2-triphenyl-3-[2-(1,3-dihydro-1,3,3-trimethyl-2H-indole-2-ylidene)-ethylidene]-1-cyclohexene-1-yil]-ethenyl]-1,3,3-trimethyl-3H-indolium-chloride BYK 307: polyethoxylated dimethylpolysiloxyane copolymer (manufactured by BYK-CHEMIE, U.S.A., INC., Wallingford, Conn., U.S.A.)

Further, a single-layered protective layer that does not contain synthetic mica was formed on the above photosensitive layer in the same manner as in Example 22.

The planographic printing plate precursor of Example 27 was thus obtained.

Examples 28 to 30

The planographic printing plate precursors of Examples 28 to 30 were obtained in the same manner as in Example 27, except that the type and amount of the epoxy resin and other resin in the backcoat layer forming solution were changed as indicated in Table 2.

Comparative Example 1

The planographic printing plate precursor of Comparative Example 1 was obtained in the same manner as in Example 1, except that the pyrogallol resin having the aforementioned structure was used instead of the epoxy resin for the backcoat forming solution.

Comparative Example 2

The planographic printing plate precursor of Comparative Example 2 was obtained in the same manner as in Example 23, except that the pyrogallol resin having the aforementioned structure was used instead of the epoxy resin and the rosin modified phenol resin A for the backcoat forming solution.

Comparative Example 3

The planographic printing plate precursor of Comparative Example 3 was obtained in the same manner as in Example 27, except that the pyrogallol resin having the aforementioned structure was used instead of the epoxy resin and the rosin modified phenol resin A for the backcoat forming solution.

Evaluation

(1) Surface Conditions

The obtained planographic printing plate precursor was cut in the size of 61 cm×50 cm and the surface of the backcoat layer was visually observed.

The evaluation was conducted by a sensory evaluation method according to 1 to 5 grades, wherein 3 was the lowest limit of practically acceptable level and 1 and 2 were below the acceptable level. The results are shown in Tables 1 and 2.

(2) Scratch Resistance

The obtained planographic printing plate precursor was cut in the size of 61 cm×50 cm to prepare twenty sheets, and the sheets were stacked without interleaving slip sheets between them. The resulting stack was placed onto planographic printing plate precursors that had already been set in a cassette in order that the stack was positioned outward off from the edge of the plates in the cassette by 5 cm. The stack was then pushed inside in a horizontal direction to be positioned in the cassette in such a manner that the backcoat layer of the undermost plate scraped the surface of a protective layer of the topmost planographic printing plate precursor in the cassette. The planographic printing plate precursor having the protective layer that had been scraped with the backcoat layer of the other plate was used as a test plate for evaluation of scratch resistance.

The sample planographic printing plate precursor was conveyed by an autoloader, from the position where the planographic printing plate precursor had been set, into a platesetter, TRENDSETTER 3244 (a product of CREO; now KODAK'S GRAPHIC COMMUNICATIONS GROUP) and subjected to exposure at an output power of 7 W, external drum rotation frequency of 150 rpm, and a plate surface energy of 110 mJ/cm$^2$, to form a 50% tint image with a resolution of 2400 dpi. After the exposure, the plate was developed by an automatic developing machine, LP-1310HII (a product of FUJIFILM CORPORATION), at a line speed of 2 m/min. and a developing temperature of 30° C., without conducting heating or washing by water. A solution of DH-N diluted with 4 times of water was used as the developing solution, a solution of FCT-421 diluted with 1.4 times of water was used as the replenishing solution, and a solution of GN-2K (a product of FUJIFILM CORPORATION) diluted with the same amount of water was used as the finisher. The condition of scratches in the tint image on the obtained planographic printing plate was visually observed.

The evaluation was conducted by a sensory evaluation method according to 1 to 5 grades, wherein 3 was the lowest limit of practically acceptable level and 1 and 2 were below the acceptable level. The results are shown in Tables 1 and 2.

(3) Coefficient of Static Friction

The obtained planographic printing plate precursor was cut in a sheet having the size of 100 mm×150 mm, and the sheet was horizontally fixed on a flat, smooth plate having the size of 200 mm×350 mm with the photosensitive layer up (with the protective layer up). Further, the obtained planographic printing plate precursor was cut in a sheet having the size of 35 mm×75 mm, and the sheet was fixed to a flat, smooth surface of 35 mm×75 mm of a 500 gram weight, with the backcoat layer up.

The backcoat layer side of the planographic printing plate precursor fixed to the weight was placed in contact with the center of the protective layer side of the planographic printing plate precursor.

In this condition, one of the narrow sides of the flat plate was lifted to tilt the plate, and the angle of gradient θ° of the plate at which the weight began to slip was measured. The coefficient of static friction μ was calculated from the equation: $\mu = \tan \theta$. The results are shown in Tables 1 and 2.

TABLE 1

|  | Backcoat layer | | | | | Evaluation | | |
|---|---|---|---|---|---|---|---|---|
|  | Epoxy resin | | Other resin | | | | | |
|  | Type | Content* (mass %) | Type | Content* (mass %) | Protective layer | Surface condition | Scratch resistance | Coefficient of static friction |
| Example 1 | jER 1009 | 100 | — | 0 | Double (with filler) | 5 | 5 | 0.35 |
| Example 2 | jER 1009 | 99 | Rosin modified phenol resin A | 1 | Double (with filler) | 5 | 5 | 0.40 |
| Example 3 | jER 1009 | 97.5 | Rosin modified phenol resin A | 2.5 | Double (with filler) | 5 | 5 | 0.47 |
| Example 4 | jER 1009 | 95 | Rosin modified phenol resin A | 5 | Double (with filler) | 5 | 5 | 0.48 |
| Example 5 | jER 1009 | 90 | Rosin modified phenol resin A | 10 | Double (with filler) | 5 | 5 | 0.55 |
| Example 6 | jER 1009 | 80 | Rosin modified phenol resin A | 20 | Double (with filler) | 5 | 5 | 0.60 |
| Example 7 | jER 1009 | 70 | Rosin modified phenol resin A | 30 | Double (with filler) | 4 | 4 | 0.60 |
| Example 8 | jER 1009 | 65 | Rosin modified phenol resin A | 35 | Double (with filler) | 3 | 3 | 0.58 |
| Example 9 | jER 1009 | 95 | Rosin ester | 5 | Double (with filler) | 5 | 5 | 0.40 |

TABLE 1-continued

| | Backcoat layer | | | | | Evaluation | | |
| | Epoxy resin | | Other resin | | | | | |
| | Type | Content* (mass %) | Type | Content* (mass %) | Protective layer | Surface condition | Scratch resistance | Coefficient of static friction |
|---|---|---|---|---|---|---|---|---|
| Example 10 | jER 1009 | 90 | Rosin ester | 10 | Double (with filler) | 5 | 5 | 0.42 |
| Example 11 | jER 1009 | 80 | Rosin ester | 20 | Double (with filler) | 4 | 5 | 0.45 |
| Example 12 | jER 1009 | 95 | Pyrogallol resin | 5 | Double (with filler) | 5 | 5 | 0.45 |
| Example 13 | jER 1009 | 90 | Pyrogallol resin | 10 | Double (with filler) | 5 | 5 | 0.47 |
| Example 14 | jER 1009 | 80 | Pyrogallol resin | 20 | Double (with filler) | 4 | 4 | 0.49 |
| Example 15 | jER 1009 | 95 | Rosin modified phenol resin B | 5 | Double (with filler) | 5 | 5 | 0.58 |
| Example 16 | jER 1009 | 95 | Rosin modified phenol resin C | 5 | Double (with filler) | 5 | 5 | 0.56 |
| Example 17 | jER 1009 | 95 | Rosin modified phenol resin D | 5 | Double (with filler) | 5 | 5 | 0.57 |
| Example 18 | jER 1009 | 80 | Novolac resin A | 20 | Double (with filler) | 5 | 5 | 0.42 |
| Example 19 | jER 1009 | 80 | Novolac resin B | 20 | Double (with filler) | 5 | 5 | 0.42 |
| Example 20 | jER 1009 | 80 | Novolac resin C | 20 | Double (with filler) | 5 | 5 | 0.40 |
| Example 21 | jER 1009 | 95 | Rosin modified phenol resin A | 5 | Single (with filler) | 5 | 3 | 0.65 |
| Example 22 | jER 1009 | 95 | Rosin modified phenol resin A | 5 | Single (with no filler) | 5 | 3 | 0.45 |
| Comparative Example 1 | — | 0 | Pyrogallol resin | 100 | Double (with filler) | 5 | 2 | 0.45 |

*Content with respect to the total mass of resins in the backcoat layer

TABLE 2

| | Backcoat layer | | | | | Evaluation | | |
| | Epoxy resin | | Other resin | | | | | Coefficient |
| | Type | Content* (mass %) | Type | Content* (mass %) | Protective layer | Surface condition | Scratch resistance | of static friction |
|---|---|---|---|---|---|---|---|---|
| Example 23 | jER 1009 | 80 | Rosin modified phenol resin A | 20 | — | 5 | 5 | 0.60 |
| Example 24 | jER 1009 | 90 | Risin ester | 10 | — | 5 | 5 | 0.47 |
| Example 25 | jER 1009 | 90 | Pyrogallol resin | 10 | — | 5 | 5 | 0.52 |
| Example 26 | jER 1009 | 80 | Novolac resin A | 20 | — | 5 | 5 | 0.47 |
| Example 27 | jER 1009 | 80 | Rosin modified phenol resin A | 20 | Single (with no filler) | 5 | 5 | 0.63 |
| Example 28 | jER 1009 | 90 | Rosin ester | 10 | Single (with no filler) | 5 | 5 | 0.50 |
| Example 29 | jER 1009 | 90 | Pyrogallol resin | 10 | Single (with no filler) | 5 | 5 | 0.55 |
| Example 30 | jER 1009 | 80 | Novolac resin A | 20 | Single (with no filler) | 5 | 5 | 0.50 |
| Comparative Example 2 | — | 0 | Pyrogallol resin | 100 | — | 1 | 2 | 0.60 |
| Comparative Example 3 | — | 0 | Pyrogallol resin | 100 | Single (with no filler) | 1 | 1 | 0.65 |

*Content with respect to the total mass of resins in the backcoat layer

As shown in Tables 1 and 2, the planographic printing plate precursors of Examples 1 to 30, having a backcoat layer containing an epoxy resin on the surface opposite to the surface on which a polymerizable negative photosensitive layer, had favorable surface conditions of the backcoat layer after drying, and scratches were effectively suppressed even when the planographic printing plate precursors were stacked without slip sheets. Further, the planographic printing plate precursors containing a rosin or a resin having a phenolic hydroxyl group together with the epoxy resin had such high levels of coefficients of static friction between the surfaces of backcoat layer and photosensitive layer as 0.40 or more, and it is presumed that slippage between the precursors when stacked without interleaving slip sheets therebetween would not occur.

On the other hand, the planographic printing plate precursors of Comparative Examples 1 to 3 had significantly inferior scratch resistances, even though the high levels of coefficients of static friction would prevent slippage between the precursors when stacked without interleaving slip sheets there between.

As mentioned above, the invention can provide a planographic printing plate precursor that is writable by laser exposure and is capable of suppressing scratches on the photosensitive recording layer side due to contact with another planographic printing plate precursor, even when stacked without interleaving slip sheets, and is capable of preventing slippage between the planographic printing plate precursors.

Further, the invention can provide a stack of planographic printing plate precursors that can suppress scratches on the photosensitive recording layer side due to contact with another planographic printing plate precursor, even without slip sheets, and can prevent slippage between the planographic printing plate precursors, and thereby improving productivity in producing planographic printing plate precursors and a plate-making process using the same.

All publications, patent applications, and technical standards mentioned in this specification are herein incorporated by reference to the same extent as if each individual publication, patent application, or technical standard was specifically and individually indicated to be incorporated by reference.

What is claimed is:

1. A planographic printing plate precursor comprising a support, a photosensitive recording layer formed on the support, and a backcoat layer including an epoxy resin, the backcoat layer being formed on the side of the support opposite to the photosensitive recording layer side;

wherein the backcoat layer further comprises a rosin, and the content of the rosin in the backcoat layer is in the range of 2.5 to 30% by mass with respect to the total mass of the backcoat layer;

the support is an aluminum plate;

the weight average molecular weight of the epoxy resin is from 1.000 to 500,000; and the content of the epoxy resin in the backcoat layer is from 70 to 97.5% by mass.

2. The planographic printing plate precursor of claim 1, wherein the rosin is a rosin modified phenol resin or a rosin ester.

3. The planographic printing plate precursor of claim 1, wherein the photosensitive recording layer contains a sensitizing dye, a polymerization initiator, a polymerizable compound and a binder polymer, and wherein a protective layer having an oxygen blocking property is formed on or above the photosensitive recording layer.

4. The planographic printing plate precursor of claim 3, wherein the protective layer comprises a filler.

5. The planographic printing plate precursor of claim 1, wherein the photosensitive recording layer contains an infrared absorber, a polymerization initiator, a monomer having two or more phenyl groups substituted by a vinyl group in the molecule, and a polymer having a phenyl group substituted by a vinyl group in a side chain.

6. The planographic printing plate precursor of claim 1, wherein the photosensitive recording layer contains a binder polymer containing allyl groups in the range of 0.7 meq/g to 8.0 meq/g.

7. A stack of a plurality of the planographic printing plate precursors of claim 1, wherein the surface of the photosensitive recording layer side of at least one of the planographic printing plate precursors and the surface of the backcoat layer side of at least one of the planographic printing plate precursors are in direct contact with each other.

* * * * *